United States Patent [19]

Takigawa et al.

[11] Patent Number: 5,844,309
[45] Date of Patent: Dec. 1, 1998

[54] ADHESIVE COMPOSITION, SEMICONDUCTOR DEVICE USING THE COMPOSITION AND METHOD FOR PRODUCING A SEMICONDUCTOR DEVICE USING THE COMPOSITION

[75] Inventors: Yukio Takigawa, Kawasaki; Shigeaki Yagi, Yaizu; Toshimi Kawahara, Kawasaki; Mitsunada Osawa, Kawasaki; Hiroyuki Ishiguro, Kawasaki; Shinya Nakaseko, Kawasaki; Takashi Hozumi, Kanagawa; Masaaki Seki, Kawasaki, all of Japan

[73] Assignee: Fujitsu Limited, Kawasaki, Japan

[21] Appl. No.: 754,061

[22] Filed: Dec. 3, 1996

Related U.S. Application Data

[63] Continuation-in-part of Ser. No. 616,472, Mar. 19, 1996, abandoned.

[30] Foreign Application Priority Data

| Mar. 20, 1995 | [JP] | Japan | 7-060518 |
| Nov. 1, 1995 | [JP] | Japan | 7-285348 |

[51] Int. Cl.⁶ ............................................. H01L 23/053
[52] U.S. Cl. ......................... 257/701; 257/789; 257/791; 257/792
[58] Field of Search ................................... 257/789, 791, 257/792, 701

[56] References Cited

U.S. PATENT DOCUMENTS

| 4,535,350 | 8/1985 | Goodrich et al. | 257/791 |
| 4,926,239 | 5/1990 | Fujima et al. | 257/791 |
| 4,951,122 | 8/1990 | Tsubosaki et al. | 257/792 |
| 5,399,805 | 3/1995 | Tyler et al. | 257/791 |
| 5,656,857 | 8/1997 | Kishita | 257/789 |
| 5,679,978 | 10/1997 | Kawahara et al. | 257/697 |

FOREIGN PATENT DOCUMENTS

| 4-348121 | 12/1992 | Japan . |
| 5-182515 | 7/1993 | Japan . |

*Primary Examiner*—David Ostrowski
*Attorney, Agent, or Firm*—Nikaido, Marmelstein, Murray & Oram LLP

[57] ABSTRACT

An adhesive composition including: a main component comprising a resin material, a solvent for dissolving said main component, and a filler added to said main component, wherein said filler has a particle size so as to make a concavo-convex depth of a surface of said adhesive composition equal to or less than 15 μm after said adhesive composition is applied to an adherend and dried in order to evaporate said solvent before a thermocompression process. The present invention also discloses a semiconductor device using the adhesive composition, an adhering method using the adhesive composition and a method for producing a semiconductor device using the adhesive composition.

14 Claims, 7 Drawing Sheets

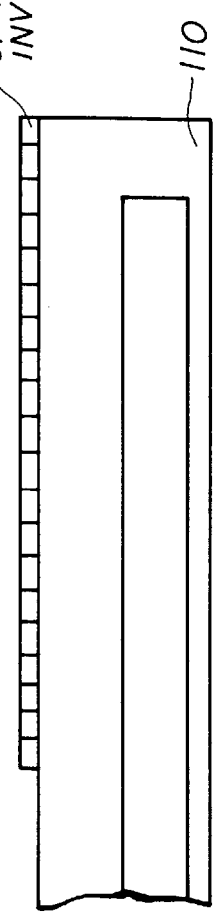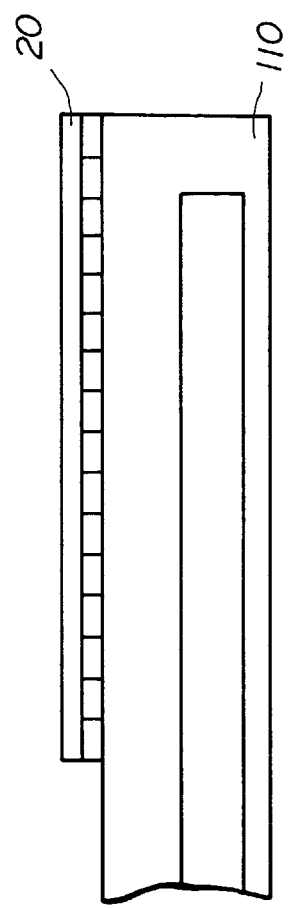
FIG.5A
FIG.5B

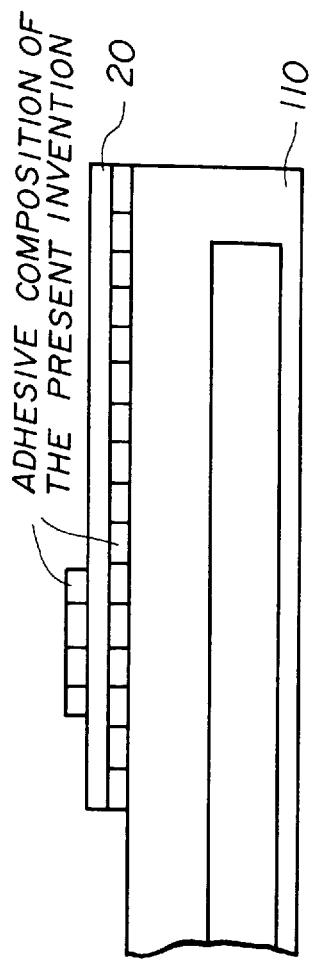
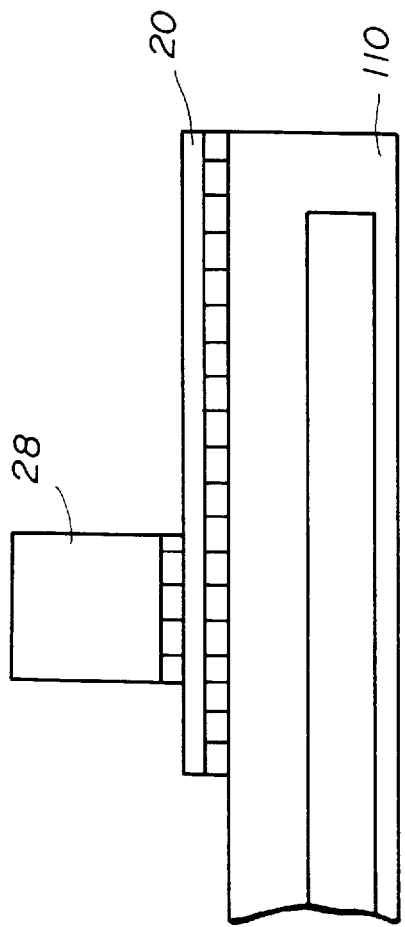

ADHESIVE COMPOSITION, SEMICONDUCTOR DEVICE USING THE COMPOSITION AND METHOD FOR PRODUCING A SEMICONDUCTOR DEVICE USING THE COMPOSITION

This application is a continuation-in-part application of U.S. application Ser. No. 08/616,472, filed: Mar. 19, 1996, now abandoned.

BACKGROUND OF THE INVENTION

The present invention generally relates to adhesive compositions and, in particular, to an adhesive composition suitably used in manufacturing a semiconductor device, a semiconductor device using the composition, an adhering method using the composition and a method for producing a semiconductor device using the composition.

Currently, electronic devices such as personal computers are required to be reduced in size. Thus, a semiconductor device used in the electronic device is also required to be reduced in size.

However, when the semiconductor device is reduced in size, its heat-releasing capacity is lowered. To produce a small-sized semiconductor device having excellent heat release characteristics, heat releasing means having excellent heat release characteristics is required to be proposed. An adhesive composition is one of such heat releasing means and can be used as insulating means also.

Moreover, a low-cost adhesive composition having an excellent adhesive strength, which may be used for adhering not only materials of the same type but also those of different types, is also required in many fields other than the semiconductor field.

FIGS. 1 and 2 show structures of a semiconductor device disclosed in Japanese Laid-Open Patent Application No. 5-305642. FIG. 2 is a cross-sectional view taken along a line A—A in FIG. 1.

Semiconductor element 16 is fixed, by a die-bond layer 14, on a die pad 12 of a substrate 10 comprising a material having an excellent thermal conductivity such as a metal. Further, a multilayer wiring board 22 comprising insulating layers 18 and a wiring layer 20 is formed on the substrate 10. The wiring layer 20 and the semiconductor element 16 are electrically connected via an electrode pad 24 on the semiconductor element 16 and a wire 26 connected to the wiring layer 20. An outer lead 34, which functions as a terminal for outer connection to connect a semiconductor device and a connecting terminal formed on a mounting board (not shown), is provided on an outside end portion of the multilayer wiring board 22. The outer lead 34 is electrically connected to the wiring layer 20 using an electroconductive adhesive composition 36.

A frame body 28 is provided on a predetermined position of the substrate 10 so as to surround the semiconductor element 16. Further, an upper lid member 30 is provided on an upper portion of the frame body 28. Both the frame body 28 and the upper lid member 30 are formed of metallic materials having excellent thermal conductivity and bonded by brazing, adhesion, gluing and so forth.

Conventionally, the heat release characteristics of a semiconductor device are improved by adopting the above-mentioned structure of the semiconductor device and releasing the heat generated by an operation of the semiconductor element 16 through the substrate 10, the frame body 28, the upper lid member 30 and so on.

When the above-mentioned semiconductor device is constructed, the insulating layers 18 bonding the frame body 28 and the substrate 10 are formed by producing an adhesion layer using liquid paste or an adhesion sheet, or by using a so-called precoating method in which a liquid adhesive composition is precoated on the substrate 10 or the frame body 28 and a drying process is carried out to evaporate solvent contained in the adhesive composition, after which the wiring layer 20 and the substrate 10, or the frame body 28 and the substrate 10 are bonded by a thermocompression process.

In the above-mentioned precoating method, more particularly, a suitable solvent is added to a thermosetting or thermoplastic resin, which is a binder resin, until its viscosity becomes appropriate for a precoating. After applying thus-formed adhesive composition onto the substrate 10, the solvent contained is evaporated by exposing the substrate 10 to the temperature of about 40° to 120° C. After that, the thermocompression bonding is performed using a temperature of about 60° to 170° C., and a post curing of the adhesive composition is carried out if necessary. The insulating layer 18 is thus produced.

As a binder resin, a thermosetting resin such as an epoxy resin and a maleimide type resin, or a thermoplastic resin such as, as disclosed in the Japanese Laid-Open Patent Application No. 5-182515, a phenoxy resin, a butyral resin, styrene-butadiene-styrene copolymer, styrene-isoprene-styrene copolymer, styrene-ethylene-butylene-styrene copolymer, or hydrogen-added compounds of the above-mentioned thermoplastic resins are used. It is desirable to employ the thermoplastic resin as the binder resin in order to relieve or reduce the stress generated by bonding different types of materials. When hydrogen is added to the styrene-ethylene-butylene-styrene copolymer and a carboxyl group is further attached to the polymer by maleic acid modification, a resulting adhesive composition formed in conjunction with an epoxy resin as a cross-linking agent has properties of thermal and moisture resistances.

Next, mechanisms of adhesion will be explained. Firstly, in a case in which thermoplastic resin is used as a binder resin, the binder resin, which is applied and dried to evaporate a contained solvent, is welded between the substrate 10 and the wiring layer 20 during a thermocompression process. Thus, the binder resin is turned into an insulating layer 18, and the substrate 10 and the wiring layer 20 are adhered by the insulating layer 18. Secondly, in a case in which a thermosetting resin is used as a binder resin, the binder resin, which is applied and dried to evaporate a contained solvent, is cured during a thermocompression process and adhered to the substrate 10 and the wiring layer 20. At that time, the binder resin is turned into a insulating layer 18, and the substrate 10 and the wiring layer 20 are adhered by the insulating layer 18.

When a thermoplastic resin such as a phenoxy resin and a butyral resin is used as a binder resin, the resins have advantages in that they require a relatively low temperature and a small amount of time for a thermocompression process and an insulating layer having a high insulating property may be obtained. However, the adhesive force (strength) of such a thermoplastic resin is lowered under a high-temperature environment and cannot be used for an electronic device which is used under such an environment.

Also, when a thermosetting resin such as an epoxy resin and a maleimide type resin is used, the resin has an advantage in that its adhesive force is not lowered even under a high-temperature environment. However, the thermosetting resin has a couple of disadvantages. For example, the resin requires high temperatures and a long time for a thermocompression process. This may become a cause of a defective adhesion or of a shift of position. Also, cure stress, which can lower a reliability of adhesion between the substrate 10 and the wiring layer 20, is generated in the resin after the thermocompression process. These disadvantages are caused by the fact that a low molecular weight epoxy resin must be cross-linked at once in the thermocompression process to become a high molecular one.

In order to solve the above-mentioned problems, adhesive compositions comprising a high molecular weight thermoplastic resin as a main component, a cross-linking agent and a cross-linking catalyst is disclosed in, for instance, the Japanese Laid-Open Patent Application No. 5-182515. The adhesive compositions are cross-linked by the operation of the cross-linking agent during a heating process for an adhesion. Thus, its heat resistance is improved, compared with a conventional thermoplastic resin, and the lowering of adhesive force under a high-temperature condition is restrained. Also, since the high molecular weight thermoplastic resin is used as a main component, a milder heating condition may be selected for a cross-linking process compared with a conventional thermosetting resin. The adhesive composition has sufficient heat resistance and adhesive force even in a low degree cross-linking state. Thus, compared with a case in which a conventional thermosetting resin is used, it is possible to form an insulating layer having low cure stress in a smaller amount of time using a lower temperature. In addition, an epoxy resin as a cross-linking agent and an imidazole type catalyst as a cross-linking catalyst may be included in the adhesive composition.

On the other hand, alumina, aluminium nitride, silicon nitride, silicon carbide, crystalline silica, fused silica and so forth having excellent thermal conductivity are suitable for use as a filler added to the binder resin and silver powder, for example, is used for the portion required to be electroconductive.

Moreover, the thickness of the insulating layer thus formed is preferably between about 5 to 80 $\mu$m in terms of balancing adhesive strength, thermal conductivity and so on.

It is necessary for the insulating layer 18 to release the heat generated by the operation of the semiconductor element 16 effectively through the substrate 10 and the frame body 28. Thus, it is required for the die-bond layer 14 and the insulating layer 18 that voids, which slow down or prevent the heat transfer, are not formed in the layers thereof.

However, in the above-mentioned conventional adhesive compositions, a number of voids are formed upon curing of the die-bond material and, therefore, it is difficult to transfer the heat produced by the semiconductor element 16 effectively to the substrate 10.

As for an adhesive composition used in the precoating method which is advantageous regarding non-voids and an easy operation, since wetting of an adhesive composition to a surface during thermocompression is not sufficient, an interspace is generated between the two surfaces, which causes a difficulty of transferring the heat from the semiconductor element 16 to the frame body 28 effectively.

Also, even when no deficiency is observed in a packaged adhesive layer by an external appearance test, wetting of an adhesive composition at interfaces between the insulating layer 18 and the substrate 10, the insulating layer 18 and the wiring layer 20, and the insulating layer 18 and the frame body 28 is often insufficient and water in the air permeates the interfaces and causes a parting of adhered layers or a defective operation of the semiconductor device.

Moreover, when the substrate 10 and the frame body 28 are adhered together, an adhesive composition may be precoated onto the frame body 28 and then thermally compressed to the substrate 10. However, it is difficult to maintain a flame retardation characteristic of the adhesive composition precoated onto the frame body 28 when it is stored until the initiation of the thermal compression process.

Further, when reactive silicone is added as an epoxy compound to the adhesive composition, the adhesive composition maintains its liquid phase even after being precoated to a surface and evaporating the solvent contained therein is difficult since the reactive silicone is a liquid. Thus its workability is not good and it often becomes a main cause of the generation of the voids in the adhesive layer after being cured.

Also, when the adhesive layer is thermally compressed and the post curing is carried out, since the silicone component separates from the adhesive layer and rises to the surface of the semiconductor element 16, a contamination of the semiconductor element 16 sometimes occurs.

Although an adhesive composition, to which biphenyl type epoxy resin or epoxidated polybutadiene rubber is added as a cross-linking agent, has an excellent moisture resistance and stress relaxation, a viscosity of the biphenyl type epoxy resin when dissolved is very low and the epoxidated polybutadiene is in a liquid state. Therefore, they flow out of the adhesive during the thermal compression process and it is not easy to use them as a component of the adhesive composition used for the thermocompression process.

Moreover, since the biphenyl type epoxy resin is a crystalline polymer, it is crystallized and precipitated when stored at a low temperature (about –40° C. to 5° C.) after being dissolved in a solvent. The precipitates are not dissolved even when the temperature is raised to room temperature and thus its workability for precoating is very low.

Also, as for the above-mentioned conventional adhesive composition to which a filler is added, since a number of concavo-convex portions are generated due to the shape and size of the filler used, the binder resin is not sufficiently spread at interfaces and filling of the concave parts becomes often insufficient. Thus, the adhesive strength is lowered.

Further, when water permeates through the space generated between the adhered layers, a parting of the two layers is caused due to the absorption of moisture and a consecutive lowering of the adhesive strength, or a defective operation of the semiconductor element 16, occurs due to the water vapor reaching to the semiconductor element 16.

Although it is effective to disperse fillers, whose diameter is almost the same length as the thickness of the insulating layer 18, in the adhesive composition in order to prevent the flashes of the resin due to a clamping pressure, a cohesive powder is destroyed by the clamping pressure when a conventional alumina or aluminium nitride cohesive powder having a diameter of about 3 to 30 $\mu$m and excellent in thermal conductivity is used as the filler. As a result, the flashes of the resin are generated and the thickness of the insulating layer 18 becomes thin.

When such a cohesive powder is used as a filler, the heat transfer coefficient of the resulting adhesive becomes 90% to less than 20% of the theoretical value and so the coefficient of the insulating layer 18 cannot be raised high enough.

Also, when alumina is used as the filler and a resin having carboxyl groups such as hydrogen-added styrene-ethylene-butylene-styrene copolymer is used as the binder resin, its viscosity is increased during storage due to the adsorption of carboxyl groups by alumina and sometimes a precoating may not be performed.

Also, when aluminium nitride is used as the filler, it is decomposed by water vapor in the air to produce ammonium ion which causes defective operation of the semiconductor element 16.

Moreover, a space 40 is sealed using the resin 42 to protect the semiconductor device and to do so it is necessary to clamp the semiconductor device from its top and bottom using a pressure of about 50 to 500 kgf/cm$^2$ under a temperature of about 160° to 180° C. At that time, since the resin component of the adhesive composition is exposed to a temperature higher than its glass transition temperature and a pressure is further added, the resin is softened and spewed from the sides to make the insulating layer 18 thin and deteriorate its insulating capacity.

Also, because the semiconductor device is heated to about 260° C. when mounted on a printed board, even when a thermoplastic resin whose heat resistance is increased by adding an epoxy compound is used as a binder resin, it is often deteriorated due to the heating and a deficiency of the adhesive occurs.

Moreover, when the thermoplastic resin is used as the binder resin, a resulting adhesive composition is dissolved during a flux washing after mounting on the printed board and adherends are peeled off.

Further, since the stress relaxation ability of the conventional adhesive layer is not enough, destruction of soldered portions or the semiconductor element 16 due to stress generated between the mounting board and the semiconductor device or between the substrate 10 and the semiconductor element 16, respectively, occurs after a mounting of the board.

Also, as mentioned above, it is necessary for the insulating layer 18 to effectively transfer the heat generated by the operation of the semiconductor element 16 to the substrate 10 and the frame member 28. However, with the use of a conventional die-bond material, it is difficult to perform such a transfer of heat since a number of voids are produced upon curing of the die-bond material.

On the other hand, a filler is added to adhesive compositions disclosed in the Japanese Laid-Open Patent Application No. 5-182515 to increase the thermal conductivity. These adhesive compositions are used for a precoating method which is more useful compared with the other methods in terms of its voidless characteristic and workability. The shape of the filler is non-spherical in order to increase its surface area and hence to improve the thermal conductivity of the adhesive composition. However, since the flow of the adhesive composition to which such a non-spherical filler is added is not good during the thermocompression process, sufficient contact at the interface cannot be obtained. Thus, there is a problem that the thermal conductivity between the adhesive layer and the adherend is decreased. Also, a number of particles whose size is less than 1 $\mu$m are generally included in such a filler. The flow of an adhesive composition to which the particles of less than 1 $\mu$m are added is also lowered during the thermocompression process and therefore the contact at interfaces becomes insufficient.

Further, conventional adhesive compositions which require a thermal curing process are generally heated to about 150° C. to 170° C. in order to produce cross-linkings among adhesive molecules and then cooled to a room temperature. Upon cooling of such an adhesive composition, stress is applied at a rubber/cross-linking agent interface due to the difference in thermal expansion coefficients between the two, and micro-cracks of about 0.1 to 0.5 $\mu$m in width and up to about 100 $\mu$m in length are generated after curing of the adhesive composition. If such an adhesive composition is used for an LSI package, water in the air passes through the micro-cracks and causes problems such as a shorting of wires.

Also, if a hygroscopic package to which such an adhesive composition is applied is mounted on a mounting board, water which is present in the cracks is vaporized by the heat and expands rapidly during the mounting processes and so-called popcorn cracks are generated. The popcorn cracks can become a further cause to lower the reliability of the package.

SUMMARY OF THE INVENTION

Accordingly, it is a general object of the present invention to provide a novel and useful adhesive composition suitably used in manufacturing a semiconductor device, a semiconductor device using the composition, an adhering method using the composition and a method for producing a semiconductor device using the composition.

It is another object of the present invention to provide an adhesive composition which is capable of completely filling the concavo-convex portions upon thermocompression and has excellent heat resistance, moisture resistance, solvent resistance, stress relaxation, workability, and inflammability.

It is another object of the present invention to provide an adhesive composition which has an excellent preservability and can prevent a formation of ionic impurities caused by an absorption of moisture.

It is another object of the present invention to provide an adhesive composition having excellent heat resistance, thermal conductivity, moisture resistance, workability and so on.

It is yet another object of the present invention to provide an adhering method using the above-mentioned adhesive compositions.

It is another object of the present invention to provide an adhering method which can prevent a cross-linking reaction during a precoating process.

It is yet another object of the present invention to provide a semiconductor device having an excellent heat dissipation property and high reliability using the above-mentioned adhesive compositions.

It is yet another object of the present invention to provide a method for manufacturing a semiconductor device using the above-mentioned adhesive compositions.

The above objects of the present invention are achieved by an adhesive composition comprising: a main component including a resin material, a solvent for dissolving the main component, and a filler added to the main component, wherein the filler has a particle size so as to make a concavo-convex depth of a surface of the adhesive composition equal to or less than 15 $\mu$m after the adhesive composition is applied to an adherend and dried in order to evaporate the solvent before a thermocompression process.

According to the above adhesive composition, since the concavo-convex depth of the adhesive surface immediately after the solvent is evaporated becomes less than 15 $\mu$m, the main component is sufficiently spread at an interface during the thermal compression process and an excellent adhesive strength and moisture resistance can be obtained.

The objects described above are also achieved by the adhesive composition wherein the filler has a particle size distribution expressed by a D50 value, which indicates a number average particle size, of 3 to 30 μm, a D20 value, which indicates a 20% particle size, of equal to or more than (D50−D50×0.3), and a D80 value, which indicates an 80% particle size, of equal to or less than (D50+D50×0.3).

According to the above adhesive composition, the concavo-convex depth of the adhesive after the preliminary drying can be kept to less than 15 μm.

The objects described above are also achieved by the adhesive composition, wherein the filler consists of first order particles of aluminium nitride or alumina.

According to the above adhesive composition, a destruction of the filler during a clamping can be avoided and flashes and a lowering of an insulation ability of the adhesive composition can be prevented.

The objects described above are also achieved by an adhesive composition comprising: a main component comprising a reactive thermoplastic resin, a flexibilizer comprising reactive silicone, and a solvent for dissolving the main component and the flexibilizer, wherein the main component is reacted with the flexibilizer before being applied to an adherend and the adhesive composition is dried in order to evaporate the solvent before a thermocompression process.

According to the above adhesive composition, since the reactive thermoplastic resin is reacted with the reactive silicone beforehand, the surface of the adhesive composition can be put a drying state when the solvent is evaporated during the preliminary drying process. Thus, the generation of the voids, etc., in the adhesive layer after curing can be prevented. Moreover, since the reactive silicone component is not separated during a thermal curing process, the contamination of a semiconductor element can be prevented.

The objects described above are also achieved by the adhesive composition, wherein the reactive functional group of the reactive thermoplastic resin is a compound having a carboxyl group or maleic anhydride, and the reactive silicone is a silicone having epoxy groups.

Also, it is preferable that the epoxy equivalent of the reactive silicone be equal to or more than 400 and equal to or less than 10000.

According to the above adhesive composition, an effect of the reactive silicone as the flexibilizer can be obtained and the adhesive composition can be solidified during the preliminary drying.

The objects described above are also achieved by the adhesive composition wherein about five to 100 parts by weight of the reactive silicone is added to 100 parts by weight of the main component.

According to the above adhesive composition, a deterioration of the adhesive by a bleeding-out can be prevented.

The objects described above are also achieved by an adhesive composition comprising: a main component comprising a reactive thermoplastic resin material, a cross-linking agent comprising epoxy resin having at least two epoxy groups, an additive comprising polyallylphenol, and a solvent for dissolving the main component, the cross-linking agent and the additive, wherein the adhesive composition is applied to an adherend and dried in order to evaporate the solvent before a thermocompression process.

According to the above adhesive composition, both the adhesive strength and the moisture resistance can be improved.

The objects described above are also achieved by the adhesive composition, wherein about five to 120 parts by weight of the additive are added to 100 parts by weight of the main component.

According to the above adhesive composition, the effect of adding the additive can be improved.

The objects described above are also achieved by an adhesive composition comprising: a main component comprising ethylene-propylene terpolymer having dicyclopentadiene or ethylidene norbornene as a third component, a cross-linking agent comprising polyallylphenol, and a solvent for dissolving the main component and the cross-linking agent, wherein the adhesive composition is applied to an adherend and dried in order to evaporate the solvent before a thermocompression process.

According to the above adhesive composition, the hydrophobicity and wettability of the adhesive composition can be improved significantly.

The objects described above are also achieved by the adhesive composition, wherein the iodine value of the third component is between about five to 40.

According to the above adhesive composition, an adhesive composition which has an excellent adhesive strength and moisture resistance can be obtained.

The objects described above are also achieved by the adhesive composition, wherein about five to 120 parts by weight of the cross-linking agent are added to 100 parts by weight of the main component.

According to the above adhesive composition, the adhesive strength and the wettability can be improved.

The objects described above are also achieved by an adhesive composition comprising: a main component comprising reactive thermoplastic resin, a cross-linking agent for cross-linking the main component, a fire retardant comprising silicone resin, and a solvent-for dissolving the main component and the cross-linking agent and homogeneously dispersing the fire retardant, wherein the adhesive composition is applied to an adherend and dried in order to evaporate the solvent before a thermocompression process.

According to the above adhesive composition, an inflammability of the adhesive composition can be improved.

The objects described above are also achieved by an adhesive composition comprising: a main component including thermoplastic resin having carboxyl groups, epoxy resin having at least two epoxy groups, and a solvent, wherein an organophosphorus compound covered with thermoplastic resin is included as a catalyst.

The objects described above are also achieved by the adhesive composition, wherein the organophosphorus compound is phosphine.

The objects described above are also achieved by the adhesive composition, wherein the phosphine contains aryl groups.

The objects described above are also achieved by the adhesive composition, wherein the phosphine containing aryl groups is selected from a group consisting of triphenylphosphines, triorthotolylphosphines, trimethatolylphosphines, triparatolylphosphines and tris-4-methoxyphenylphosphines.

The objects described above are also achieved by an adhering method using one of the adhesive compositions described above.

The objects described above are also achieved by the adhering method further comprising steps of: applying the adhesive composition to an adherend, drying the adhesive composition at a first temperature to evaporate a solvent contained in the adhesive composition, and thermally compressing the adherend to another adherend at a second temperature higher than the first temperature, wherein the first temperature is set substantially lower than the melting point of thermoplastic resin covering the organophosphorus compound, and the second temperature is set substantially higher than the melting point of the thermoplastic resin covering the organophosphorus compound.

The objects described above are also achieved by the adhering method, wherein the second temperature is set substantially higher than the melting point of the organophosphorus compound.

According to the above adhesive composition and the adhering method, it is possible to maintain the organophosphorus compound which is a catalyst in a separated state from the main component, epoxy resin and solvent during a storage period or a drying step in an adhering process. Thus, a catalytic action of the adhesive composition may be controlled not to be exerted before a thermal compression process and any cross-linking reactions of the adhesive composition can be prohibited. Also, thermoplastic resin which covers the organophosphorus compound is stable at temperatures used for the drying step but is melted at temperatures used for the thermal compression process. When the thermoplastic resin is melted at the thermal compression process, since the melting point of the organophosphorus compound is also set lower than the temperatures used for the thermal compression process, the organophosphorus compound is melted and spreads in the adhesive composition to act as a cross-linking catalyst. Moreover, the organophosphorus compounds such as phosphines having aryl groups have a characteristic that they are not easily hydrolyzed by an absorption of moisture. Therefore, an adhesive composition which has an excellent preservability and is capable of preventing a formation of ionic impurities due to the moisture absorption and cross-linking reactions before the thermal compression process may be obtained.

The objects described above are also achieved by an adhesive composition comprising: a main component including thermoplastic resin having carboxyl groups, epoxy resin having at least two epoxy groups, and a solvent, wherein a quaternary salt of an organophosphorus compound having aryl groups is included as a catalyst.

The objects described above are also achieved by the adhesive composition, wherein the organophosphorus compound is phosphine.

The objects described above are also achieved by the adhesive composition, wherein the quaternary salt of an organophosphorus compound having aryl groups is selected from a group consisting of quaternary salts of triphenylphosphines, quaternary salts of triorthotolylphosphines, quaternary salts of trimethatolylphosphines, quaternary salts of triparatolylphosphines and quaternary salts of tris-4-methoxyphenylphosphines.

The objects described above are also achieved by an adhering method using one of the adhesive compositions described above.

The objects described above are also achieved by the adhering method further comprising steps of: applying the adhesive composition to an adherend, drying the adhesive composition at a first temperature to evaporate a solvent contained in the adhesive composition, and thermally compressing the adherend to another adherend at a second temperature higher than the first temperature, wherein the first temperature is set substantially lower than the temperature at which catalytic action of the quaternary salt of organophosphorus compound having aryl groups is activated, and the second temperature is set substantially higher than the temperature at which catalytic action of the quaternary salt of an organophosphorus compound having aryl groups is activated.

According to the above adhesive composition and the adhering method, a quaternary salt of organophosphorus compound having aryl groups is used as a catalyst. Such a catalyst has a characteristic that it does not show any catalytic action at low temperatures, for example, between 40° C. and 80° C. but it exerts its catalytic activity at temperatures between 120° C. to 200° C., which is a temperature range used for a thermal compression process. The reason of this is considered that the quaternary salt, which does not have catalytic activity and thermally stable at temperatures between 40° C. and 80° C., is decomposed at temperatures between 120° C. and 200° C. and generates organophosphorus compound having aryl groups which has a catalytic activity. For example, a thermal decomposition of a quaternary salt of triphenylphosphine produces triphenylphosphine which is an excellent catalyst for the cross-linking reactions carried out in the adhesive composition according to the present invention. Thus, it is possible to maintain the quaternary salt of an organophosphorus compound having aryl groups in a separated state from the main component, epoxy resin and solvent during a storage period or a drying step in an adhering process. Hence, a catalytic action of the adhesive composition may be controlled not to be exerted before a thermal compression process and any cross-linking reactions of the adhesive composition can be prohibited. Also, the organophosphorus compounds such as phosphines having aryl groups have a characteristic that they are not easily hydrolyzed by an absorption of moisture. Therefore, an adhesive composition which has an excellent preservability and is capable of preventing a formation of ionic impurities due to the moisture absorption and crosslinking reactions before the thermal compression process may be obtained.

The objects described above are also achieved by an adhesive composition comprising: a main component including thermoplastic resin having carboxyl groups, epoxy resin having at least two epoxy groups, and a solvent, wherein an organophosphorus compound having a melting point in the range of about 100° C. to 200° C. is included as a catalyst.

The objects described above are also achieved by the adhesive composition, wherein the organophosphorus compound is phosphine.

The objects described above are also achieved by the adhesive composition, wherein the phosphine contains aryl groups.

The objects described above are also achieved by the adhesive composition, wherein the phosphine containing aryl groups is selected from a group consisting of triphenylphosphines, triorthotolylphosphines, trimethatolylphosphines, triparatolylphosphines and tris-4-methoxyphenylphosphines.

The objects described above are also achieved by an adhering method using one of the adhesive compositions described above.

The objects described above are also achieved by the adhering method further comprising steps of: applying the adhesive composition to an adherend, drying the adhesive composition at a first temperature to evaporate a solvent contained in the adhesive composition, and thermally compressing the adherend to another adherend at a second temperature higher than the first temperature, wherein the first temperature is set substantially lower than the melting point of organophosphorus compound having melting point in the range of about 100° C. to 200° C., and the second temperature is set substantially higher than the melting point of the organophosphorus compound having melting point in the range of about 100° C. to 200° C.

According to the above adhesive composition and the adhering method, the organophosphorus compound having the melting point in the range of about 100° C. to 200° C. exists in a solid state in a mixture of the main component including thermoplastic resin having carboxyl groups, epoxy resin having at least two epoxy groups, and the solvent during a storage period or drying process, for which temperatures used are low, possibly in the range of about 40° C. to 80° C. Therefore, the catalytic sites of the organophosphorus compound having the melting point in the range of about 100° C to 200° C. are limited to only its surface and a catalytic reaction may not substantially be proceeded. However, when high temperatures higher than the melting point of the organophosphorus compound are added to the adhesive composition during a thermal compression process, the organophosphorus compound is melted and disperses evenly in the adhesive composition. Thus, cross-linking reactions may proceed at a high speed. Also, the organophosphorus compounds such as phosphines having aryl groups have a characteristic that they are not easily hydrolyzed by an absorption of moisture. Therefore, an adhesive composition which has an excellent preservability and is capable of preventing a formation of ionic impurities due to the moisture absorption and cross-linking reactions before the thermal compression process may be obtained.

The objects described above are also achieved by the adhesive composition, wherein a tackifier for varying the viscosity is added to the above-mentioned adhesive composition.

According to the above adhesive composition, the thermal conductivity of the adhesive composition can be improved.

The objects described above are also achieved by an adhesive composition, wherein the tackifier is added to the adhesive composition so that the viscosity of the adhesive composition upon thermal compression process becomes 30 to 80 Pa·s.

According to the above adhesive composition, the adhesive composition can be used as a die-bond material for constructing a semiconductor device.

The objects described above are also achieved by the adhesive composition comprising: a main component comprising reactive thermoplastic resin, a cross-linking agent for cross-linking the main component, a tackifier for varying the viscosity, and a solvent for dissolving the main component, the cross-linking agent and the tackifier, wherein about five to 400 parts by weight of the tackifier is added to 100 parts by weight of the main component, and the adhesive composition is applied to an adherend and dried in order to evaporate the solvent before a thermocompression process.

According to the above adhesive composition, the wettability of the adhesive composition at an interface and stress relaxation capacity can be significantly improved.

It is preferable that the tackifier used in the above adhesive compositions comprises a copolymer having a general formula of:

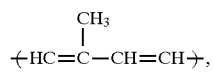

-continued

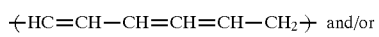 and/or

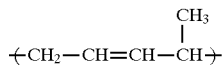

and having a structure which is a styrene-modified.

Also, it is preferable that the tackifier used in the above adhesive compositions comprises a polymer of β-pinene.

Moreover, it is preferable that the tackifier used in the above adhesive compositions comprises a hydrogen-added rosin ester type resin.

According to the above adhesive composition, the wettability of the adhesive composition at interfaces and stress relaxation capacity can also be significantly improved.

The objects described above are also achieved by an adhesive composition comprising: a main component comprising reactive thermoplastic resin, a cross-linking agent comprising a biphenyl type epoxy resin or epoxidated polybutadiene rubber, and a solvent for dissolving the main component and the cross-linking agent, wherein about five to 400 parts by weight of the cross-linking agent is added to 100 parts by weight of the main component, and the adhesive composition is applied to an adherend and dried in order to evaporate the solvent before a thermocompression process.

According to the above adhesive composition, the adhesive strength, solvent resistance and workability can be improved.

The above objects of the present invention is achieved by an adhesive composition comprising: a main component comprising a reactive thermoplastic resin, a cross-linking agent, a tackifier, a solvent for dissolving the main component, the cross-linking agent and the tackifier, and a filler wherein the shape of the filler is spherical or substantially spherical and the adhesive composition is applied to an adherend and dried in order to evaporate the solvent before a thermocompression process.

According to the above adhesive composition, since the main component is sufficiently spread at an interface during the thermocompression process due to the inclusion of the spherical filler, an excellent adhesive strength and moisture resistance can be obtained.

The objects described above are also achieved by the adhesive composition wherein the filler has a particle size distribution, D50, of 3 to 30 μm, and does not include any particles whose particle size is less than 1 μm or has a 5% particle size, D5, of at least 1 μm.

According to the above adhesive composition, since particles of less than 1 μm diameter are not included in the filler, or the filler has a D5 of at least 1 μm, the flow of the adhesive composition at interface during the thermocompression process is improved and an excellent adhesive strength and moisture resistance can be obtained.

The objects described above are also achieved by the adhesive composition, wherein a filler is added to the main component. It is preferable that the filler comprises aluminium nitride powder which is covered by a silicone oxide layer.

According to the above adhesive composition, the thermal conductivity and moisture resistance of the adhesive composition can be improved.

The above objects of the present invention is also achieved by an adhesive composition, wherein the filler is coupling-processed in advance.

According to the above adhesive composition, since the surface of the filler is coupling-processed in advance, it is possible to attach functional groups which react with the resin component, on the surface of the filler. Therefore, chemical bondings are produced between the filler and the resin at the same time of curing of the adhesive and a cohesive strength of the adhesive on the entire bulk is increased after curing of the adhesive composition. As a result, the generation of the micro-cracks at the time of the curing of adhesive may be prevented. Also, since no micro-cracks are present in the LSI package, water cannot get inside the package. Thus, a package with a high reliability may be obtained.

The objects described above are also achieved by an adhesive sheet comprising any one of the above adhesive compositions applied to a release sheet, wherein the adhesive sheet is applied to an adherend and the release sheet is peeled off prior to a thermocompression process.

The objects described above are also achieved by a semiconductor device comprising: a substrate, a semiconductor element mounted on the substrate, and a wiring layer for connecting the semiconductor element to an outer lead portion, wherein an adhesive layer is provided one of between the substrate and the semiconductor element, between the substrate and the wiring layer, and between the substrate and the semiconductor element and between the substrate and the wiring layer, and the adhesive layer is comprised of one of the above-mentioned adhesive compositions.

When the above-mentioned adhesive composition is used as an adhesive composition for adhering the substrate with the wiring layer, a semiconductor device having excellent heat releasing capacity, moisture resistance and high reliability can be constructed.

The objects described above are also achieved by the semiconductor device further comprising a frame body provided so as to surround the semiconductor element, wherein the adhesive layer is provided between the wiring layer and the frame body.

The objects described above are also achieved by the semiconductor device, wherein a heat releasing structure is formed on the substrate and the adhesive layer is also provided between the heat releasing structure and the substrate.

When the above-mentioned adhesive composition is used as an adhesive composition for adhering the substrate with the wiring layer and the substrate with the frame body, a semiconductor device having excellent heat releasing capacity, moisture resistance and high reliability can be constructed.

The objects described above are achieved by a method for producing a semiconductor device comprising steps of: applying an adhesive composition to a substrate to form adhesive layer(s), drying the adhesive layer(s) at a first temperature, and thermally compressing at least one of a semiconductor element and a wiring layer to the adhesive layer(s) at a second temperature higher than the first temperature, wherein one of the adhesive compositions as explained above is used as the adhesive composition.

If a semiconductor device is constructed in a manner as above, a semiconductor device having excellent heat releasing capacity, moisture resistance and high reliability can be constructed.

It is preferable that the method for producing a semiconductor device further comprises steps of: applying an adhesive composition to the opposite side of the wiring layer to form an adhesive layer, drying the adhesive layer at a third temperature, and thermally compressing a frame body to the adhesive layer at a fourth temperature higher than the third temperature, wherein one of the adhesive compositions as explained above is used as the adhesive composition.

If a semiconductor device is constructed in a manner as above, a semiconductor device having excellent heat releasing capacity, moisture resistance and high reliability can be constructed.

The objects described above are achieved by a method for producing a semiconductor device comprising steps of: applying an adhesive composition to a substrate to form an adhesive layer, drying the adhesive layer at a first temperature, and thermally compressing a semiconductor element to the adhesive layer at a second temperature higher than the first temperature, wherein the adhesive composition is comprised of a main component including a first thermoplastic resin having carboxyl groups, epoxy resin having at least two epoxy groups, a solvent and a catalyst, and the catalyst is comprised of an organophosphorus compound covered with a second thermoplastic resin.

The objects described above are also achieved by the method for producing a semiconductor device, wherein the organophosphorus compound is phosphine.

The objects described above are also achieved by the method for producing a semiconductor device, wherein the phosphine contains aryl groups.

The objects described above are also achieved by the method for producing a semiconductor device, wherein the phosphine containing aryl groups is selected from a group consisting of triphenylphosphines, triorthotolylphosphines, trimethatolylphosphines, triparatolylphosphines and tris-4-methoxyphenylphosphines.

According to the above method for producing a semiconductor device, it is possible to maintain the organophosphorus compound which is a catalyst in a separated state from the main component, epoxy resin and solvent during a storage period or a drying step in an adhering process. Thus, a catalytic action of the adhesive composition may be controlled not to be exerted before a thermal compression process and any cross-linking reactions of the adhesive composition can be prohibited. Also, thermoplastic resin which covers the organophosphorus compound is stable at temperatures used for the drying step but is melted at temperatures used for the thermal compression process. When the thermoplastic resin is melted during the thermal compression process, since the melting point of the organophosphorus compound is also set lower than the temperatures used for the thermal compression process, the organophosphorus compound is melted and spreads in the adhesive composition to act as a cross-linking catalyst. Moreover, the organophosphorus compounds such as phosphines having aryl groups have a characteristic that they are not easily hydrolyzed by an absorption of moisture. Thus, by using an adhesive composition which has an excellent preservability and is capable of preventing a formation of ionic impurities due to the moisture absorption and cross-linking reactions before the thermal compression process, it is possible to produce a semiconductor device having an excellent adhesive layer between the substrate and the wiring layer and between the substrate and the semiconductor element, by which heat generated by the semiconductor element may be effectively transferred. Further, since no ionic impurities are formed in the adhesive layer, a semiconductor device, in which no electrical shorting or opening of a wire is caused by corrosion due to impurities, may be obtained.

The objects described above are achieved by a method for producing a semiconductor device comprising steps of: applying an adhesive composition to a substrate to form an adhesive layer, drying the adhesive layer at a first temperature, and thermally compressing a semiconductor element to the adhesive layer at a second temperature higher than the first temperature, wherein the adhesive composition is comprised of a main component including a first thermoplastic resin having carboxyl groups, epoxy resin having at least two epoxy groups, a solvent and a catalyst, and the catalyst is comprised of a quaternary salt of an organophosphorus compound having aryl groups.

The objects described above are also achieved by the method for producing a semiconductor device, wherein the organophosphorus compound is phosphine.

The objects described above are also achieved by the method for producing a semiconductor device, wherein the quaternary salt of an organophosphorus compound having aryl groups is selected from a group consisting of quaternary salts of triphenylphosphines, quaternary salts of triorthotolylphosphines, quaternary salts of trimethatolylphosphines, quaternary salts of triparatolylphosphines and quaternary salts of tris-4-methoxyphenylphosphines.

According to the above method for producing a semiconductor device, a quaternary salt of an organophosphorus compound having aryl groups is used as a catalyst. Such a catalyst has a characteristic that it does not show any catalytic action at low temperatures, for example, between 40° C. and 80° C. but exerts its catalytic activity at temperatures between 120° C. to 200° C., which is a temperature range used for a thermal compression process. The reason of this is considered that the quaternary salt, which does not have catalytic activity and thermally stable at temperatures between 40° C. and 80° C., is decomposed at temperatures between 120° C. and 200° C. and generates organophosphorus compound having aryl groups which has a catalytic activity. For example, a thermal decomposition of a quaternary salt of triphenylphosphine produces triphenylphosphine which is an excellent catalyst for the cross-linking reactions carried out in the adhesive composition according to the present invention. Thus, it is possible to maintain the quaternary salt of an organophosphorus compound having aryl groups in a separated state from the main component, epoxy resin and solvent during a storage period or a drying step in an adhering process. Hence, a catalytic action of the adhesive composition may be controlled not to be exerted before a thermal compression process and any cross-linking reactions of the adhesive composition can be prohibited. Also, the organophosphorus compounds such as phosphines having aryl groups have a characteristic that they are not easily hydrolyzed by an absorption of moisture. Thus, by using an adhesive composition which has an excellent preservability and is capable of preventing a formation of ionic impurities due to the moisture absorption and cross-linking reactions before the thermal compression process, it is possible to produce a semiconductor device having an excellent adhesive layer between the substrate and the wiring layer and between the substrate and the semiconductor element, by which heat generated by the semiconductor element may be effectively transferred. Further, since no ionic impurities are formed in the adhesive layer, a semiconductor device, in which no electrical shorting or opening of a wire is caused by corrosion due to impurities, may be obtained.

The objects described above are achieved by a method for producing a semiconductor device comprising steps of: applying an adhesive composition to a substrate to form an adhesive layer, drying the adhesive layer at a first temperature, and thermally compressing a semiconductor element to the adhesive layer at a second temperature higher than the first temperature, wherein the adhesive composition is comprised of a main component including a first thermoplastic resin having carboxyl groups, epoxy resin having at least two epoxy groups, a solvent and a catalyst, and the catalyst is comprised of an organophosphorus compound having a melting point in the range of about 100° C. to 200° C.

The objects described above are also achieved by the method for producing a semiconductor device, wherein the organophosphorus compound is phosphine.

The objects described above are also achieved by the method for producing a semiconductor device, wherein the phosphine contains aryl groups.

The objects described above are also achieved by the method for producing a semiconductor device, wherein the phosphine containing aryl groups is selected from a group consisting of triphenylphosphines, triorthotolylphosphines, trimethatolylphosphines, triparatolylphosphines and tris-4-methoxyphenylphosphines.

According to the above method for producing a semiconductor device, the organophosphorus compound having a melting point in the range of about 100° C. to 200° C. exists in a solid state in a mixture of the main component including thermoplastic resin having carboxyl groups, epoxy resin having at least two epoxy groups, and the solvent during a storage period or drying process, for which temperatures used are low, possibly in the range of about 40° C. to 80° C. Therefore, the catalytic sites of the organophosphorus compound having the melting point in the range of about 100° C. to 200° C. are limited to only its surface and a catalytic reaction may not substantially proceed. However, when high temperatures higher than the melting point of the organophosphorus compound are added to the adhesive composition during a thermal compression process, the organophosphorus compound is melted and disperses evenly in the adhesive composition. Thus, cross-linking reactions may proceed at a high speed. Also, the organophosphorus compounds such as phosphines having aryl groups have a characteristic that they are not easily hydrolyzed by an absorption of moisture. Thus, by using an adhesive composition which has an excellent preservability and is capable of preventing a formation of ionic impurities due to the moisture absorption and cross-linking reactions before the thermal compression process, it is possible to produce a semiconductor device having an excellent adhesive layer between the substrate and the wiring layer and between the substrate and the semiconductor element, by which heat generated by the semiconductor element may be effectively transferred. Further, since no ionic impurities are formed in the adhesive layer, a semiconductor device, in which no electrical shorting or opening of a wire is caused by corrosion due to impurities, may be obtained.

Other objects and further features of the present invention will be apparent from the following detailed description when read in conjunction with the accompanying drawings.

BRIEF DESCRIPTION OF THE DRAWINGS

FIG. 5A is a diagram for explaining a method for producing a semiconductor device according to the present invention, FIG. 5B is a diagram for explaining the method for producing a semiconductor device according to the present invention, FIG. 5C is a diagram for explaining the method for producing a semiconductor device according to the present invention, FIG. 5D is a diagram for explaining the method for producing a semiconductor device according to the present invention.

DESCRIPTION OF THE PREFERRED EXAMPLES

Figure 1:
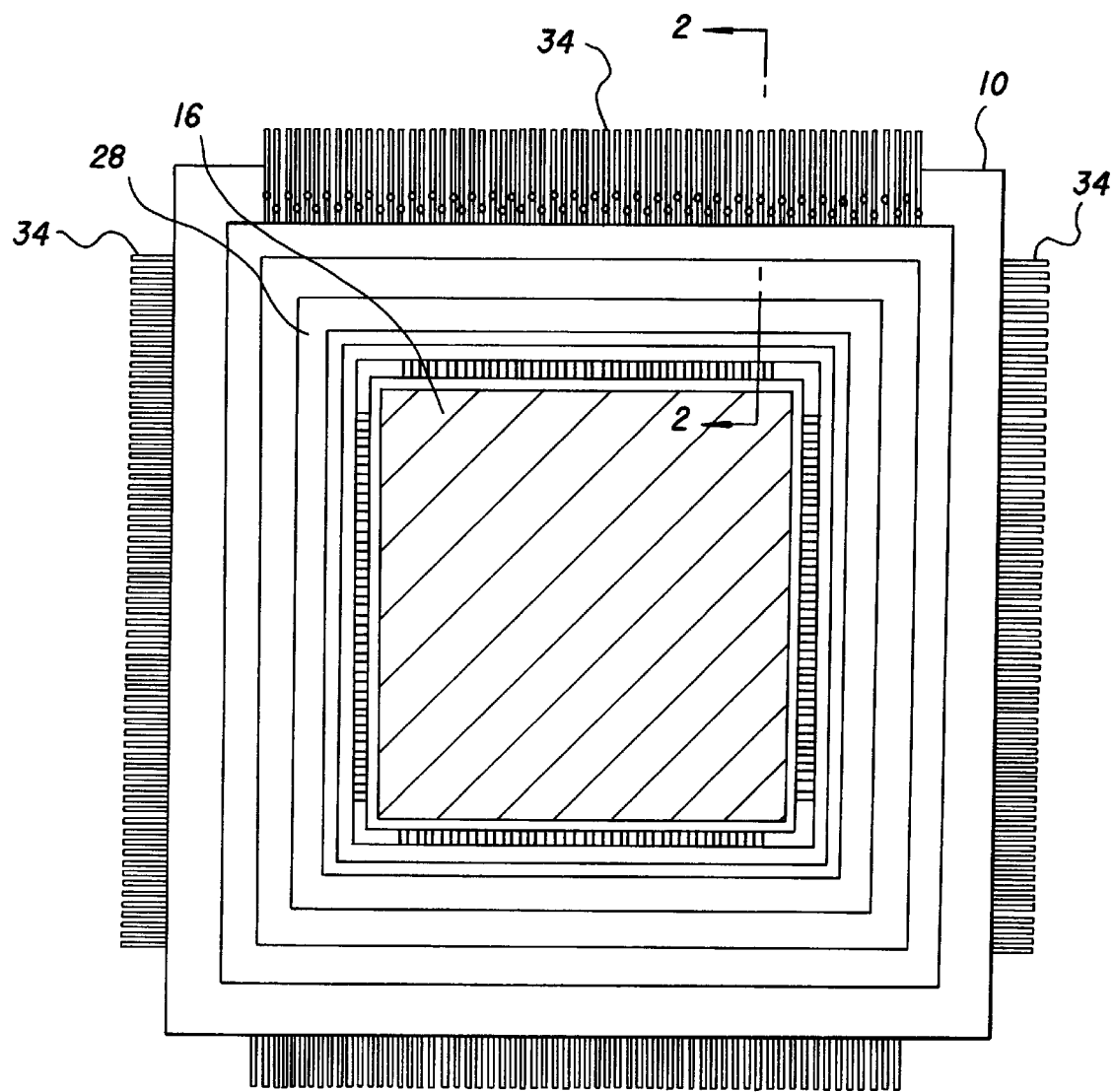
FIG. 1 is a structural diagram of a conventional semiconductor device.
Figure 2:
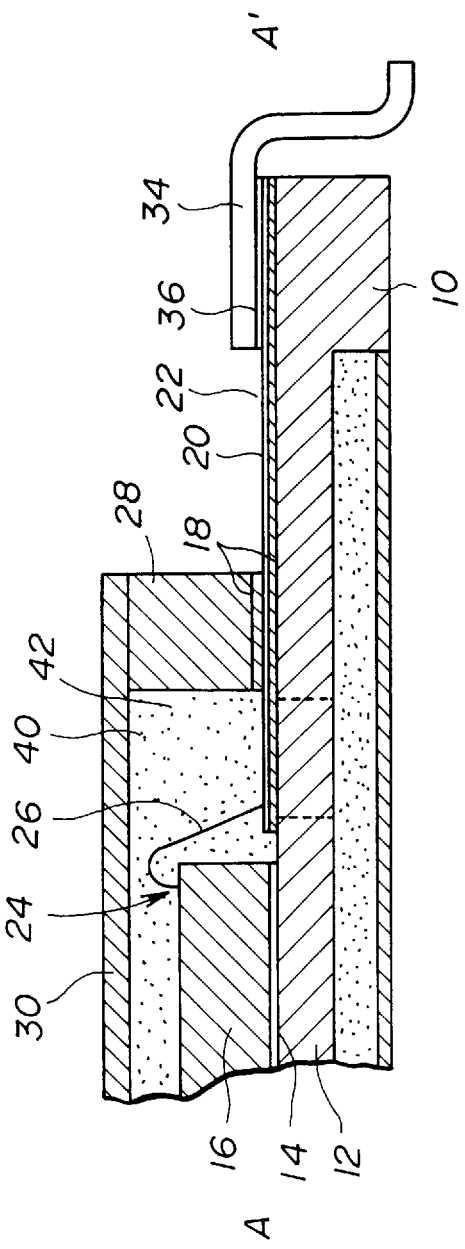
FIG. 2 is a cross-sectional view of a conventional semiconductor device.

In the following, a principle and examples of the present invention will be described.

[First Embodiment]

An adhesive composition according to the first embodiment of the present invention contains a filler having a predetermined range of a particle size distribution and at the same time the filler is constituted only by primary particles. In this way, the surface of the adhesive after a preliminary drying is smooth and makes the filling of concavo portions on an adherend by the binder resin easier. Thus, the adhesive composition having an excellent adhesive strength, thermal conductivity and electrical insulation can be constructed. Also, by using such an adhesive composition for manufacturing a semiconductor device, it is possible to produce a semiconductor device having an excellent heat dissipation property and a high reliability.

The concavo-convex roughness of the surface of the adhesive after the preliminary drying is increased by increasing the particle size of the filler to be added to the adhesive composition.

On the other hand, when the particle size of the filler is small, less than 3 µm, for examples, flashes of the insulating layer after clamping is occurred. That is, if the number average particle size of the filler is less than 3 µm, the insulating layer cannot withstand the clamping pressure applied to the semiconductor device during the filling of the a resin. Moreover, the flashes of the binder resin further causes the deterioration of an electrical insulation property of the insulating layer.

The reason that clamping tolerance is increased according to the present invention is that the primary (first order) particles are used as the filler instead of the cohesive particles so that the destruction of the fillers due to the clamping pressure is prevented.

Accordingly, it is necessary to make the concavo-convex depth of the surface of the adhesive after the preliminary drying about 3 to 15 µm so that the binder resin can sufficiently fill holes and at the same time withstand the clamping pressure. Thus, the particle size of the filler added is preferably between about 3 to 30 µm.

In addition, it is preferable that the particle size distribution of the filler be as narrow as possible. However, if necessary, the distribution of the filler can be widened in order to obtain a viscosity necessary for applying an adhesive composition to the board, that is, thixotropy. In that case, it is possible to obtain a concavo-convex roughness of less than 15 µm of the surface of the adhesive after the preliminary drying, by using the filler whose number average particle distribution D50 is between 3 and 30 µm and adjusting the 20% particle size D20 and the 80% particle size D80 so as to become less than (D50−D50×0.3) and (D50+D50×0.3), respectively.

Now, what is meant by "D50" value of a number average particle size in this specification is the particle size of a medium filler particle, which filler particle is in the middle (50% position) when all of the filler particles are lined up in order of its size (from small to large). Likewise, D20 means the size of a particle which is in the 20% position and D80 means the size of a particle which is in the 80% position. The distribution of the size of filler particles may be expressed using these values.

Although the thickness of the adhesive applied is determined by the thickness of a mask for screen printing and the amount of non-volatile components in the adhesive, it is preferable to set the thickness between about 10 to 150 µm, preferably about 20 to 80 µm, after the preliminary drying and between about 8 to 140 µm, preferably about 10 to 50 µm, after the compression and cross-linking since it affects the adhesive strength, electrical insulation property, and lowering of stress for adhering different materials.

[Second Embodiment]

An adhesive composition according to the second embodiment of the present invention consists essentially of a main component comprising reactive thermoplastic resin and a flexibilizer comprising reactive silicone, wherein the reactive thermoplastic resin is reacted with the reactive silicone in advance. By this configuration, an adhesive composition having excellent heat resistance and moisture resistance, which can be applied for a precoating method may be obtained.

The amount of the reactive silicone added is preferably between 5 to 100 parts by weight with respect to 100 parts by weight of the reactive thermoplastic resin and the epoxy equivalent of the reactive silicone is preferably between 400 to 10000. The reason that the amount of the reactive silicone of between 5 to 100 parts by weight is preferable is that its effect is not obtained if less than 5 parts is added, and the adhesive strength is lowered due to a bleeding of the reactive silicone if more than 100 parts is added. The reason that the epoxy equivalent in the range of between 400 and 10000 is preferable is that the effect of silicone added as the flexibilizer is lost if it is less than 400, and it is still in the liquid phase after a preliminary reaction if it is more than 10000.

The heat resistance and the solvent resistance of the adhesive composition is significantly increased by adding the reactive silicone to the reactive thermoplastic resin compared with an adhesive composition to which epoxy resin is added as a curing agent. This is due to the heat resistance and the solvent resistance of the silicone itself. Moreover, a hydrophobicity of the adhesive composition is also increased by the addition of the silicone.

Therefore, if the above-mentioned adhesive composition is used for insulating layers of a semiconductor device, its adhesive strength is maintained even after various thermal and washing processes. Thus it is possible to prevent a worsening of the semiconductor element even when the semiconductor device is used under the conditions of high temperature and moisture.

Examples of the reactive thermoplastic resin, which is a main component of the adhesive composition, include hydrogen-added styrene-ethylene-butylene-styrene copolymer, hydrogen-added styrene-butadiene-styrene copolymer, maleates of hydrogen-added styrene-butadiene-styrene copolymer, maleates of hydrogen-added styrene-ethylene-butylene-styrene copolymer, maleic anhydride graft polyethylene, carboxyl acid modified polyethylene, maleic anhydride graft polypropylene, maleic anhydride graft ethylene propylene rubber and so on.

It is preferable to add a silicone compound which is reactive to a maleic anhydride or carboxyl group such as silicone having amino acids, alcohol modified silicone, carboxyl modified silicone, and silicone having epoxy groups and so forth. It is most preferable to use epoxy modified silicones having the following general formulae:

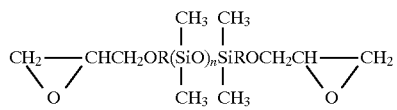

(wherein R represents an alkyl group)

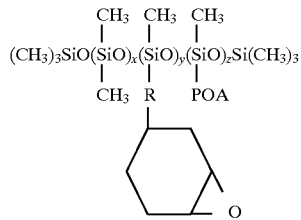

(wherein POA represents polyoxyalkylene and R represents an alkyl group)

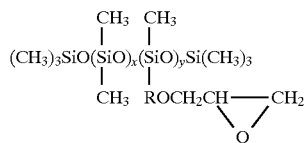

(wherein R represents an alkyl group)

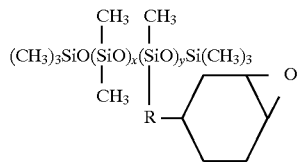

(wherein R represents an alkyl group)

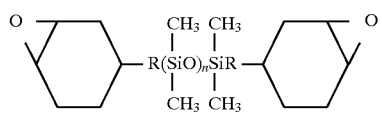

(wherein R represents an alkyl group)

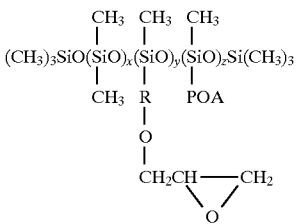

(wherein POA represents polyoxyalkylene and R represents an alkyl group).

It is possible to add an epoxy compound to the above-mentioned adhesive composition to increase its adhesive strength. For instance, epoxy compounds having at least two epoxy groups in a molecule such as bisphenol-A type epoxy resin, bisphenol-F type epoxy resin, novolac type epoxy resin, biphenyl type epoxy resin, naphthalene type epoxy resin, bisphenol type epoxy resin, and alicyclic epoxy resin can be used for that purpose.

Although the thickness of the adhesive composition applied to an adherend is determined by the thickness of a mask for screen printing and the amount of non-volatile components in the adhesive, it is preferable to set the thickness between about 10 to 150 $\mu$m, preferably about 20 to 80 $\mu$m, after the preliminary drying and between about 8 to 140 $\mu$m, preferably about 10 to 50 $\mu$m, after the compression and cross-linking since it affects the adhesive strength, electrical insulation property, and lowering of stress for adhering different materials.

[Third Embodiment]

An adhesive composition according to the third embodiment of the present invention consists essentially of a main component comprising reactive thermoplastic resin whose reactive functional group contains a carboxyl group or maleic anhydride, a cross-linking agent comprising epoxy resin having at least two epoxy groups and polyallylphenol. By this configuration, it is possible to increase both the adhesive strength and the moisture resistance. It is also possible to improve the wettability of the adhesive composition and decrease its thermal resistance by the addition of a tackifier.

Therefore, if the adhesive composition is used as a die-bond material, it is possible to transfer the heat generated by the semiconductor element 16 to the substrate 110 effectively since voids are not generated in the adhesive layer and an excellent adhesion between adhesive interfaces and the semiconductor element 16 and the substrate 110 is obtained.

Further, it is possible to maintain the adhesive strength even after various thermal and washing processes carried out during a mounting of the semiconductor device. Thus, it is possible to prevent a worsening of the semiconductor element 16 even when the semiconductor device is used under the conditions of high temperature and moisture.

It is possible to improve the wettability of the adhesive composition by adding polyallylphenol to the adhesive composition. This is due to a good hydrophobicity and wettability of polyallylphenol.

It is also possible to decrease the degree of weakening of a peel strength of the adhesive composition, after a moisture absorption, by adding polyallylphenol. This is because, by the addition of polyallylphenol, the reactive thermoplastic resin mainly reacts with the epoxy resin and then the epoxy resin mainly reacts with polyallylphenol so that the compounds are cross-linked in order of the reactive thermoplastic resin-epoxy resin-polyallylphenol-epoxy resin-reactive thermoplastic resin upon an addition of the cross-linking agent. For this reason, allyl groups are incorporated in a molecule of the adhesive composition and significantly improve the hydrophobicity thereof.

It is preferable to add 5 to 120 parts by weight of polyallylphenol to 100 parts by weight of the main component. As described in Japanese Laid-Open Patent Application No. 5-182515, the amount of epoxy resin added to an adhesive composition is preferably 10 to 50 parts by weight with respect to 100 parts by weight of the main component, and so it is preferable to add five to 120 parts by weight of polyallylphenol in order to obtain desirable effects. If less than five parts by weight of polyallylphenol is added, no effect is obtained and if more than 120 parts by weight is added, the adhesive strength is decreased due to an excess of non-cross-linked portions. It is most preferable to add five to 40 parts by weight of polyallylphenol.

Moreover, it is possible to increase the thermal conductivity of the adhesive composition by adding a tackifier. By the addition of the tackifier, wettability of the adhesive at interfaces upon thermocompression is also improved, and hence an effective transfer of the heat from the semiconductor element 16 to the substrate 110 may be performed using the adhesive composition according to the present invention as a die-bond material.

When the adhesive composition according to the present invention is employed as the die-bond material, it is necessary to use the pressure of 0.05 to 2 MPa during thermocompression of the semiconductor element 16 to the substrate 110 since there is a possibility of destroying the semiconductor element 16 if the pressure of more than 2 MPa is used. Thus, it is possible to obtain an excellent adhesive state in which the wetting at interfaces is made appropriate by adjusting the viscosity of the adhesive composition in the range of between 30 and 80 Pa·s upon thermocompression. If it is less than 30 Pa·s, the adhesive flows out during the thermocompression process and if it is more than 80 Pa·s, the adhesive becomes too hard, and in both cases the wetting state of adhesive composition at interfaces becomes insufficient.

Any reactive thermoplastic resins which are soluble in a solvent may be used as the main component according to the third embodiment of the present invention. Examples of such reactive thermoplastic resins include hydrogen-added styrene-ethylene-butadiene copolymer, hydrogen-added styrene-butadiene-styrene copolymer, hydrogen-added styrene-ethylene-(butylene)-styrene copolymer, maleates of hydrogen-added styrene-ethylene-butadiene copolymer, maleates of hydrogen-added styrene-ethylene-(butylene)-styrene copolymer, maleic anhydride graft polyethylene, carboxyl acid modified polyethylene, maleic anhydride graft polypropylene, maleic anhydride graft ethylene propylene rubber and so on.

Examples of epoxy resin, which is a cross-linking agent, include epoxy compounds having at least two epoxy groups in a molecule such as bisphenol-A type epoxy resin, bisphenol-F type epoxy resin, bisphenol-S type epoxy resin, novolac type epoxy resin, biphenyl type epoxy resin, naphthalene type epoxy resin, bisphenol type epoxy resin, alicyclic epoxy resin and so forth.

Examples of tackifier include rosin, dammar, rosin polymer, partially hydrogen-added rosin, glycerin ester rosin, fully hydrogen-added rosin, pentaerythritol-ester rosin, α-pinene polymer, β-pinene polymer, dipentene polymer, terpene phenol, α-pinene-phenol copolymer, olefin and polyolefin polymer, cyclopentadiene resin, aromatic petroleum resin, alkyl phenol, modified phenol, alkyl phenolacetylene resin, styrene resin, xylene resin, coumarone indene resin, vinyl toluene-α-methylstyrene copolymer and so on.

Although the thickness of the adhesive composition applied to an adherend is determined by the thickness of a mask for screen printing and the amount of non-volatile components contained in the adhesive composition, it is preferable to set the thickness between about 10 to 150 μm, preferably about 20 to 80 μm, after the preliminary drying and between about 8 to 140 μm, preferably about 10 to 50 μm, after the thermocompression and cross-linking since it affects the adhesive strength, electrical insulation property, and lowering of stress for adhering different materials.

[Fourth Embodiment]

An adhesive composition according to the fourth embodiment of the present invention consists essentially of a main component which is ethylene-propylene terpolymer having ethylidene norbornene or dicyclopentadiene as the third component and uses polyallylphenol as a cross-linking agent. By this configuration, it is possible to significantly improve the hydrophobicity and wettability of the adhesive composition.

As the amount of polyallylphenol added as a cross-linking agent is increased, the wettability of an adhesive composition may be improved. This is due to an excellent hydrophobicity and wettability of polyallylphenol.

Ethylene-propylene terpolymer is cross-linked with polyallylphenol by the reaction of a carbon-carbon double bond in the terpolymer molecule with the allyl group of the phenol. It is preferable that more allyl groups are present compared with the number of the carbon-carbon double bonds in a reaction mixture so that unreacted allyl groups having a hydrophobic property remain in a resulting compound.

It is preferable to add 5 to 120 parts by weight of polyallylphenol to 100 parts by weight of the main component. If it is less than five parts by weight, no effect is obtained and if it is more than 120 parts by weight, the adhesive strength is decreased due to an excess of non-cross-linked portions. Polyallylphenols described in, for example, the Japanese Laid-Open Patent Application No. 4-348121 may suitably be used.

As the amount of ethylidene norbornene or dicyclopentadiene is increased, the wettability of a resulting adhesive composition may be improved. In a case that an iodine value of the ethylidene norbornene or dicyclopentadiene is in the range of five to 40, in particular, an adhesive composition having an excellent adhesive strength and moisture resistance may be obtained. The reason that such properties of the adhesive composition are related to the iodine value is that if the value is less than five, solvent resistance is lowered due to insufficient cross-linking density and if it exceeds 40, thermal stress generated between adhered surfaces may not be relieved due to a high cross-linking density.

It is possible to increase the thermal conductivity of the adhesive composition by adding a tackifier. By the addition of the tackifier, wettability of the adhesive composition at interfaces during thermocompression is also improved, and hence an effective transfer of the heat from the semiconductor element 16 to the substrate 110 may be performed using the adhesive composition according to the present invention as a die-bond material.

Examples of the tackifier include rosin, dammar, rosin polymer, partially hydrogen-added rosin, glycerin ester rosin, fully hydrogen-added rosin, pentaerythritol-ester rosin, α-pinene polymer, β-pinene polymer, dipentene polymer, terpene phenol, α-pinene-phenol copolymer, olefin and polyolefin polymer, cyclopentadiene resin, aromatic petroleum resin, alkyl phenol, modified phenol, alkyl phenolacetylene resin, styrene resin, xylene resin, coumarone indene resin, vinyl toluene-α-methylstyrene copolymer and so on.

It is possible to add an epoxy compound to the above-mentioned adhesive composition if necessary. For instance, epoxy compounds having at least two epoxy groups in a molecule such as bisphenol-A type epoxy resin, bisphenol-F type epoxy resin, bisphenol-S type epoxy resin, novolac type epoxy resin, biphenyl type epoxy resin, naphthalene type epoxy resin, bisphenol type epoxy resin, alicyclic epoxy resin can be used for the purpose.

It is also possible to use a phenol type hardener (such as phenol novolac and cresol novolac), an amine type hardener (diamine group) and an acid anhydride as a sub cross-linking agent.

Moreover, peroxides (for instance dicumyl peroxide, etc.) may be added as a reactive catalyst for ethylene-propylene terpolymer and polyallylphenol.

Although the thickness of the adhesive composition applied is determined by the thickness of a mask for screen printing and the amount of non-volatile components in the adhesive composition, it is preferable to set the thickness between about 10 to 150 μm, preferably about 20 to 80 μm, after the preliminary drying and between about 8 to 140 μm, preferably about 10 to 50 μm, after the compression and curing since it affects the adhesive strength, electrical insulation property, and lowering of stress for adhering different materials.

[Fifth Embodiment]

An adhesive composition according to the fifth embodiment of the present invention consists essentially of a main component comprising reactive thermoplastic resin, a cross-linking agent comprising epoxy resin and a tackifier comprising styrene modified copolymer, β-pinene polymer and hydrogen-added rosin ester resin. By this configuration, it is possible to significantly improve the wettability of an adhesive at interfaces and its stress relaxation capacity.

Therefore, if the adhesive composition is used as a die-bond material, it is possible to transfer the heat generated by the semiconductor device 16 to the substrate 110 effectively since voids are not generated in the adhesive layer and an excellent adhesion between adhesive interfaces and the semiconductor element 16 and the substrate 110 is obtained.

Also, it is possible to relieve the stress generated between the semiconductor element 16 and the substrate 110 by the heat generated during the operation of the semiconductor element 16. If the adhesive composition is used for an adhesion of the substrate 110 with a heat-releasing board, it is possible to prevent damage to a soldered portion by absorbing the stress generated between the mounting board and the semiconductor device.

If the amount of styrene modified copolymer, β-pinene polymer or hydrogen-added rosin ester resin added as a tackifier is set between about five to 200 parts by weight with respect to 100 parts by weight of the main component, it is possible to significantly increase both the wettability at interfaces and the stress relaxation ability of a resulting adhesive composition. It is most preferable to add 20 to 200 parts by weight of tackifier to obtain a greater effect.

Any reactive thermoplastic resins which are soluble in a solvent may be used as the main component according to this embodiment of the present invention. Examples of such reactive thermoplastic resins include hydrogen-added styrene-ethylene-butadiene copolymer, hydrogen-added styrene-butadiene-styrene copolymer, hydrogen-added styrene-ethylene-(butylene)-styrene copolymer, maleic anhydride graft polyethylene, carboxyl acid modified polyethylene, maleic anhydride graft polypropylene, maleic anhydride graft ethylene propylene rubber and so on.

Examples of epoxy resin, which is a cross-linking agent, include epoxy compounds having at least two epoxy groups in a molecule such as bisphenol-A type epoxy resin, bisphenol-F type epoxy resin, bisphenol-S type epoxy resin, novolac type epoxy resin, biphenyl type epoxy resin, naphthalene type epoxy resin, bisphenol type epoxy resin, alicyclic epoxy resin, etc., and polyepoxy compounds obtained by oxidizing a compound having carbon-carbon double bonds such as epoxidated polybutadiene.

In the case that ethylene-propylene terpolymer having ethylidene norbornene or dicyclopentadiene as the third component is used as the main component, compounds such as polyallylphenol having functional groups which can be cross-linked with carbon-carbon double bond of the terpolymer may be employed as the cross-linking agent.

Examples of the styrene modified copolymer which can be added as a tackifier include ones which may be produced by styrene-modifying compounds having the following general formula:

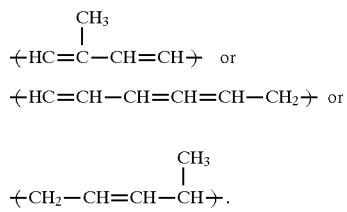

In addition, it is possible to obtain a better effect by adjusting the percentage of styrene modification in the range of about five to 50%. It is most preferable to adjust the percentage of styrene modification in the range of 10 to 30%.

Examples of β-pinene polymer include terpene polymer having the following general formula:

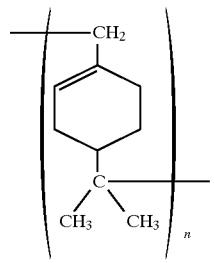

Examples of hydrogen-added rosin ester resin include compounds having the following general formula:

```
CH₂—O—R
|
CH—O—R
|
CH₂—O—R
``` wherein R represents

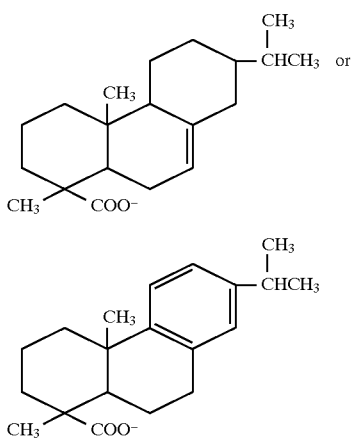

In the above-mentioned resin, it is preferable that the ratio of the compound expressed by the formula:

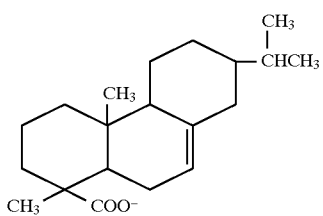

and the compound expressed by the formula:

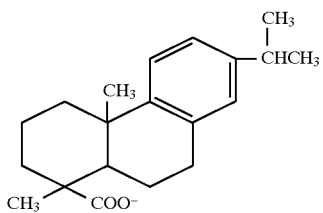

is between 90:10 and 60:40.

Although the thickness of the adhesive composition applied is determined by the thickness of a mask for screen printing and the amount of non-volatile components in the adhesive, it is preferable to set the thickness between about 20 to 150 μm after the preliminary drying and between about 10 to 145 μm after the compression and curing since it affects the adhesive strength, electrical insulation property, and lowering of stress for adhering different materials.

[Sixth Embodiment]

An adhesive composition according to the sixth embodiment of the present invention consists essentially of a main component comprising reactive thermoplastic resin, and a cross-linking agent comprising biphenyl type epoxy resin or epoxidated polybutadiene rubber. By this configuration, it is possible to improve the adhesive strength, solvent resistance, workability, etc., of a resulting adhesive composition.

If a semiconductor device is constructed using this adhesive composition, it is possible to maintain the adhesive strength even after various thermal and washing processes carried out during a mounting of the semiconductor device. Also, it is possible to prevent a deterioration of the semiconductor element even when the semiconductor device is used under high temperature and moisture. Moreover, the stress generated between the semiconductor device and the mounting board may be decreased.

In this adhesive composition it is possible to obtain an excellent effect by adding about five to 400 parts by weight of biphenyl type epoxy resin or epoxidated polybutadiene rubber with respect to 100 parts by weight of the main component. The reason for this is that if it is more than 400 parts by weight, some of the resulting adhesive composition is lost during a thermocompression process and the adhesive layer becomes thin, and if it is less than five parts by weight, the adhesive strength cannot be maintained after the various thermal and washing processes to which the semiconductor device is exposed when mounted due to a low cross-linking density. It is most preferable that the amount to be added is in the range of 20 to 200 parts by weight.

When a biphenyl type epoxy resin is dissolved with a thermoplastic resin, it is possible to obtain an adhesive composition having excellent workability since a crystallization of the adhesive composition during a preservation period (normally at about −35° C. to 5° C.) can be prevented.

Any reactive thermoplastic resins which are soluble in a solvent may be used as the main component according to this embodiment of the present invention. Examples of such reactive thermoplastic resins include hydrogen-added styrene-ethylene-butadiene copolymer, hydrogen-added styrene-butadiene-styrene copolymer, hydrogen-added styrene-ethylene-(butylene)-styrene copolymer, maleic anhydride graft polyethylene, carboxyl acid modified polyethylene, maleic anhydride graft polypropylene, maleic anhydride graft ethylene propylene rubber and so on.

Although the thickness of the adhesive composition applied is determined by the thickness of a mask for screen printing and the amount of non-volatile components in the adhesive, it is preferable to set the thickness between about 20 to 150 μm after the preliminary drying and between about 10 to 145 μm after the compression and curing since it affects the adhesive strength, electrical insulation property, and lowering of stress for adhering different materials.

[Seventh Embodiment]

An adhesive composition according to the seventh embodiment of the present invention consists essentially of a main component comprising reactive thermoplastic resin, a cross-linking agent and a silicone resin having inflammability. Tackifiers may be added if necessary. By this configuration, it is possible, even when adherends are stored in a precoated state, to preserve the adhesive composition in a state of maintaining its inflammability.

The reason that the inflammability of an adhesive composition can be thus improved by the addition of a silicone resin is that the silicon resin is reacted with oxygen in the air upon combustion and produces an oxidized silicone membrane which in turn improves a drip prevention property of the adhesive composition. Due to the drip prevention property obtained by the addition of silicone resin, the inflammability of the adhesive composition is obtained.

If a silicone resin whose melting point is about 70° C. to 80° C. is used, it is possible to disperse resin components homogeneously in the mixture by Eheating. Thus, a property of effective inflammability can be easily added to the adhesive composition. Examples of such silicone include FRX-01 produced by Shinetsu Silicone Co.

The main component of such silicone resin may be expressed by:

and Si atoms are bonded with each other. In such a silicone resin molecule, an oxygen atom is three-dimensionally cross-linked (gelation) upon combustion and increases a hardness of the resin, and hence the drip of adhesive composition is prevented. In this way, the drip prevention property and the inflammability may be obtained.

The amount of silicone resin is preferably in the range of about five to 200 parts by weight with respect to 100 parts by weight of the main component. This is because if it is less than five parts by weight, no effect can be obtained, and if it exceeds 200 parts by weight, the adhesive strength is lowered.

In addition, by using aluminium nitride whose surface is covered with oxidized silicone molecules as a filler, it is possible to prevent the adsorption of the filler by styrene-ethylene/butylene-styrene copolymer, which is used as the main component, and improve the thermal conductivity of a resulting adhesive composition. Also, it is possible to prevent hydrolysis of aluminium nitride caused by the absorption of moisture since its surface is oxidized.

Since the filler, which is comprised of aluminium nitride, is not hydrolyzed, a false operation of the semiconductor element 16 may be prevented.

Moreover, by producing a semiconductor device using the above-mentioned adhesive compositions, it is possible to obtain a semiconductor device having an excellent heat-releasing property, inflammability and high reliability.

Further, any reactive thermoplastic resins which are soluble in a solvent may be used as the main component according to this embodiment of the present invention. Examples of such reactive thermoplastic resins include styrene-butadiene-styrene copolymer, hydrogen-added styrene-polyisoprene-styrene copolymer, maleic anhydride graft polyethylene, carboxyl acid modified polyethylene, maleic anhydride graft polypropylene, maleic anhydride graft ethylene propylene rubber and so on.

Examples of the tackifier include synthesized C5 resin, hydrogen-added hydrocarbon resin, polyterpene resin, polyterpene phenol resin, rosin ester resin, alkylallyl resin, α-methylstyrene resin, coumarone indene resin, alkylaromatic polyindene resin and so forth.

Examples of epoxy resin, which is a cross-linking agent, include epoxy compounds having at least two epoxy groups in a molecule such as bisphenol-A type epoxy resin, bisphenol-F type epoxy resin, bisphenol-S type epoxy resin, novolac type epoxy resin, biphenyl type epoxy resin, naphthalene type epoxy resin, bisphenol type epoxy resin, alicyclic epoxy resin, etc., and polyepoxy compounds obtained by oxidizing a compound having carbon-carbon double bonds such as epoxidated polybutadiene.

In the case that ethylene-propylene terpolymer having ethylidene norbornene or dicyclopentadiene as the third component is used as the main component, compounds such as polyallylphenol having functional groups which can be cross-linked with carbon-carbon double bonds of the terpolymer may be employed as the cross-linking agent.

Although the thickness of the adhesive composition applied is determined by the thickness of a mask for screen printing and the amount of non-volatile components in the adhesive, it is preferable to set the thickness between about 20 to 150 μm after the preliminary drying and between about 10 to 145 μm after the compression and curing since it affects the adhesive strength, electrical insulation property, and lowering of stress for adhering different materials.

[Eighth Embodiment]

An adhesive composition according to the eighth embodiment of the present invention consists essentially of a main component comprising a reactive thermoplastic resin, a cross-linking agent, a tackifier, a solvent for dissolving the main component, and a filler wherein the shape of the filler is spherical or substantially spherical and the adhesive composition is applied to an adherend and dried in order to evaporate the solvent before a thermocompression process.

The term "substantially spherical" as used herein means that the particles of filler are as spherical as possible to be obtained by standard techniques known to one of the ordinary skill in the art to which this invention pertains.

Any reactive thermoplastic resins which are soluble in a solvent may be used as the main component according to this embodiment of the present invention. Examples of such reactive thermoplastic resins include styrene-ethylene/butylene-styrene copolymer, styrene-butadiene-styrene copolymer and styrene-polyisoprene-styrene copolymer having functional groups such as a carboxyl group and hydrogen-added compounds of the above-mentioned copolymers, maleic anhydride graft polyethylene, carboxyl acid modified polyethylene, maleic anhydride graft polypropylene, maleic anhydride graft ethylene propylene rubber and so on.

Examples of filler materials include insulating inorganic materials such as fused silica, alumina and aluminium nitride, and metallic powders made of silver, copper, aluminium, etc. In any case, the filler must have a spherical shape in order to increase the flow of the adhesive composition during the thermocompression process, the contact of the adhesive to the adherend at an interface and the thermal conductivity of the adhesive composition.

The number average particle size, D50, of filler added to the adhesive composition is between 3 and 30 μm, and does not contain particles whose size is less than 1 μm or has the 5% particle size, D5, of at least 1 μm. Since it does not contain particles of less than 1 μm, the flow of adhesive composition at the time of thermocompression is significantly increased. Also, it is preferable that an 80% particle size of the filler, D80, is equal to or less than (D50+D50×2). This is because if it is larger than that value, the concavoconvex depth of a surface of the filler becomes large and space will be generated at an interface.

Also, the amount of filler added is preferably between 5 to 50 vol %. If the amount is less than 5 vol %, the thermal conductivity of the resulting adhesive composition is decreased and if it is more than 5 vol %, the wettability of the adhesive composition is decreased and a parting at an interface is caused. It is particularly desirable that the amount of the filler in an adhesive composition after the preliminary drying is in the range of 20 to 50 vol % from the point of view of adjusting the viscosity of the adhesive composition upon compression in the range of 30 to 80 Pa·s.

Examples of the tackifier include synthesized C5 resin, hydrogen-added hydrocarbon resin, polyterpene resin, polyterpene phenol resin, rosin ester resin, alkylallyl resin, α-methylstyrene resin, coumarone indene resin, alkylaromatic polyindene resin and so forth.

Examples of an epoxy type resin which is the cross-linking agent, include epoxy compounds having at least two epoxy groups in a molecule such as bisphenol-A type epoxy resin, bisphenol-F type epoxy resin, bisphenol-S type epoxy resin, novolac type epoxy resin, silicon modified epoxy resin, biphenyl type epoxy resin, naphthalene type epoxy resin, bisphenol type epoxy resin, alicyclic epoxy resin, etc., and polyepoxy compounds obtained by oxidizing a compound having carbon-carbon double bonds such as epoxidated polybutadiene.

It is also possible to use a phenol type hardener (such as phenol novolac and cresol novolac), an amine type hardener (diamine group) and an acid anhydride as a sub cross-linking agent.

Moreover, if an adhesive sheet is produced using any one of the above-mentioned adhesive compositions, it is possible to obtain almost the same effect as in the case of adhesion by the precoating method. Such an adhesive sheet can be produced, for example, by applying an adhesive varnish to a fluorinated parting sheet (for example, Tedolar by DuPont Co.) using screen or stencil and evaporating solvents by a preliminary drying. When used, the adhesive sheet is transferred onto an adherend and the parting sheet is peeled off. Then it is thermocompressed with another adherend.

It is preferable to adjust the viscosity of the adhesive composition for use in a precoating method using diluents in which reactive thermoplastic resins and other components may be dissolved. Examples of such diluents include solvents such as toluene, xylene, turpentine oil, tetralin and so on.

Also, a cross-linking catalyst/cure accelerator may be added if necessary. Examples of such a cross-linking catalyst/cure accelerator include triphenylphosphine, imidazole and imidazole adducts disclosed in the Japanese Laid-Open Patent Application No. 5-182515.

Although the thickness of the adhesive composition applied is determined by the thickness of a mask for screen printing and the amount of non-volatile components in the adhesive, it is preferable to set the thickness between about 20 to 150 $\mu$m after the preliminary drying and between about 10 to 145 $\mu$m after the compression and curing since it affects the adhesive strength, electrical insulation property, and lowering of stress for adhering different materials.

[Ninth Embodiment]

An adhesive composition according to the ninth embodiment of the present invention includes, other than the above-mentioned components, a filler which is coupling-processed in advance.

According to the above adhesive composition, since the surface of the filler is coupling-processed in advance, it is possible to attach functional groups which react with the resin component, on the surface of the filler. Therefore, chemical bonds are produced between the filler and the resin at the same time as curing of the adhesive composition and a cohesive strength of the adhesive composition on the entire bulk is increased after the curing of the adhesive composition. As a result, the generation of the micro-cracks at the time of the curing of the adhesive composition may be prevented. Also, since no micro-cracks are present in the LSI package, water cannot get inside the package. Thus, a package with high reliability may be obtained.

Examples of the coupling agents include a glysidyl type silane coupling agent such as τ-glycidoxypropyl trimethoxysilane and τ-glycidoxypropyl triethoxysilane, amine type silane coupling agent and a titanium type coupling agent. It is preferable to use the glysidyl type silane coupling agent from the point of view of a stable preservability of an adhesive composition.

Examples of filler materials include insulating fillers made of fused silica (spherical, powder), crystalline silica, alumina, boron nitride, aluminum nitride, magnesium oxide, diamond powder, silicon carbide, etc., and conductive powders made of silver, gold, copper, aluminum, etc. Particularly, when glysidyl type silane is used as the coupling agent, the effect of the present invention becomes obvious for the fused silica and crystalline silica. In addition, it is preferable that a mixing ratio (by weight) of filler vs coupling agent during the coupling process be between about 100:0.3 to 100:10.

Any reactive thermoplastic resins which are soluble in a solvent may be used as the main component according to this embodiment of the present invention. Examples of such reactive thermoplastic resins include styrene-ethylene/butylene-styrene copolymer, styrene-butadiene-styrene copolymer and styrene-polyisoprene-styrene copolymer having functional groups such as a carboxyl group and hydrogen-added compounds of the above-mentioned copolymers, maleic anhydride graft polyethylene, carboxyl acid modified polyethylene, maleic anhydride graft polypropylene, maleic anhydride graft ethylene propylene rubber and so on.

Examples of the tackifier include synthesized C5 resin, hydrogen-added hydrocarbon resin, polyterpene resin, polyterpene phenol resin, rosin ester resin, alkylallyl resin, α-methylstyrene resin, coumarone indene resin, alkylaromatic polyindene resin and so forth.

Examples of an epoxy type resin which is the cross-linking agent, include epoxy compounds having at least two epoxy groups in a molecule such as bisphenol-A type epoxy resin, bisphenol-F type epoxy resin, bisphenol-S type epoxy resin, novolac type epoxy resin, silicon modified epoxy resin, biphenyl type epoxy resin, naphthalene type epoxy resin, bisphenol type epoxy resin, alicyclic epoxy resin, etc., and polyepoxy compounds obtained by oxidizing a compound having carbon-carbon double bonds such as epoxidated polybutadiene.

It is also possible to use a phenol type hardener (such as phenol novolac and cresol novolac), an amine type hardener (diamine group) and acid anhydride as a sub-cross-linking agent.

[Tenth Embodiment]

An adhesive composition according to the tenth embodiment of the present invention is comprised of a thermoplastic resin having carboxyl groups as a main component, epoxy resin having at least two epoxy groups and a solvent, wherein an organophosphorus compound covered with a thermoplastic resin is included as a catalyst.

A cross-linking reaction is carried out by a reaction of the carboxyl groups of the thermoplastic resin with the epoxy groups of the epoxy resin added as a cross-linking agent in the presence of the above-mentioned catalyst. A heat resistance property of the thermoplastic resin is improved by the reaction. Thus, a reliability of the adhesive composition under a high-temperature condition may be improved compared with a conventional adhesive composition which is not cross-linked.

Any thermoplastic resin having carboxyl groups, which are soluble in a solvent, may be used as a main component of the adhesive composition according to the tenth embodiment of the present invention. Examples of such a thermoplastic resin include maleic acid modified styrene-polybutadiene-styrene copolymer, maleic acid modified styrene-polyisoprene-styrene copolymer, modified styrene-ethylene-(butylene)-styrene copolymer, maleic anhydride graft polypropylene, carboxyl acid modified polyethylene, maleic anhydride graft ethylene propylene rubber and so on.

Examples of the epoxy resin, which is a cross-linking agent, having at least two epoxy groups in a molecule include bisphenol-A type epoxy resin, bisphenol-F type epoxy resin, bisphenol-S type epoxy resin, novolac type epoxy resin, biphenyl type epoxy resin, naphthalene type epoxy resin, bisphenol type epoxy resin, alicyclic epoxy resin and polyepoxy compounds, which can be obtained by an oxidation of compounds having a carbon-carbon double bond, such as epoxidated polybutadiene.

The organophosphorus compound which may be used in the embodiment preferably has aryl groups in order to exert a high catalytic activity. Examples of such organophosphorus compounds include phosphines such as triphenylphosphine, triorthotolylphosphine, trimethatolylphosphine, triparatolylphosphine, tris-4-methoxyphenylphosphine and so on. The organophosphorus compound may be used singly or may be used in combination with other organophosphorus compounds. When more than one organophosphorus compounds are used, a desirable organophosphorus compound mixture can be prepared considering properties such as melting point and catalytic activity of each compound employed. The amount of the organophosphorus compound covered with thermoplastic resin is preferably in the range of 0.1 to 10 parts by weight with respect to 100 parts by weight of the thermoplastic resin used as a main component. It is more preferable to use 0.2 to 5 parts by weight of the organophosphorus compound with respect to 100 parts by weight of the thermoplastic resin used as the main component in order to obtain a sufficient rate of the cross-linking reaction without leaving a large quantity of the organophosphorus compound not involved with the cross-linking reaction in an adhesive layer.

As for the method for covering the organophosphorus compound with thermoplastic resin, conventional methods such as disclosed in the Japanese Laid-Open Patent Application No. 5-182515 may be utilized. Hot-melt resin whose softening temperature is in the range of about 80° C. to 120° C., which is higher than the drying temperature used in the precoating procedure, may be used for covering the organophosphorus compound.

The solvent which may be used in the embodiment is selected from a single solvent or a mixture solvent which is capable of dissolving the thermoplastic resin having carboxyl groups in a molecule and the epoxy resin but does not dissolve the thermoplastic resin covering the organophosphorus compound. Examples of such a solvent include toluene, xylene, turpentine oil, tetralin and so on. The solvent is used for diluting a mixture comprising thermoplastic resin having carboxyl groups in a molecule, epoxy resin and organophosphorus compounds covered by thermoplastic resin in order to prepare an adhesive compound having viscosity suitable for a precoating procedure.

Also, as mentioned above, a filler may be added to the adhesive composition of this embodiment. The amount of filler added is preferably between 5 to 50 vol %. If the amount is less than 5 vol %, the thermal conductivity of the resulting adhesive composition is decreased and if it is more than 50 vol %, the wettability of the adhesive composition is decreased and a parting at the interface is caused. It is particularly desirable that the amount of the filler in the adhesive composition after the preliminary drying be in the range of 20 to 50 vol % from the point of view of adjusting the viscosity of the adhesive composition to be suitable for actual uses. The filler preferably has a spherical shape in order to increase the flow of the adhesive composition during the thermocompression process, the contact of the adhesive composition to the adherend at the interface and the thermal conductivity of the adhesive composition.

Examples of filler materials include insulating powder materials such as silica, alumina, graphite, SiC and magnesium oxide, and metallic conductive powders made of gold, silver, copper, aluminum, etc. It is possible that the surface of the filler is coupling-processed in advance in order to attach functional groups which react with the resin component, on the surface of the filler.

Examples of the coupling agents include a glysidyl type silane coupling agent such as τ-glycidoxypropyl trimethoxysilane and τ-glycidoxypropyl triethoxysilane, an amine type silane coupling agent and a titanium type coupling agent. It is preferable to use the glysidyl type silane coupling agent from the point of view of a stable preservability of the adhesive composition.

Moreover, it is also possible to use a phenol type hardener (such as phenol novolac and cresol novolac), an amine type hardener (diamine group) and acid anhydride as a sub-cross-linking agent.

Further, it is possible to add a tackifier to the adhesive composition of this embodiment in order to increase a wettability of the adhesive composition. Examples of the tackifier include C5 resins, hydrogen-added hydrocarbon resin, polyterpene resin, polyterpene phenol resin, hydrogen-added rosin ester resin, alkylaromatic polyindene resin and so forth.

[Eleventh Embodiment]

An adhesive composition according to the eleventh embodiment of the present invention is comprised of a thermoplastic resin having carboxyl groups as a main component, epoxy resin having at least two epoxy groups and a solvent, wherein a quaternary salt of an organophosphorus compound having aryl group is included as a catalyst.

A cross-linking reaction is carried out by a reaction of the carboxyl groups of the thermoplastic resin with the epoxy groups of the epoxy resin added as a cross-linking agent in the presence of the above-mentioned catalyst. A heat resistance property of the thermoplastic resin is improved by the reaction. Thus, a reliability of the adhesive composition under a high-temperature condition may be improved compared with a conventional adhesive composition which is not cross-linked.

Any thermoplastic resin having carboxyl groups, which are soluble in a solvent, may be used as a main component of the adhesive composition according to the eleventh embodiment of the present invention. Examples of such a thermoplastic resin include maleic acid modified styrene-polybutadiene-styrene copolymer, maleic acid modified styrene-polyisoprene-styrene copolymer, modified styrene-ethylene-(butylene)-styrene copolymer, maleic anhydride graft polypropylene, carboxyl acid modified polyethylene, maleic anhydride graft ethylene propylene rubber and so on.

Examples of the epoxy resin, which is a cross-linking agent, having at least two epoxy groups in a molecule include bisphenol-A type epoxy resin, bisphenol-F type epoxy resin, bisphenol-S type epoxy resin, novolac type epoxy resin, biphenyl type epoxy resin, naphthalene type epoxy resin, bisphenol type epoxy resin, alicyclic epoxy resin and polyepoxy compounds, which can be obtained by an oxidation of compounds having a carbon-carbon double bond, such as epoxidated polybutadiene.

The quaternary salt of organophosphorus compound having the aryl groups which may be used in the embodiment is selected from a group comprising ones which exerts their catalytic action in the temperature range of about 120° C. to 200° C., which is the temperature range used in a thermocompression process, and do not exert their catalytic action in the temperature range of about 40° C. to 80° C., which is the temperature range used in a drying process of the precoating procedure. Examples of such a quaternary salt of an organophosphorus compound having aryl groups include a quaternary salt of triphenylphosphine, a quaternary salt of triorthotolylphosphine, a quaternary salt of trimethatolylphosphine, a quaternary salt of triparatolylphosphine, a quaternary salt of tris-4-methoxyphenylphosphine and so on.

Particular examples of the quaternary salt of the organophosphorus compound having the aryl groups which can be easily obtained include (1,3-dioxane-2-ylethyl)triphenyl-phosphonium bromide expressed by the following formula:

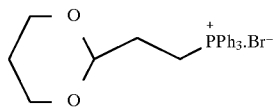

(wherein Ph represents a phenyl group),
(1,3-dioxane-2-ylethyl)triphenyl-phosphonium chloride expressed by the following formula:

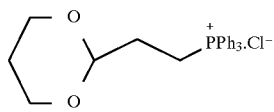

(wherein Ph represents a phenyl group),
(1-one-ethylene ketal-2-ylethyl)triphenyl-phosphonium bromide expressed by the following formula:

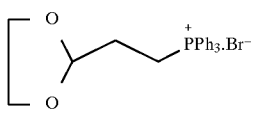

(wherein Ph represents a phenyl group),
(1-one-ethylene ketal-2-ylethyl)triphenyl-phosphonium chloride expressed by the following formula:

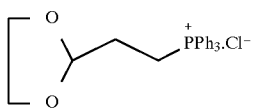

(wherein Ph represents a phenyl group), and
triphenylphosphine·triphenylborane expressed by the following formula:

(wherein Ph represents a phenyl group).

The quaternary salt of the organophosphorus compound having the aryl groups may be used singly or in combination with other such compounds. When more than one quaternary salt of an organophosphorus compound having aryl groups are used, a desirable organophosphorus compound mixture can be prepared in consideration with properties of each compound employed such as melting point and catalyst activity. The amount of the quaternary salt of the organophosphorus compound having the aryl group added is preferably in the range of 0.1 to 10 parts by weight with respect to 100 parts by weight of the thermoplastic resin used as a main component. It is more preferable to use 0.2 to 5 parts by weight of the quaternary salt of the organophosphorus compound having the aryl groups with respect to 100 parts by weight of the thermoplastic resin used as a main component in order to obtain a sufficient rate of the cross-linking reaction without leaving a large quantity of the organophosphorus compound not involved with the cross-linking reaction in an adhesive layer.

The solvent which may be used in the embodiment is selected from a single solvent or a mixture solvent which is capable of dissolving the thermoplastic resin having carboxyl groups in a molecule and the epoxy resin but does not dissolve the quaternary salt of the organophosphorus compound having the aryl groups. Examples of such a solvent include toluene, xylene, turpentine oil, tetralin and so on. The solvent is used for diluting a mixture comprising thermoplastic resin having carboxyl groups in a molecule, epoxy resin and a quaternary salt of organophosphorus compound having aryl groups in order to prepare an adhesive compound having a viscosity suitable for a precoating procedure.

Also, as mentioned above, a filler may be added to the adhesive composition of this embodiment. The amount of filler added is preferably between 5 to 50 vol %. If the amount is less than 5 vol %, the thermal conductivity of the resulting adhesive composition is decreased and if it is more than 50 vol %, the wettability of the adhesive composition is decreased and a parting at the interface is caused. It is particularly desirable that the amount of the filler in the adhesive composition after the preliminary drying be in the range of 20 to 50 vol % from the point of view of adjusting the viscosity of the adhesive composition to be suitable for actual uses. The filler preferably has a spherical shape in order to increase the flow of the adhesive composition during the thermocompression process, the contact of the adhesive composition to the adherend at the interface and the thermal conductivity of the adhesive composition.

Examples of filler materials include insulating powder materials such as silica, alumina, graphite, SiC and magnesium oxide, and metallic conductive powders made of gold, silver, copper, aluminum, etc. It is possible that the surface of the filler is coupling-processed in advance in order to attach functional groups which react with the resin component, on the surface of the filler.

Examples of the coupling agents include a glysidyl type silane coupling agent such as τ-glycidoxypropyl trimethoxysilane and τ-glycidoxypropyl triethoxysilane, an amine type silane coupling agent and a titanium type coupling agent. It is preferable to use the glysidyl type silane coupling agent from the point of view of a stable preservability of the adhesive composition.

Moreover, it is also possible to use a phenol type hardener (such as phenol novolac and cresol novolac), an amine type hardener (diamine group) and acid anhydride as a sub-cross-linking agent.

Further, it is possible to add a tackifier to the adhesive composition of this embodiment in order to increase a wettability of the adhesive composition. Examples of the tackifier include C5 resins, hydrogen-added hydrocarbon resin, polyterpene resin, polyterpene phenol resin, hydrogen-added rosin ester resin, alkylaromatic polyindene resin and so forth.

[Twelfth Embodiment]

An adhesive composition according to the twelfth embodiment of the present invention is comprised of a thermoplastic resin having carboxyl groups as a main component, epoxy resin having at least two epoxy groups and a solvent, wherein an organophosphorus compound having a melting point in the range of 100° C. to 200° C. is included as a catalyst.

A cross-linking reaction is carried out by a reaction of the carboxyl groups of the thermoplastic resin with the epoxy groups of the epoxy resin added as a cross-linking agent in the presence of the above-mentioned catalyst. A heat resistance property of the thermoplastic resin is improved by the reaction. Thus, a reliability of the adhesive composition under a high-temperature condition may be improved compared with a conventional adhesive composition which is not cross-linked.

Any thermoplastic resin having carboxyl groups, which are soluble in a solvent, may be used as a main component of the adhesive composition according to the eleventh embodiment of the present invention. Examples of such a thermoplastic resin include maleic acid modified styrene-polybutadiene-styrene copolymer, maleic acid modified styrene-polyisoprene-styrene copolymer, modified styrene-ethylene-(butylene)-styrene copolymer, maleic anhydride graft polypropylene, carboxyl acid modified polyethylene, maleic anhydride graft ethylene propylene rubber and so on.

Examples of the epoxy resin, which is a cross-linking agent, having at least two epoxy groups in a molecule include bisphenol-A type epoxy resin, bisphenol-F type epoxy resin, bisphenol-S type epoxy resin, novolac type epoxy resin, biphenyl type epoxy resin, naphthalene type epoxy resin, bisphenol type epoxy resin, alicyclic epoxy resin and polyepoxy compounds, which can be obtained by an oxidation of compounds having a carbon-carbon double bond, such as epoxidated polybutadiene.

The organophosphorus compound having the melting point in the range of 100° C. to 200° C. may preferably be one having aryl groups which has a high catalytic action. Examples of such organophosphorus compounds which can be relatively easily obtained include triorthotolylphosphine, trimethatolylphosphine, triparatolylphosphine, tris-4-methoxyphenylphosphine and so on.

The organophosphorus compound having the melting point in the range of 100° C. to 200° C. may be used singly or in combination with other such compounds. When more than one organophosphorus compound having a melting point of 100° C. to 200° C. are used, a desirable organophosphorus compound mixture can be prepared in consideration with properties of each compound employed such as melting point and catalytic activity. The amount of the organophosphorus compound having the melting point in the range of 100° C. to 200° C. added is preferably in the range of 0.1 to 10 parts by weight with respect to 100 parts by weight of the thermoplastic resin used as a main component. It is more preferable to use 0.2 to 5 parts by weight of the quaternary salt of the organophosphorus compound having the aryl groups with respect to 100 parts by weight of the thermoplastic resin used as a main component in order to obtain a sufficient rate of the cross-linking reaction without leaving a quantity of the organophosphorus compound not involved with the cross-linking reaction in an adhesive layer.

The solvent which may be used in the embodiment is selected from a single solvent or a mixture solvent which is capable of dissolving the thermoplastic resin having carboxyl groups in a molecule and the epoxy resin but does not dissolve the organophosphorus compound having the melting point in the range of 100° C. to 200° C. Examples of such a solvent include toluene, xylene, turpentine oil, tetralin and so on. The solvent is used for diluting a mixture comprising thermoplastic resin having carboxyl groups in a molecule, epoxy resin and an organophosphorus compound having a melting point in the range of 100° C. to 200° C. in order to prepare an adhesive compound having a viscosity suitable for a precoating procedure.

Also, as mentioned above, a filler may be added to the adhesive composition of this embodiment. The amount of filler added is preferably between 5 to 50 vol %. If the amount is less than 5 vol %, the thermal conductivity of the resulting adhesive composition is decreased and if it is more than 50 vol %, the wettability of the adhesive composition is decreased and a parting at the interface is caused. It is particularly desirable that the amount of the filler in the adhesive composition after the preliminary drying be in the range of 20 to 50 vol % from the point of view of adjusting the viscosity of the adhesive composition suitable for actual uses. The filler preferably has a spherical shape in order to increase the flow of the adhesive composition during the thermocompression process, the contact of the adhesive to the adherend at the interface and the thermal conductivity of the adhesive composition.

Examples of filler materials include insulating powder materials such as silica, alumina, graphite, SiC and magnesium oxide, and metallic conductive powders made of gold, silver, copper, aluminum, etc. It is possible that the surface of the filler is coupling-processed in advance in order to attach functional groups which react with the resin component, on the surface of the filler.

Examples of the coupling agents include glysidyl type silane coupling agent such as τ-glycidoxypropyl trimethoxysilane and τ-glycidoxypropyl triethoxysilane, an amine type silane coupling agent and a titanium type coupling agent. It is preferable to use the glysidyl type silane coupling agent from the point of view of a stable preservability of the adhesive composition.

Moreover, it is also possible to use phenol type hardener (such as phenol novolac and cresol novolac), an amine type hardener (diamine group) and acid anhydride as a sub cross-linking agent.

Further, it is possible to add a tackifier to the adhesive composition of this embodiment in order to increase a wettability of the adhesive composition. Examples of the tackifier include C5 resins, hydrogen-added hydrocarbon resin, polyterpene resin, polyterpene phenol resin, hydrogen-added rosin ester resin, alkylaromatic polyindene resin and so forth.

[Thirteenth Embodiment]

Figure 3:
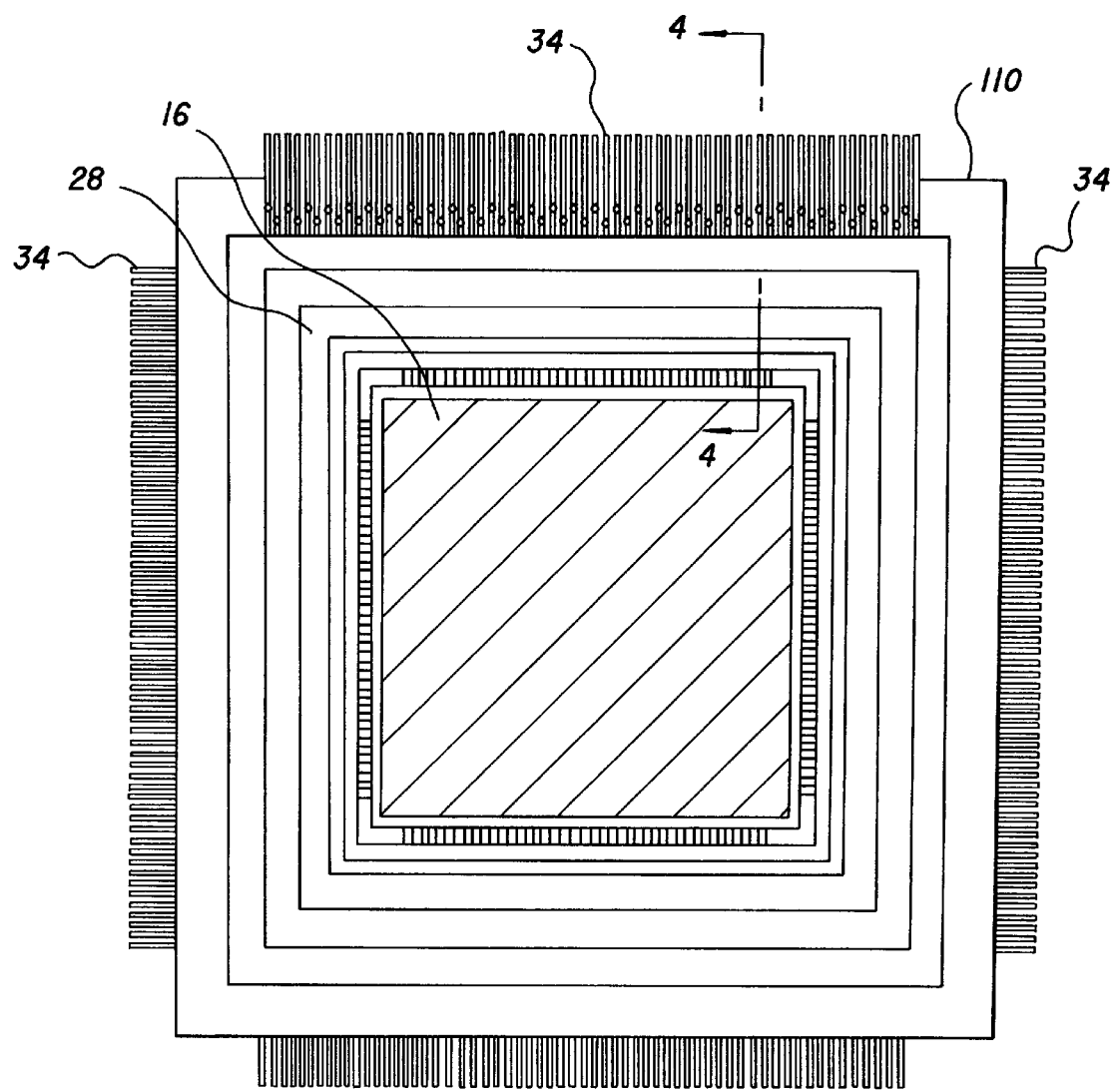
FIG. 3 is a structural diagram of a semiconductor device for explaining the present invention.
Figure 4:
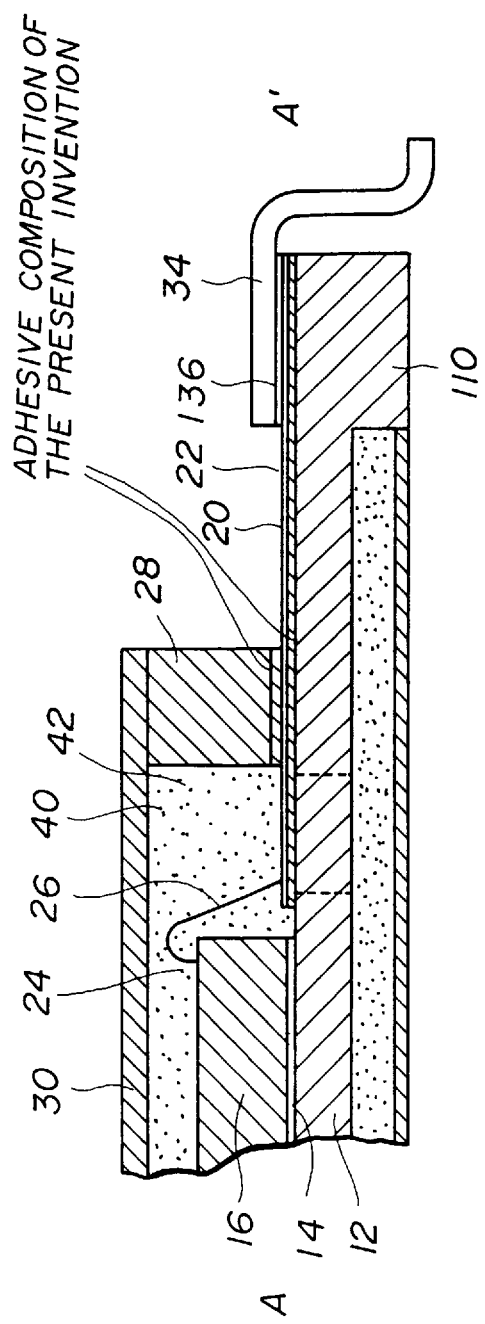
FIG. 4 is a cross-sectional view of a semiconductor device for explaining the present invention.

FIGS. 3 and 4 show structures of a semiconductor device according to the present invention. FIG. 4 is a cross-sectional view taken along a line A—A in FIG. 3.

Semiconductor element 16 is fixed, by a die-bond layer 14, on a die pad 12 of a substrate 110 comprising a material having an excellent thermal conductivity (can be an adhesive composition according to the present invention). Further, a multilayer wiring board 22 comprising insulating layers (can also be formed by an adhesive composition according to the present invention) and a wiring layer 20 are formed on the substrate 110. The wiring layer 20 and the semiconductor element 16 are electrically connected via an electrode pad 24 on the semiconductor element 16 and a wire 26 connected to the wiring layer 20. An outer lead 34, which functions as a terminal for outer connection to connect a semiconductor device and a connecting terminal formed on a mounting board (not shown), is provided on an outside of the end portion of the multilayer wiring board 22. The outer lead 34 is electrically connected to the wiring layer 20 using an electroconductive adhesive compound 136 according to the present invention.

A frame body 28 is provided on a predetermined position of the substrate 110 so as to surround the semiconductor element 16. Further, an upper lid member 30 is provided on an upper portion of the frame body 28. Both the frame body 28 and the upper lid member 30 are formed of metallic materials having excellent thermal conductivity and bonded by an adhesive composition or sheet according to the present invention.

When any one of the above-mentioned adhesive compositions is used as an adhesive for adhering the substrate with the wiring layer and with the frame body, a semiconductor device having excellent heat releasing capacity, moisture resistance and high reliability can be constructed.

[Fourteenth Embodiment]

FIGS. 5A to 5D show steps of constructing the semiconductor device according to the present invention. As shown in FIG. 5A, the adhesive composition of the present invention is applied onto a substrate 110 and the composition is preliminary dried. Then, the surface of the substrate 110 of the side to which the adhesive composition has been applied is thermally compressed to the wiring layer 20 as shown in FIG. 5B, and a thermal process is carried out to cross-link the adhesive composition. Then, second adhesive composition is applied to the wiring layer 20 as shown in FIG. 5C and a second preliminary drying process is carried out. The frame body 28 for surrounding the semiconductor element is thermally compressed to the adhesive composition preliminary dried and the adhesive composition is cross-linked by a thermal process as shown in FIG. 5D. After that, for example, an upper lid member 30 is attached to the frame body 28 and resin is loaded into the internal space from an inlet provided with the upper lid member 30. Finally, solder bumps are attached to the other side of the substrate 110 to produce a semiconductor device. Of course, it is possible to apply the adhesive composition of the present invention to the frame body or the wiring layer first and after that adhere them to the substrate. In other words, any practical sequences are allowable. In addition, as mentioned above, it is possible to use the adhesive compositions of the present invention as the die-bond material for bonding the semiconductor element 16 to the substrate, or for adhering an outer lead 34 to the wiring layer 20 or for adhering any parts which are necessary to be adhered in a semiconductor device.

If a semiconductor device is constructed in a manner as above, a semiconductor device having excellent heat releasing capacity, moisture resistance and high reliability can be constructed.

[Fifteenth Embodiment]

This embodiment specifies a temperature range of the drying process and that of the thermocompression process explained in the above embodiment. More particularly, when the insulating layer comprising the adhesive composition of the present invention is formed using a precoating method, the adhesive composition of the present invention is first applied onto the substrate 110 by such a method as a screen printing and is heated under a temperature in the range of 40° C. to 120° C. to evaporate the solvent. Then the wiring layer 20 is thermally compressed to the substrate 110 using a temperature in the range of 60° C. to 170° C. The temperature may be increased if necessary to secure a post-cure of the adhesive composition. The thickness of the insulating layer formed is related to an adhering characteristic, electrical property and so on of the insulating layer and is determined by the initial thickness at the screen printing and the amount of non-volatile components contained in the adhesive composition. It is preferable that the thickness is in the range of 20 to 150 µm after the drying process and in the range of 100 to 145 µm after the thermocompression process or the post-cure process.

[Modified Embodiment]

The present invention is not limited to the above-mentioned embodiments, but various variations and modifications may be made.

For example, if an adhesive sheet is produced using any one of the above-mentioned adhesive compositions, it is possible to obtain almost the same effect as in the case of the adhesion by the precoating method. Such an adhesive sheet can be produced, for example, by applying an adhesive varnish to a fluorinated release sheet (for example, Tedolar by DuPont Co.) using screen or stencil and evaporating solvents by a preliminary drying. When used, the adhesive sheet is transferred onto an adherend and the release sheet is peeled off. Then the adhesive sheet is thermocompressed with another adherend.

It is possible to add a filler to any of the above-mentioned adhesive compositions if necessary (including the ones to which the use of a filler is not particularly mentioned). The amount of filler added is preferably between 5 to 50 vol %. If the amount is less than 5 vol %, the thermal conductivity of the resulting adhesive composition is decreased and if it is more than 50 vol %, the wettability of the adhesive composition is decreased and a parting at an interface is caused. It is particularly desirable that the amount of the filler in an adhesive composition after the preliminary drying is in the range of 20 to 50 vol % from the point of view of adjusting the viscosity of the adhesive during the thermocompression in the range of 30 to 80 Pa·s.

Also, the flow of adhesive composition during the thermocompression is improved by using a spherical shape of the filler, compared with the cases in which non-spherical fillers are used. Thus, the viscosity of an adhesive composition suitable for obtaining an excellent wettability may easily be obtained.

Examples of filler materials include insulating powders made of alumina, silica, graphite, aluminum nitride, silicon nitride, diamond, silicon carbide, magnesium oxide, etc., and conductive powders made of silver, gold, copper, aluminum, etc.

In addition, if a thermal conductivity is not particularly required, an inorganic filler such as crystalline silica, fused silica and silicon carbide may be used.

It is preferable, as mentioned above, to adjust the viscosity of the adhesive composition using diluents (solvents) in which reactive thermoplastic resins and other components may be dissolved. Examples of such diluents include toluene, xylene, turpentine oil, tetralin and so on.

Also, a cross-linking catalyst or cure accelerator may be added if necessary. Examples of such a cross-linking catalyst or a cure accelerator include triphenylphosphine, imidazole and imidazole adducts disclosed in the Japanese Laid-Open Patent Application No. 5-182515.

It is also possible to use a phenol type hardener (such as phenol novolac and cresol novolac), an amine type hardener (diamine group) and acid anhydride as a sub-cross-linking agent.

The preferred embodiments of the present invention will now be described in further detail with particular examples.

[EXAMPLES 1–5]

As a binder resin, bisphenol A-type epoxy resin was used. One equivalent of phenol novolac was added as a cross-linking agent. Butylcelsorb acetate was added as a diluent and the mixture was stirred by a roll. Then alumina powder whose average particle size is between 3 and 30 μm was added to the mixture so that its amount became 30 vol % after drying of the resulting adhesive composition, and the mixture was further stirred. Just before the mixing was completed, two parts by weight, with respect to 100 parts by weight of the epoxy resin, of triphenylphosphine was added as a cross-linking catalyst and an adhesive composition was obtained.

By varying the particle size of the alumina powder added as a filler, the following adhesive compositions were produced. The distribution of particle size was measured using a centrifugal automatic type apparatus for particle size distribution measurement (CAPA-700, Horiba Seisakusyo Co.).

[EXAMPLE 1]

An alumina powder whose number average particle size D50 is 3 μm was added. A particle size distribution of the powder is shown in TABLE 1.

TABLE 1

| particle size[μm] | cumulative distribution[%] |
|---|---|
| ~2 | 0 |
| 2~3 | 25 |
| 3~4 | 50 |
| 4~5 | 25 |

[EXAMPLE 2]

An alumina powder whose number average particle size D50 is 10 μm was added. A particle size distribution of the powder is shown in TABLE 2.

TABLE 2

| particle size[μm] | cumulative distribution[%] |
|---|---|
| ~8 | 0 |
| 8~9 | 5 |
| 9~10 | 20 |
| 10~20 | 50 |
| 20~30 | 20 |
| 30~40 | 5 |
| 40~ | 0 |

[EXAMPLE 3]

An alumina powder whose number average particle size D50 is 20 μm was added. A particle size distribution of the powder is shown in TABLE 3.

TABLE 3

| particle size[μm] | cumulative distribution[%] |
|---|---|
| ~10 | 0 |
| 10~20 | 25 |
| 20~30 | 50 |
| 30~40 | 25 |
| 40~ | 0 |

[EXAMPLE 4]

An alumina powder whose number average particle size D50 is 25 μm was added. A particle size distribution of the powder is shown in TABLE 4.

TABLE 4

| particle size[μm] | cumulative distribution[%] |
|---|---|
| ~10 | 0 |
| 10~20 | 25 |
| 20~30 | 50 |
| 30~40 | 25 |
| 40~ | 0 |

[EXAMPLE 5]

An alumina powder whose number average particle size D50 is 30 μm was added. A particle size distribution of the powder is shown in TABLE 5.

TABLE 5

| particle size[μm] | cumulative distribution[%] |
|---|---|
| ~20 | 0 |
| 20~30 | 25 |
| 30~40 | 50 |
| 40~50 | 25 |
| 50~ | 0 |

[Comparative Example 1]

An alumina powder whose particle size is evenly 2 μm was added.

[Comparative Example 2]

An alumina powder whose number average particle size D50 is 40 μm was added. A particle size distribution of the powder is shown in TABLE 6.

TABLE 6

| particle size[μm] | cumulative distribution[%] |
|---|---|
| ~20 | 0 |
| 20~30 | 5 |
| 30~40 | 20 |
| 40~50 | 50 |
| 50~60 | 20 |
| 60~70 | 5 |
| 70~ | 0 |

The adhesive compositions obtained were tested as follows:
(1) Measurement of the roughness of the applied surface of the adhesive composition after drying The adhesive composition was applied to an area of 10 mm×3 mm on a copper plate having a thickness of 20 mm using a screen printing method (thickness of 80 μm). After the applied adhesive composition was dried at 80° C. for 20 minutes, a roughness of the adhesive surface was measured by a roughness measuring device.

(2) Adhesive strength

The adhesive composition was applied to an area of 10 mm×3 mm on a copper plate having a thickness of 20 mm by a screen printing method (thickness of 150 μm). The applied adhesive composition was dried at 80° C. for 20 minutes.

After a polyimide film (Tore-DuPont Ltd., Capton Film) of 10 mm×50 mm was compressed to the dried adhesive composition on the copper plate with an applied pressure of 0.2 MPa at 90° C. for 20 seconds, it was left for 5 hours at 170° C. for post-curing.

After that, a 90° peel test was conducted. Also, after the adhesive composition was moistened under the condition of 85% RH at 85° C., the peel test was conducted.

(3) Anti-pressure characteristics at high temperature

The adhesive composition was applied to an area of 20 mm×20 mm on a copper plate having a thickness of 20 mm using a screen printing method (thickness of 150 μm). The applied adhesive composition was dried at 80° C. for 20 minutes.

After a copper plate having a thickness of 20 mm was compressed to the dried adhesive on the copper plate with a pressure of 0.2 MPa at 90° C. for 20 seconds, it was left for 5 hours at 170° C. for post-curing.

After the above sample was clamped at 170° C., at 250 kgf/cm², flashes of the adhesive layer were examined and an electrical conductivity between the cover plates was tested by a tester.

(4) Moisture resistance

The above adhesive compositions were used as the insulating layer and the semiconductor device shown in FIG. 3 was constructed.

Firstly, the adhesive composition was applied to the substrate 110 on which a semiconductor element 16 was mounted. Then, the substrate 110 to which the adhesive composition was applied was thermally treated to dry the adhesive composition. The wiring layer 20 by which wires were connected to the semiconductor element 16 was adhered to the substrate 110 by heat-pressing. Likewise, the frame body 28 was adhered to the substrate 110. After the upper lid member 30 was attached to the frame body 28, the resin 42 was filled to produce the semiconductor device.

After the semiconductor devices produced in the above manner were left at 121° C. at 2 atm in a pressure-cooker tester, their wirings were tested (the total number of samples was 20 and the number of defective samples is shown in the form of a fraction).

The results are shown in TABLE 7.

TABLE 7

|  | Ex.1 | Ex.2 | Ex.3 | Ex.4 | Ex.5 | Cp.1 | Cp.2 |
|---|---|---|---|---|---|---|---|
| Diameter of filler [μm] | 3 | 10 | 20 | 25 | 30 | 2 | 40 |
| Concavo-convex [μm] | 3 | 5 | 10 | 15 | 15 | 3 | 20 |
| Thickness aft. dry[μm] | 20 | 20 | 40 | 60 | 80 | 20 | 80 |
| Thickness aft. cure[μm] | 15 | 20 | 40 | 60 | 80 | 15 | 80 |
| Peel strength [gf/cm] |  |  |  |  |  |  |  |

TABLE 7-continued

|  | Ex.1 | Ex.2 | Ex.3 | Ex.4 | Ex.5 | Cp.1 | Cp.2 |
|---|---|---|---|---|---|---|---|
| aft.cure | 400 | 700 | 600 | 500 | 400 | 400 | 300 |
| aft.moistened | 350 | 600 | 500 | 450 | 330 | 350 | 50 |
| Flashes of insulat.layer | none | none | none | none | none | some | none |
| Insulation | good | good | good | good | good | bad | good |
| Moisture Res. (aft. 500 hr) | 0/20 | 0/20 | 0/20 | 0/20 | 0/20 | 20/20 | 20/20 |

Moisture Res. = Moisture resistance

According to the results shown in TABLE 7, it is clear that when the filler particle size is increased, a depth of a recess and protruding (concavo-convex) portion of the surface is increased. Especially, when the depth of the recess and protruding portion of the surface is more than 20 μm, the peel strength and adhesive strength are dramatically decreased after the semiconductor device is moistened.

On the other hand, flashes were observed for the adhesive of the COMPARATIVE EXAMPLE 1, in which the filler of the 2-μm particle size was used. Because of the flashes, its electrical insulation characteristics are lowered.

Thus, in order to obtain excellent adhesive strength, it is preferable that the depth of the recess and protruding portion of the surface is in the range of 3 to 15 μm so that the binder resin can be distributed evenly. For this reason, the particle size of a filler added is preferably in the range of about 3 to 30 μm.

According to the pressure-cooker test, 20 samples among 20 are determined good for the EXAMPLES 1–5. However, all of the samples are diffractive in COMPARATIVE EXAMPLES 1 and 2. Accordingly, it is considered that water is prevented from reaching the semiconductor element because of the excellent adhesivity of the adhesive compositions of EXAMPLES 1–5.

[EXAMPLES 6–13]

Hydrogen-added styrene-ethylene-butylene-styrene copolymer (Shell Chemical Ltd., Kraton G-1652) as a main component was mixed with a reactive silicone as a flexibilizer having the following formula:

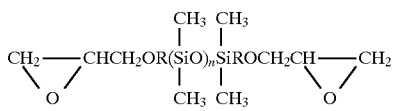

(wherein R represents an alkyl group)

in toluene using a three-necked flask. After that, a reflux condenser was attached to the flask and the mixture was stirred at 114° C., which is a reflux temperature of toluene, for 30 minutes. Cresol novolac epoxy resin (Dainippon Ink Ltd., N-660) was added and the mixture was stirred until a homogeneous mixture was obtained. After the varnish became homogeneous, the mixture was immediately cooled to room temperature.

Then alumina powder (AS-40, Syowa Denko Co) was added to the mixture so that its amount became 40 vol % after drying the resulting adhesive, and the mixture was further stirred by a roll. Just before the mixing was completed, two parts by weight, with respect to 100 parts by weight of the epoxy resin, of triphenylphosphine was added as a cross-linking catalyst and an adhesive composition was obtained.

Thirteen different kinds of adhesive compositions were produced by varying the amount and epoxy equivalency of reactive silicone as shown below ("parts" indicates "parts by weight" hereinafter).

[EXAMPLE 6]

The epoxy equivalency of the reactive silicone was 650, and 5 parts of the reactive silicone was added to 100 parts of the reactive thermoplastic resin which was the main component.

[EXAMPLE 7]

The epoxy equivalency of the reactive silicone was 650, and 30 parts of the reactive silicone was added to 100 parts of the reactive thermoplastic resin which was the main component.

[EXAMPLE 8]

The epoxy equivalency of the reactive silicone was 650, and 50 parts of the reactive silicone was added to 100 parts of the reactive thermoplastic resin which was the main component.

[EXAMPLE 9]

The epoxy equivalency of the reactive silicone was 650, and 100 parts of the reactive silicone was added to 100 parts of the reactive thermoplastic resin which was the main component.

[EXAMPLE 10]

The epoxy equivalency of the reactive silicone was 300, and 50 parts of the reactive silicone was added to 100 parts of the reactive thermoplastic resin which was the main component.

[EXAMPLE 11]

The epoxy equivalency of the reactive silicone was 1000, and 50 parts of the reactive silicone was added to 100 parts of the reactive thermoplastic resin which was the main component.

[EXAMPLE 12]

The epoxy equivalency of the reactive silicone was 5000, and 50 parts of the reactive silicone was added to 100 parts of the reactive thermoplastic resin which was the main component.

[EXAMPLE 13]

The epoxy equivalency of the reactive silicone was 10000, and 50 parts of the reactive silicone was added to 100 parts of the reactive thermoplastic resin which was the main component.

[Comparative Example 3]

The epoxy equivalency of the reactive silicone was 650, and 2 parts of the reactive silicone was added to 100 parts of the reactive thermoplastic resin which was the main component.

[Comparative Example 4]

The epoxy equivalency of the reactive silicone was 650, and 110 parts of the reactive silicone was added to 100 parts of the reactive thermoplastic resin which was the main component.

[Comparative Example 5]

The epoxy equivalency of the reactive silicone was 200, and 50 parts of the reactive silicone was added to 100 parts of the reactive thermoplastic resin which was the main component.

[Comparative Example 6]

The epoxy equivalency of the reactive silicone was 12000, and 50 parts of the reactive silicone was added to 100 parts of the reactive thermoplastic resin which was the main component.

As another COMPARATIVE EXAMPLE, an adhesive composition was prepared using a following method.

[Comparative Example 7]

Hydrogen-added styrene-ethylene-butylene-styrene copolymer (Shell Chemical Ltd., Kraton G-1652) as a main component was mixed with a reactive silicone as a flexibilizer having the following formula:

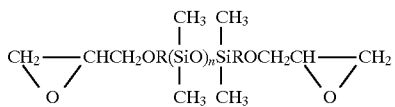

(wherein R represents an alkyl group)
and cresol novolac epoxy resin in toluene by a roller. Then alumina powder was added so that its content became 40 vol % after drying and the mixture was further stirred. Just before the mixing was completed, 2 parts of triphenylphosphine as a cross-linking catalyst was added to 100 parts of epoxy resin to obtain an adhesive composition.

The adhesive compositions obtained were examined as follows.

(1) Adhesive strength

The adhesive composition was applied to an area of 10 mm×3 mm on a copper plate of 20 mm×20 mm by a screen printing method (thickness of 80 µm). The applied adhesive composition was dried at 80° C. for 20 minutes.

After a polyimide film of 10 mm×50 mm was compressed to the dried adhesive composition on the copper plate at 90° C. at 1 MPa for 20 seconds, the copper layer was left for 5 hours at 170° C. for curing.

After that, a 90° peel test was conducted. Also, after the adhesive composition was moistened at 85° C. at 85% RH, the peel test was conducted.

Further, an adhesive strength when heated at 260° C. and after being dipped in xylene for 30 minutes was measured.

(2) Moisture resistance

The semiconductor devices were produced using the above adhesive compositions as the insulating layer in the same manner described above. After the semiconductor devices produced in the above manner were left at 121° C. at 2 atm in a pressure-cooker tester, their wirings were tested (the total number of samples was 20 and the number of defective samples is shown in the form of a fraction). The results are shown in TABLE 8 (1) and (2) (the abbreviation "phr" used hereinafter indicates "percent per hundred for resin").

TABLE 8 (1)

|  | Ex.6 | Ex.7 | Ex.8 | Ex.9 | Ex10 | Ex11 | Ex12 |
|---|---|---|---|---|---|---|---|
| Main compone. [phr] | 100 | 100 | 100 | 100 | 100 | 100 | 100 |
| Epoxy resin [phr] | 10 | 10 | 10 | 10 | 10 | 10 | 10 |
| Reac.Si [phr] | 5 | 30 | 50 | 100 | 50 | 50 | 50 |
| (epox.equiv.) | 650 | 650 | 650 | 650 | 300 | 1000 | 5000 |
| Peel strength [gf/cm] | | | | | | | |
| aft.cure | 700 | 800 | 950 | 700 | 800 | 1000 | 900 |
| aft.moistened | 680 | 750 | 900 | 700 | 700 | 850 | 700 |
| aft.heat | 400 | 500 | 600 | 450 | 500 | 600 | 550 |
| aft.dip.xylen | 500 | 600 | 750 | 600 | 750 | 900 | 800 |
| State of adh. aft. drying | sol. | sol. | sol. | sol. | sol. | sol. | sol. |
| Moisture Res. (aft. 500 hr) | 0/20 | 0/20 | 0/20 | 0/20 | 0/20 | 0/20 | 0/20 |

Reac. Si = reactive silicone sol. = solid
aft.dip.xylen = after dipped in xylene

TABLE 8 (2)

|  | Ex13 | Cp.3 | Cp.4 | Cp.5 | Cp.6 | Cp.7 |
|---|---|---|---|---|---|---|
| Main compone. [phr] | 100 | 100 | 100 | 100 | 100 | 100 |
| Epoxy resin [phr] | 10 | 10 | 10 | 10 | 10 | 10 |
| Reac.Si [phr] | 50 | 2 | 110 | 50 | 50 | 50 |
| (epox.equiv.) | 10000 | 650 | 650 | 200 | 12000 | 650 |
| Peel strength [gf/cm] | | | | | | |
| aft.cure | 650 | 600 | 400 | 300 | 100 | 500 |
| aft.moistened | 700 | 180 | 300 | 250 | 50 | 200 |
| aft.heat | 470 | 30 | 100 | 100 | 50 | 100 |
| aft.dip.sol. | 600 | 100 | 250 | 250 | 50 | 300 |
| State of adh. aft. drying | sol. | sol. | liq. | sol. | liq. | liq. |
| Moisture Res. (aft. 500 hr) | 0/20 | 0/20 | 0/20 | 0/20 | 0/20 | 20/20 | aft.dip.sol. = after dipped into solvent
sol. = solid, liq. = liquid

According to the above result, when 5–100 parts of the reactive silicone as a flexibilizer is added to 100 parts of the thermoplastic resin (EXAMPLES 6–9), when the epoxy equivalency of the reactive silicone is 400–10000 (EXAMPLES 10–13) and when the reactive silicone is reacted with the reactive thermoplastic resin in advance, adhesive compositions having excellent heat resistance and moisture resistance, which can be applied to the precoating method, can be obtained.

The preferred amount of the reactive silicone added is 5–100 parts. When the amount of the reactive silicone is less than 5 parts, the effect of adding the reactive silicone cannot be recognized. When the amount of the reactive silicone is over 100 parts, the reactive silicone cannot be dissolved and a bleed out occurs to lower the adhesivity.

The preferred epoxy equivalent of the reactive silicone added is 400–10000. When the epoxy equivalent is less than 400, the effect of adding the silicone as a flexibilizer cannot be recognized. When the epoxy equivalent is over 10000, the mixture remains a liquid even after the pre-reaction.

[EXAMPLES 14–20]

Hydrogen-added styrene-ethylene-butylene-styrene copolymer (Shell Chemical Ltd., Kraton G-1652) as a main component was added to toluene and refluxed in a tri-necked flask equipped with a reflux condenser at 114° C., which is a reflux temperature of toluene, for 30 minutes. The toluene content was 80 wt %.

After the main component was dissolved, cresol novolac epoxy resin (Dainippon Ink Ltd., N-660), polyallylphenol (Mitsubishi Yuka Ltd., SH-150AR) and a tackifier (cyclopentadiene) were added to the solution. The mixture was stirred until a homogeneous mixture was obtained. After the varnish became homogeneous, the mixture was immediately cooled to the room temperature. After that, alumina powder (Showa Denko Ltd., AS-40) was added to the varnish so that its amount after drying became 40 vol % of the varnish. The mixture was continuously stirred and just before the mixing was completed, 2 parts of triphenylphosphine as a cross-linking catalyst was added to 100 parts of epoxy resin to obtain an adhesive composition.

Nine different kinds of adhesive compositions were produced by varying the amounts of polyallylphenol and tackifier as shown below.

[EXAMPLE 14]

5 parts of polyallylphenol was added to 100 parts of the reactive thermoplastic resin which is a main component.

[EXAMPLE 15]

30 parts of polyallylphenol was added to 100 parts of the reactive thermoplastic resin which is a main component.

[EXAMPLE 16]

50 parts of polyallylphenol was added to 100 parts of the reactive thermoplastic resin which is a main component.

[EXAMPLE 17]

100 parts of polyallylphenol was added to 100 parts of the reactive thermoplastic resin which is a main component.

[EXAMPLE 18]

120 parts of polyallylphenol was added to 100 parts of the reactive thermoplastic resin which is a main component.

[EXAMPLE 19]

30 parts of polyallylphenol and 10 parts of the tackifier were added to 100 parts of the reactive thermoplastic resin which is a main component.

[EXAMPLE 20]

30 parts of polyallylphenol and 20 parts of the tackifier agent were added to 100 parts of the reactive thermoplastic resin which is a main component.

[Comparative Example 8]

3 parts of polyallylphenol was added to 100 parts of the reactive thermoplastic resin which is a main component.

[Comparative Example 9]

130 parts of polyallylphenol was added to 100 parts of the reactive thermoplastic resin which is a main component.

The adhesive compositions obtained were tested as follows.

(1) Adhesive strength

The adhesive composition was applied to an area of 10 mm×3 mm on a copper plate of 20 mm×20 mm by a screen printing method (thickness of 80 μm). The applied adhesive composition was dried at 80° C. for 20 minutes.

After a polyimide film of 10 mm×50 mm was compressed to the dried adhesive composition on the copper plate at 90° C. at 1 MPa for 20 seconds, the copper layer was left at 170° C. for 5 hours.

After that, a peel test was conducted at 90°. Also, after the adhesive composition was moistened at 85° C. at 85% RH, the peel test was conducted.

(2) Moisture resistance

The above adhesive compositions were used in the insulating layer in the semiconductor device shown in FIG. 3 as follows.

The adhesive composition was applied to the substrate 110 on which a semiconductor element 16 was mounted. After that, the substrate 110 to which the adhesive composition had been applied was thermally treated to dry the adhesive composition. The wiring board connected to the semiconductor device 16 was attached to the substrate 110 by heat-pressing. After that, the frame body 28 was adhered to the substrate 110. After the upper lid member 30 was attached to the frame body 28, the resin 42 was filled to produce the semiconductor device.

After the semiconductor devices produced in the above manner were left at 121° C. at 2 atm in a pressure-cooker tester, their wirings were tested (the total number of samples was 20 and the number of defective samples is shown in the form of a fraction).

(3) Thermal resistance

After the semiconductor devices using the above adhesive compositions as the insulating layer were produced, the thermal resistance was measured.

The results are shown in TABLE 9 (1) and (2).

TABLE 9 (1)

|  | Ex14 | Ex15 | Ex16 | Ex17 | Ex18 | Ex19 | Ex20 |
|---|---|---|---|---|---|---|---|
| Main compone. [phr] | 100 | 100 | 100 | 100 | 100 | 100 | 100 |
| Epoxy resin [phr] | 20 | 20 | 20 | 20 | 20 | 20 | 20 |
| Polyallylphe. [phr] | 5 | 30 | 50 | 100 | 120 | 30 | 30 |
| Tackifier[phr] | 0 | 0 | 0 | 0 | 0 | 10 | 20 |
| Visc. at Comp. [Pa·s] | 75 | 60 | 55 | 45 | 45 | 40 | 30 |
| Peel strength [gf/cm] |  |  |  |  |  |  |  |
| aft.cure | 600 | 700 | 900 | 800 | 650 | 800 | 950 |
| aft.moistened | 400 | 550 | 800 | 700 | 450 | 700 | 750 |
| Moisture Res. (aft. 500 hr) | 0/20 | 0/20 | 0/20 | 0/20 | 0/20 | 0/20 | 0/20 |
| Therm. Resist. [°C./W] | 40.8 | 40.6 | 40.5 | 40.3 | 40.3 | 40.3 | 40.1 |

Visc. at Comp. = Viscosity at thermal compression
Therm. Resist = Thermal Resistance

TABLE 9 (2)

|  | Cp.8 | Cp.9 |
|---|---|---|
| Main compone. [phr] | 100 | 100 |
| Epoxy resin [phr] | 20 | 20 |
| Polyallylphe. [phr] | 3 | 130 |
| Tackifier [phr] | 0 | 0 |
| Visc. at Comp. [Pa.s] | 90 | 20 |
| Peel strength [gf/cm] |  |  |
| aft.cure | 400 | 500 |
| aft.moistened | 200 | 250 |

TABLE 9 (2)-continued

|  | Cp.8 | Cp.9 |
|---|---|---|
| Moisture Res. (aft. 500 hr) | 5/20 | 9/20 |
| Therm. Resist. [°C./W] | 41.2 | 40.4 |

As can be seen from EXAMPLES 14–18 and COMPARATIVE EXAMPLES 8 and 9 in the above TABLE 9, when the amount of polyallylphenol added is increased, wettability of the adhesive composition can be improved. This is due to an excellent hydrophobicity and wetting property of polyallylphenol.

By the addition of polyallylphenol, a deterioration of the peel strength after absorbing moisture can be reduced. The reason for this is as follows. By the addition of the polyallylphenol, the reactive thermoplastic resin is mainly reacted with the epoxy resin and the epoxy resin is mainly reacted with polyallylphenol. Thus, a cross-linking is formed in a sequence of reactive thermoplastic resin-epoxy resin-polyallylphenol-epoxy resin-reactive thermoplastic resin. That is, allyl groups remain in the cured adhesive and improve the hydrophobicity of the adhesive composition significantly.

By setting the amount of polyallylphenol added to 5–120 parts with respect to 100 parts of the main component, the moisture resistance can be improved, as shown in EXAMPLES 14–18. The advantage of the polyallylphenol can be recognized when 5–120 parts of the polyallylphenol is added to 100 parts of the main component. When the amount of polyallylphenol is less than 5 parts, the advantage thereof cannot be recognized, as shown in COMPARATIVE EXAMPLE 8. When the amount of polyallylphenol is more than 120 parts, the adhesive strength is lowered due to excess amount of non-cross-linked portions, as shown in COMPARATIVE EXAMPLE 9.

When the tackifier is added to the adhesive (EXAMPLES 19 and 20), the thermal conductivity of the adhesive composition can be improved. Also, by using the tackifier, the wettability and adhesive strength of the adhesive composition at interfaces can be improved during thermal compression. Thus, when the adhesive composition is used as a die-bond material, a heat generated by the semiconductor element can be transferred to the board efficiently.

[EXAMPLES 21–29]

Ethylene-propylene terpolymer including ethylidene norbornene as a third component was mixed with toluene in a tri-necked flask. After that, a reflux condenser was fixed to the flask and the mixture was stirred at 114° C., which is a reflux temperature of toluene, for 30 minutes. The toluene content was 80 wt %.

To the mixture being stirred, polyallylphenol (Mitsubishi Yuka Ltd., SH-150AR) and a tackifier (cyclopentadiene) were added. The mixture was stirred until a homogeneous mixture was obtained. After the varnish became homogeneous, the mixture was cooled to the room temperature. After that, alumina powder (Showa Denko Ltd., AS-40) was added so that its volume become 30 vol % of the dried varnish. The mixture was continuously mixed. Before the mixing was completed, 2 parts of triphenylphosphine as a crosslinking catalyst was added to 100 parts of epoxy resin to obtain an adhesive composition.

The iodine value of ethylidene norbornene and the amount of polyallylphenol and tackifier were varied to obtain 13 different adhesive compositions as follows.

[EXAMPLE 21]

The iodine value of ethylidene norbornene was 5. 30 parts of polyallylphenol was added to 100 parts of thermoplastic resin which was the main component.

[EXAMPLE 22]

The iodine value of ethylidene norbornene was 15. 30 parts of polyallylphenol was added to 100 parts of thermoplastic resin which was the main component.

[EXAMPLE 23]

The iodine value of ethylidene norbornene was 40. 30 parts of polyallylphenol was added to 100 parts of thermoplastic resin which was the main component.

[EXAMPLE 24]

The iodine value of ethylidene norbornene was 15. 5 parts of polyallylphenol was added to 100 parts of thermoplastic resin which was the main component.

[EXAMPLE 25]

The iodine value of ethylidene norbornene was 15. 50 parts of polyallylphenol was added to 100 parts of thermoplastic resin which was the main component.

[EXAMPLE 26]

The iodine value of ethylidene norbornene was 15. 100 parts of polyallylphenol was added to 100 parts of thermoplastic resin which was the main component.

[EXAMPLE 27]

The iodine value of ethylidene norbornene was 15. 120 parts of polyallylphenol was added to 100 parts of thermoplastic resin which was the main component.

[EXAMPLE 28]

The iodine value of ethylidene norbornene was 15. 30 parts of polyallylphenol and 20 parts of tackifier were added to 100 parts of thermoplastic resin which was the main component.

[EXAMPLE 29]

The iodine value of ethylidene norbornene was 15. 30 parts of polyallylphenol and 30 parts of tackifier were added to 100 parts of thermoplastic resin which was the main component.

[Comparative Example 10]

The iodine value of ethylidene norbornene was 3. 30 parts of polyallylphenol was added to 100 parts of thermoplastic resin which was the main component.

[Comparative Example 11]

The iodine value of ethylidene norbornene was 50. 30 parts of polyallylphenol was added to 100 parts of thermoplastic resin which was the main component.

[Comparative Example 12]

The iodine value of ethylidene norbornene was 15. 3 parts of polyallylphenol was added to 100 parts of thermoplastic resin which was the main component.

[Comparative Example 13]

The iodine value of ethylidene norbornene was 15. 130 parts of polyallylphenol was added to 100 parts of thermoplastic resin which was the main component.

The adhesive compositions obtained were tested as follows.

(1) Adhesive strength

The adhesive composition was applied to an area of 10 mm×3 mm on a copper plate of 20 mm×20 mm by a screen printing method at a thickness of 80 μm. The applied adhesive composition was dried at 80° C. for 20 minutes.

After a polyimide film of 10 mm×50 mm was compressed to the dried adhesive composition on the copper plate at 90° C. at 1 MPa for 20 seconds, the copper layer was left at 170° C. for 5 hours.

After that, a peel test was conducted at 90°. Also, after the adhesive composition was moistened at 85° C. at 85% RH, the peel test was conducted.

(2) Moisture resistance

The above adhesive compositions were used in the insulating layer in the semiconductor device shown in FIG. 3 as follows.

The adhesive composition was applied to the substrate on which a semiconductor element 16 was mounted. After that, the substrate 110 to which the adhesive composition had been applied was thermally treated to dry the adhesive composition. The wiring board connected to the semiconductor device 16 was attached to the substrate 110 by heat-pressing. After that, the frame body 28 was adhered to the substrate 110. After the upper lid member 30 was attached to the frame body 28, the resin 42 was filled to produce the semiconductor device.

After the semiconductor devices produced in the above manner were left at 121° C. at 2 atm in a pressure-cooker tester, their wirings were tested (the total number of samples was 20 and the number of defective samples is shown in the form of a fraction).

(3) Thermal resistance

After the semiconductor devices using the above adhesive compositions as the insulating layer were produced, the thermal resistance was measured.

The results are shown in TABLE 10 (1) and (2).

TABLE 10 (1)

|  | Ex21 | Ex22 | Ex23 | Ex24 | Ex25 | Ex26 | Ex27 |
| --- | --- | --- | --- | --- | --- | --- | --- |
| Main compone. [phr] | 100 | 100 | 100 | 100 | 100 | 100 | 100 |
| Iodine value Polyallylphe. | 5 | 15 | 40 | 15 | 15 | 15 | 15 |
| [phr] | 30 | 30 | 30 | 5 | 50 | 100 | 120 |
| Tackifier[phr] | 0 | 0 | 0 | 0 | 0 | 0 | 0 |
| Visc. at Comp. [Pa · s] | 60 | 55 | 50 | 75 | 45 | 40 | 40 |
| Peel strength [gf/cm] |  |  |  |  |  |  |  |
| aft.cure | 620 | 700 | 720 | 600 | 800 | 830 | 750 |
| aft.moistened | 410 | 580 | 600 | 400 | 680 | 700 | 650 |
| Moisture Res. (aft. 500 hr) | 0/20 | 0/20 | 0/20 | 0/20 | 0/20 | 0/20 | 0/20 |
| Therm. Resist. [°C./W] | 40.8 | 40.7 | 40.6 | 40.9 | 40.5 | 40.4 | 40.4 |

Visc. at Comp. = Viscosity at thermal compression
Moisture Res. = Moisture Resistance
Therm. Resist = Thermal Resistance

TABLE 10 (2)

|  | Ex28 | Ex29 | Cp10 | Cp11 | Co12 | Cp13 |
|---|---|---|---|---|---|---|
| Main compone. [phr] | 100 | 100 | 100 | 100 | 100 | 100 |
| Iodine value | 15 | 15 | 3 | 50 | 15 | 15 |
| Polyallylphe. [phr] | 30 | 30 | 30 | 30 | 3 | 130 |
| Tackifier[phr] | 20 | 30 | 0 | 0 | 0 | 0 |
| Visc. at Comp. [Pa · s] | 35 | 30 | 85 | 45 | 85 | 20 |
| Peel strength [gf/cm] |  |  |  |  |  |  |
| aft.cure | 900 | 1000 | 500 | 600 | 500 | 400 |
| aft.moistened | 800 | 850 | 250 | 200 | 150 | 100 |
| Moisture Res. (aft. 500 hr) | 0/20 | 0/20 | 9/20 | 8/20 | 9/20 | 17/20 |
| Therm. Resist. [°C./W] | 40.2 | 40.1 | 41.3 | 40.4 | 41.4 | 40.6 |

As can be seen from the above results, when the amount of polyallylphenol added is increased, the wettability of the adhesive composition can be improved, as shown in EXAMPLES 24–27 and COMPARATIVE EXAMPLES 12 and 13. This is due to the excellent hydrophobicity and wetting property of polyallylphenol.

The amount of polyallylphenol added is preferably set in the range of 5–120 parts to 100 parts of the main component. When the amount of polyallylphenol is less than 5 parts, the advantage thereof cannot be recognized, as shown in COMPARATIVE EXAMPLE 12. When the amount of polyallylphenol is over 120 parts, the adhesive strength is lowered due to excess amount of non-cross-linked portions, as shown in COMPARATIVE EXAMPLE 13.

When the amount of ethylidene norbornene is increased, wettability of the adhesive composition can be improved, as can be seen from EXAMPLES 21–23 and COMPARATIVE EXAMPLES 10 and 11. Especially, when ethylidene norbornene has an iodine value in the range of 5–40, the adhesive strength and moisture resistance are excellent. Various characteristics of the adhesive composition are influenced by the iodine value of ethylidene norbornene, as described above. When the iodine value is less than 5, anti-solvent characteristics are lowered due to the insufficient cross-linking density. On the other hand, when the iodine value is over 40, the heat stress between the semiconductor element 16 and the substrate 110 cannot be released due to the high cross-linking density.

When the tackifier is added to the adhesive composition (EXAMPLES 28 and 29), the thermal conductivity of the adhesive composition can be improved. Also, by using the tackifier, the wettability and adhesive strength of the adhesive composition at the interfaces can be improved during thermal compression. Thus, when the adhesive composition of the present invention is used as a die-bond material, heat generated in the semiconductor element 16 can be conducted to the substrate 110 efficiently.

[EXAMPLES 30–35]

Hydrogen-added styrene-ethylene-butylene-styrene copolymer (Shell Chemical Ltd., Kraton G-1652) as a main component was added to toluene and refluxed in a tri-necked flask equipped with a reflux condenser at 114° C., which is a reflux temperature of toluene, for 30 minutes. The toluene content was 80 wt %.

After the main component was dissolved, cresol novolac epoxy resin (Dainippon Ink Ltd., N-660) and a tackifier comprising styrene-denatured copolymer (Rika Hercules Ltd., Ha-kotakku 1149) were added to the solution. The mixture was mixed until a homogeneous mixture was obtained. After the varnish became even, the mixture was immediately cooled to the room temperature. After that, alumina powder (Adomatechs Ltd., Adomafine AO-500) was added so that its volume become 30 vol % of the dried varnish. The mixture was continuously mixed by roller. Just before the mixing was completed, 10 parts of a cross-linking catalyst (Asahi Kasei Ltd., Novacure HX-3921) was added to 100 parts of epoxy resin to obtain an adhesive composition.

The amount of tackifier was varied to obtain eight kinds of adhesive compositions as follows.

[EXAMPLE 30]

5 parts of tackifier was added to 100 parts of thermoplastic resin which was the main component.

[EXAMPLE 31]

30 parts of tackifier was added to 100 parts of thermoplastic resin which was the main component.

[EXAMPLE 32]

100 parts of tackifier was added to 100 parts of thermoplastic resin which was the main component.

[EXAMPLE 33]

200 parts of tackifier was added to 100 parts of thermoplastic resin which was the main component.

[EXAMPLE 34]

300 parts of tackifier was added to 100 parts of thermoplastic resin which was the main component.

[EXAMPLE 35]

400 parts of tackifier was added to 100 parts of thermoplastic resin which was the main component.

[Comparative Example 14]

3 parts of tackifier was added to 100 parts of thermoplastic resin which was the main component.

[Comparative Example 15]

450 parts of tackifier was added to 100 parts of thermoplastic resin which was the main component.

The adhesive compositions obtained were tested as follows.
(1) Adhesive strength The adhesive composition was applied to an area of 10 mm×3 mm on a copper plate of 20 mm×20 mm by a screen printing method (thickness of 80 μm). The applied adhesive composition was dried at 80° C. for 20 minutes.

After a polyimide film of 10 mm×50 mm was compressed to the dried adhesive composition on the copper plate at 90° C. at 1 MPa for 20 seconds, the copper layer was left at 170° C. for 5 hours.

After that, a peel test was conducted at 90°. Also, after the adhesive composition was moistened in a pressure-cooker tester at 121° C. at 2 atm, the peel test was conducted.
(2) Moisture resistance The above adhesive compositions were used in the insulating layer in the semiconductor device shown in FIG. 3 as follows.

The adhesive composition was applied to the substrate 110 on which a semiconductor element 16 was mounted. After that, the substrate 110 to which the adhesive composition had been applied was thermally treated to dry the adhesive composition. The wiring board connected to the semiconductor device 16 was attached to the substrate 110 by heat-pressing. After that, the frame body 28 was attached to the substrate 110. After the upper lid member 30 was attached to the frame body 28, the resin 42 was filled to produce the semiconductor device.

After the semiconductor devices produced in the above manner were left at 121° C. at 2 atm in a pressure-cooker tester, their wirings were tested (the total number of samples was 20 and the number of defective samples is shown in the form of a fraction).

(3) Thermal resistance

After the semiconductor devices using the above adhesive compositions as the insulating layer were produced, the thermal resistance was measured.

(4) Heat cycle test

The above adhesive compositions were used as the insulating layer to produce the semiconductor device in the same manner described in the first embodiment. In a mounting state, a heat cycle test was conducted to evaluate damage of the solder and the semiconductor device. The test was conducted in a cycle, −65° C. for 30 minutes, room temperature for 20 minutes, 150° C. for 30 minutes (the total number of samples was 20 and the number of defective samples is shown in the form of a fraction).

The results are shown in TABLE 11 (1) and (2).

TABLE 11 (1)

|  | Ex30 | Ex31 | Ex32 | Ex33 | Ex34 | Ex35 |
|---|---|---|---|---|---|---|
| Main compone. [phr] | 100 | 100 | 100 | 100 | 100 | 100 |
| Epoxy resin [phr] | 20 | 20 | 20 | 20 | 20 | 20 |
| Ha-kotakku [phr] | 5 | 30 | 100 | 200 | 300 | 400 |
| Peel strength [gf/cm] | | | | | | |
| aft.cure | 750 | 1000 | 2200 | 1500 | 1200 | 800 |
| (mode) | coh. | coh. | coh. | coh. | coh. | coh. |
| aft.moistened | 700 | 1000 | 1800 | 1200 | 1200 | 800 |
| (mode) | int. | coh. | coh. | coh. | coh. | coh. |
| Moisture Res. (aft. 500 hr) | 1/20 | 0/20 | 0/20 | 0/20 | 1/20 | 2/20 |
| Therm. Resist. [°C./W] | 45.8 | 44.6 | 42.5 | 41.3 | 40.3 | 40.3 |
| Heat cycle (1000 cycle) | 0/20 | 0/20 | 0/20 | 0/20 | 0/20 | 0/20 | coh. = cohesive failure, int = interface failure
Moisture Res. = Moisture Resistance
Therm. Resist = Thermal Resistance

TABLE 11 (2)

|  | Cp14 | Cp15 |
|---|---|---|
| Main compone. [phr] | 100 | 100 |
| Epoxy resin [phr] | 20 | 20 |
| Ha-kotakku [phr] | 3 | 450 |
| Peel strength [gf/cm] | | |
| aft.cure | 600 | 400 |
| (mode) | int. | coh. |
| aft.moistened | 450 | 200 |

TABLE 11 (2)-continued

|  | Cp14 | Cp15 |
|---|---|---|
| (mode) | int. | coh. |
| Moisture Res. (aft. 500 hr) | 10/20 | 15/20 |
| Therm. Resist. [°C./W] | 48.6 | 40.5 |
| Heat cycle (1000 cycle) | 20/20 | 0/20 |

[EXAMPLES 36–41]

Hydrogen-added styrene-ethylene-butylene-styrene copolymer (Shell Chemical Ltd., Kraton G-1652) as a main component was added to toluene and refluxed in a tri-necked flask equipped with a reflux condenser at 114° C., which is a reflux temperature of toluene, for 30 minutes. The toluene content was 80 wt %.

After the main component was dissolved, cresol novolac epoxy resin (Dainippon Ink Ltd., N-660) and a tackifier (Rika Hercules Ltd., Picolight S115) including a β-pinene polymer were added to the solution. The mixture was mixed until a homogeneous mixture was obtained. After the varnish became homogeneous, the mixture was immediately cooled to the room temperature. After that, alumina powder (Adomatechs Ltd., Adomafine AO-500) was added so that its volume became 30 vol % of the dried varnish. The mixture was continuously mixed by roller. Just before the mixing was completed, 10 parts of a cross-linking catalyst (Asahi Kasei Ltd., Novacure HX-3921) was added to 100 parts of epoxy resin to obtain an adhesive composition.

The amount of tackifier was changed to obtain 8 different adhesive compositions as follows.

[EXAMPLE 36]

5 parts of tackifier was added to 100 parts of reactive thermoplastic resin which was the main component.

[EXAMPLE 37]

30 parts of tackifier was added to 100 parts of reactive thermoplastic resin which was the main component.

[EXAMPLE 38]

100 parts of tackifier was added to 100 parts of reactive thermoplastic resin which was the main component.

[EXAMPLE 39]

200 parts of tackifier was added to 100 parts of reactive thermoplastic resin which was the main component.

[EXAMPLE 40]

300 parts of tackifier was added to 100 parts of reactive thermoplastic resin which was the main component.

[EXAMPLE 41]

400 parts of tackifier was added to 100 parts of reactive thermoplastic resin which was the main component.

[Comparative Example 16]

3 parts of tackifier was added to 100 parts of reactive thermoplastic resin which was the main component.

[Comparative Example 17]

450 parts of tackifier was added to 100 parts of reactive thermoplastic resin which was the main component.

The adhesive compositions obtained were tested as follows.

(1) Adhesive strength

The adhesive composition was applied to an area of 10 mm×3 mm on a copper plate of 20 mm×20 mm by a screen printing method (thickness of 80 μm).

The applied adhesive composition was dried at 80° C. for 20 minutes.

After a polyimide film of 10 mm×50 mm was compressed to the dried adhesive composition on the copper plate at 90° C. at 1 MPa for 20 seconds, the copper layer was left at 170° C. for 5 hours.

After that, a peel test was conducted at 90°. Also, after the adhesive composition was moistened in a pressure-cooker tester at 121° C. at 2 atm, the peel test was conducted.

(2) Moisture resistance

The above adhesive compositions are used in the insulating layer in the semiconductor device shown in FIG. 3 as follows.

The adhesive composition was applied to the substrate 110 on which a semiconductor element 16 was mounted. After that, the substrate 110 to which the adhesive composition had been applied was thermally treated to dry the adhesive composition. The wiring board connected to the semiconductor device 16 was attached to the substrate 110 by heat-pressing. After that, the frame member 28 was attached to the substrate 110. After the upper lid member 30 was attached to the frame body 28, the resin 42 was filled to produce the semiconductor device.

After the semiconductor devices produced in the above manner were left at 121° C. at 2 atm in a pressure-cooker tester, their wirings were tested (the total number of samples was 20 and the number of defective samples is shown in the form of a fraction).

(3) Thermal resistance

After the semiconductor devices using the above adhesive compositions as the insulating layer was produced, the thermal resistance was measured.

(4) Heat cycle test

The above adhesive compositions are used as the insulating layer to produce the semiconductor device in the same manner described in the first embodiment. In an mounting state, a heat cycle test was conducted to evaluate damage to the solder and the semiconductor device. The test was conducted in a cycle, −65° C. for 30 minutes, room temperature for 20 minutes, 150° C. for 30 minutes (the total number of samples was 20 and the number of defective samples is shown in the form of a fraction).

The results are shown in TABLE 12 (1) and (2).

TABLE 12 (1)

|  | Ex36 | Ex37 | Ex38 | Ex39 | Ex40 | Ex41 |
|---|---|---|---|---|---|---|
| Main compone. [phr] | 100 | 100 | 100 | 100 | 100 | 100 |
| Epoxy resin [phr] | 20 | 20 | 20 | 20 | 20 | 20 |
| Picolight [phr] | 5 | 30 | 100 | 200 | 300 | 400 |
| Peel strength [gf/cm] |  |  |  |  |  |  |
| aft.cure | 850 | 1300 | 2300 | 1300 | 1000 | 770 |
| (mode) | coh. | coh. | coh. | coh. | coh. | coh. |
| aft.moistened | 750 | 1300 | 1850 | 960 | 750 | 680 |
| (mode) | int. | coh. | coh. | coh. | coh. | coh. |
| Moisture Res. (aft. 500 hr) | 1/20 | 0/20 | 0/20 | 0/20 | 1/20 | 2/20 |

TABLE 12 (1)-continued

|  | Ex36 | Ex37 | Ex38 | Ex39 | Ex40 | Ex41 |
|---|---|---|---|---|---|---|
| Therm. Resist. [°C./W] | 45.6 | 44.4 | 42.3 | 41.0 | 40.2 | 40.3 |
| Heat cycle (1000 cycle) | 0/20 | 0/20 | 0/20 | 0/20 | 0/20 | 0/20 | coh. = cohesive failure,
int = interface failure
Moisture Res. = Moisture Resistance
Therm. Resist = Thermal Resistance

TABLE 12 (2)

|  | Cp16 | Cp17 |
|---|---|---|
| Main compone. [phr] | 100 | 100 |
| Epoxy resin [phr] | 20 | 20 |
| Picolight [phr] | 3 | 450 |
| Peel strength [gf/cm] |  |  |
| aft.cure | 610 | 350 |
| (mode) | int. | coh. |
| aft.moistened | 460 | 120 |
| (mode) | int. | coh. |
| Moisture Res. (aft. 500 hr) | 10/20 | 20/20 |
| Therm. Resist. [°C./W] | 48.4 | 40.5 |
| Heat cycle (1000 cycle) | 20/20 | 0/20 |

[EXAMPLES 42–47]

Hydrogen-added styrene-ethylene-butylene-styrene copolymer (Shell Chemical Ltd., Kraton G-1652) as a main component was added to toluene and refluxed in a tri-necked flask equipped with a reflux condenser at 114° C., which is a reflux temperature of toluene, for 30 minutes. The toluene content was 80 wt %.

After the main component was dissolved, cresol novolac epoxy resin (Dainippon Ink Ltd., N-660) and a tackifier (Rika Hercules Ltd., Stebelight ester 10) including a hydrogen-added rosin ester resin were added to the solution. The mixture was mixed until a homogeneous mixture was obtained. After the varnish became homogeneous, the mixture was immediately cooled to the room temperature. After that, alumina powder (Adomatechs Ltd., Adomafine AO-500) was added so that its volume became 30 vol % of the dried varnish. The mixture was continuously mixed by a roller. Just before the mixing was completed, 10 parts of a cross-linking catalyst (Asahi Kasei Ltd., Novacure HX-3921) was added to 100 parts of epoxy resin to obtain an adhesive composition.

The amount of tackifier was changed to obtain 8 kinds of adhesive compositions as follows.

[EXAMPLE 42]

5 parts of tackifier was added to 100 parts of reactive thermoplastic resin which was the main component.

[EXAMPLE 43]

30 parts of tackifier was added to 100 parts of reactive thermoplastic resin which was the main component.

[EXAMPLE 44]

100 parts of tackifier was added to 100 parts of reactive thermoplastic resin which was the main component.

[EXAMPLE 45]

200 parts of tackifier was added to 100 parts of reactive thermoplastic resin which was the main component.

[EXAMPLE 46]

300 parts of tackifier was added to 100 parts of reactive thermoplastic resin which was the main component.

[EXAMPLE 47]

400 parts of tackifier was added to 100 parts of reactive thermoplastic resin which was the main component.

[Comparative Example 18]

3 parts of tackifier was added to 100 parts of reactive thermoplastic resin which was the main component.

[Comparative Example 19]

450 parts of tackifier was added to 100 parts of reactive thermoplastic resin which was the main component.

The adhesive compositions obtained were tested as follows.

(1) Adhesive strength

The adhesive composition was applied to an area of 10 mm×3 mm on a copper plate of 20 mm×20 mm by a screen printing method (thickness of 80 μm). The applied adhesive composition was dried at 80° C. for 20 minutes.

After a polyimide film of 10 mm×50 mm was compressed to the dried adhesive composition on the copper plate at 90° C. at 1 MPa for 20 seconds, the copper layer was left at 170° C. for 5 hours.

After that, a peel test was conducted at 90°. Also, after the adhesive composition was moistened in a pressure-cooker tester at 121° C. at 2 atm, the peel test was conducted.

(2) Moisture resistance

The above adhesive compositions were used in the insulating layer in the semiconductor device shown in FIG. 3 as follows.

The adhesive composition was applied to the substrate 110 on which a semiconductor element 16 was mounted. After that, the substrate 110 to which the adhesive composition had been applied was thermally treated to dry the adhesive composition. The wiring board connected to the semiconductor device 16 was attached to the substrate 110 by heat-pressing. After that, the frame body 28 was attached to the substrate 110. After the upper lid member 30 was attached to the frame body 28, the resin 42 was filled to produce the semiconductor device.

After the semiconductor devices produced in the above manner were left at 121° C. at 2 atm in a pressure-cooker tester, their wirings were tested (the total number of samples was 20 and the number of defective samples is shown in the form of a fraction).

(3) Thermal resistance

After the semiconductor devices using the above adhesive compositions as the insulating layer were produced, the thermal resistance was measured.

(4) Heat cycle test

The above adhesive composition were used as the insulating layer to produce the semiconductor device in the same manner described in the first embodiment. When molded on FR-4, a heat cycle test was conducted to evaluate damage to the solder and the semiconductor device. The test was conducted in a cycle, −65° C. for 30 minutes, room temperature for 20 minutes, 150° C. for 30 minutes (the total number of samples was 20 and the number of defective samples is shown in the form of a fraction).

The results are shown in TABLE 13 (1) and (2).

TABLE 13 (1)

|  | Ex42 | Ex43 | Ex44 | Ex45 | Ex46 | Ex47 |
|---|---|---|---|---|---|---|
| Main compone. [phr] | 100 | 100 | 100 | 100 | 100 | 100 |
| Epoxy resin [phr] | 20 | 20 | 20 | 20 | 20 | 20 |
| Stebelight [phr] | 5 | 30 | 100 | 200 | 300 | 400 |
| Peel strength [gf/cm] |  |  |  |  |  |  |
| aft.cure | 750 | 900 | 2000 | 1800 | 1500 | 830 |
| (mode) | coh. | coh. | coh. | coh. | coh. | coh. |
| aft.moistened | 700 | 1000 | 1900 | 1600 | 900 | 700 |
| (mode) | int. | coh. | coh. | coh. | coh. | coh. |
| Moisture Res. (aft. 500 hr) | 2/29 | 0/20 | 0/20 | 0/20 | 1/20 | 1/20 |
| Therm. Resist. [°C./W] | 45.8 | 44.5 | 42.3 | 40.8 | 40.0 | 40.2 |
| Heat cycle (1000 cycle) | 1/20 | 0/20 | 0/20 | 0/20 | 0/20 | 0/20 | coh. = cohesive failure, int = interface failure
Moisture Res. = Moisture Resistance
Therm. Resist = Thermal Resistance

TABLE 13 (2)

|  | Cp18 | Cp19 |
|---|---|---|
| Main compone. [phr] | 100 | 100 |
| Epoxy resin [phr] | 20 | 20 |
| Stebelight [phr] | 3 | 450 |
| Peel strength [gf/cm] |  |  |
| aft.cure | 600 | 400 |
| (mode) | int. | coh. |
| aft.moistened | 450 | 130 |
| (mode) | int. | coh. |
| Moisture Res. (aft. 500 hr) | 15/20 | 20/20 |
| Therm. Resist. [°C./W] | 48.6 | 40.6 |
| Heat cycle (1000 cycle) | 20/20 | 0/20 |

As can be seen from the TABLES 11–13, when styrene denatured copolymer (TABLE 11), β-pinene polymer (TABLE 12) or hydrogen-added rosin ester resin (TABLE 13) is added, the peel strength and the heat cycle resistance can be improved. Especially, when the amount thereof is 5–200 parts to 100 parts of the main component, wettability and stress relaxation at an interface of the adhesive composition is improved. When the amount added is 20–200 parts, advantage is revealed most significantly.

[EXAMPLES 48–53]

Hydrogen-added styrene-ethylene-butylene-styrene copolymer (Shell Chemical Ltd., Kraton G-1652) as a main component was added to toluene and refluxed in a tri-necked flask equipped with a reflux condenser at 114° C., which is a reflux temperature of toluene, for 30 minutes. The toluene content was 80 wt %.

After the main component was dissolved, biphenyl epoxy resin (Yuka Shell Chem., YX-4000H) and phenol novolac resin (Dainippon Ink Ltd., Bacum TD-2131) were added to the solution. The mixture was mixed until a homogeneous mixture was obtained. After the varnish became homogeneous, the mixture was immediately cooled to the room temperature. After that, alumina powder (Adomatechs Ltd., Adomafine AO-500) was added so that its volume become 30 vol % of the dried varnish. The mixture was continuously mixed by a roller. Just before the mixing was completed, 10 parts of a cross-linking catalyst (Asahi Kasei Ltd., Novacure HX-3921) was added to 100 parts of epoxy resin to obtain an adhesive composition.

The amounts of biphenyl epoxy resin and phenol novolac resin were varied to prepare 8 kinds of adhesive compositions as follows.

[EXAMPLE 48]

5 parts of biphenyl epoxy resin and 2 parts of phenol novolac resin were added to 100 parts of reactive thermoplastic resin.

[EXAMPLE 49]

30 parts of biphenyl epoxy resin and 15 parts of phenol novolac resin were added to 100 parts of reactive thermoplastic resin.

[EXAMPLE 50]

100 parts of biphenyl epoxy resin and 50 parts of phenol novolac resin were added to 100 parts of reactive thermoplastic resin.

[EXAMPLE 51]

200 parts of biphenyl epoxy resin and 100 parts of phenol novolac resin were added to 100 parts of reactive thermoplastic resin.

[EXAMPLE 52]

300 parts of biphenyl epoxy resin and 150 parts of phenol novolac resin were added to 100 parts of reactive thermoplastic resin.

[EXAMPLE 53]

400 parts of biphenyl epoxy resin and 200 parts of phenol novolac resin were added to 100 parts of reactive thermoplastic resin.

[Comparative Example 20]

3 parts of biphenyl epoxy resin and 1.5 parts of phenol novolac resin were added to 100 parts of reactive thermoplastic resin.

[Comparative Example 21]

450 parts of biphenyl epoxy resin and 225 parts of phenol novolac resin were added to 100 parts of reactive thermoplastic resin.

The adhesive compositions obtained were tested as follows.
(1) Adhesive strength The adhesive composition was applied to an area of 10 mm×3 mm on a copper plate of 20 mm×20 mm by a screen printing method (thickness of 80 $\mu$m). The applied adhesive composition was dried at 80° C. for 20 minutes.

After a polyimide film of 10 mm×50 mm was compressed to the dried adhesive composition on the copper plate at 90° C. at 1 MPa for 20 seconds, the copper layer was left at 170° C. for 5 hours.

After that, a peel test was conducted at 90°. Also, after the adhesive composition was moistened in a pressure-cooker tester at 121° C. at 2 atm, the peel test was conducted.
(2) Moisture resistance The above adhesive compositions were used in the insulating layer in the semiconductor device shown in FIG. 3, as follows.

The adhesive composition was applied to the substrate 110 on which a semiconductor element 16 was mounted. After that, the substrate 110 to which the adhesive composition had been applied was thermally treated to dry the adhesive composition. The wiring board connected to the semiconductor device 16 was attached to the substrate 110 by heat-pressing. After that, the frame body 28 was attached to the substrate 110. After the upper lid member 30 was attached to the frame body 28, the resin 42 was filled to produce the semiconductor device.

After the semiconductor devices produced in the above manner were left at 121° C. at 2 atm in a pressure-cooker tester, their wirings were tested (the total number of samples was 20 and the number of defective samples is shown in the form of a fraction).
(3) Solvent resistance The semiconductor device was produced, in which the above adhesive compositions were used as the insulating layer. After the semiconductor device was dipped in the n-dodecane for 24 hours, the state of adhesive layers were examined visually. The sample in which no change was found is represented by "+", the sample in which a part of the adhesive composition was dissolved is represented by "±", and the sample in which the adhesive layer was dissolved in the solvent was represented by "–" in TABLE 14 (1) and (2).
(4) Heat cycle test The above adhesive compositions were used as the insulating layer to produce the semiconductor device in the same manner described in the first embodiment. When molded on FR-4, a heat cycle test was conducted to evaluate damage to the solder and the semiconductor device. The test was conducted in a cycle, –65° C. for 30 minutes, room temperature for 20 minutes, 150° C. for 30 minutes (the total number of samples was 20 and the number of defective samples is shown in the form of a fraction).

The results are shown in TABLE 14 (1) and (2).

TABLE 14 (1)

|  | Ex48 | Ex49 | Ex50 | Ex51 | Ex52 | Ex53 |
|---|---|---|---|---|---|---|
| Main compone. [phr] | 100 | 100 | 100 | 100 | 100 | 100 |
| YX-4000H[phr] | 5 | 30 | 100 | 200 | 300 | 400 |
| TD-2131 [phr] | 2 | 15 | 50 | 100 | 150 | 200 |
| Peel strength [gf/cm] |  |  |  |  |  |  |
| aft.cure | 650 | 700 | 950 | 1000 | 900 | 800 |
| (mode) | coh. | coh. | coh. | coh. | int. | int. |
| aft.moistened | 550 | 650 | 830 | 900 | 900 | 800 |
| (mode) | int. | int. | coh. | coh. | int. | int. |
| Moisture Res. (aft. 500 hr) | 2/20 | 0/20 | 0/20 | 0/20 | 1/20 | 2/20 |
| Solvent Res. | + | + | + | + | + | + | coh. = cohesive failure, int = interface failure
Moisture Res. = Moisture Resistance
Solvent Res. = Solvent Resistance

TABLE 14 (2)

|  | Cp20 | Cp21 |
|---|---|---|
| Main compone. [phr] | 100 | 100 |
| YX-4000H [phr] | 3 | 450 |
| TD-2131 [phr] | 1.5 | 225 |
| Peel strength [gf/cm] |  |  |
| aft.cure | 550 | 350 |
| (mode) | int. | int. |

TABLE 14 (2)-continued

|  | Cp20 | Cp21 |
|---|---|---|
| aft.moistened | 450 | 200 |
| (mode) | int. | int. |
| Moisture Res. (aft. 500 hr) | 18/20 | 20/20 |
| Solvent Res. | − | + |

[EXAMPLES 54–59]

Hydrogen-added styrene-ethylene-butylene-styrene copolymer (Shell Chemical Ltd., Kraton G-1652) as a main component was added to toluene and refluxed in a tri-necked flask equipped with a reflux condenser at 114° C., which is a reflux temperature of toluene, for 30 minutes. The toluene content was 80 wt %.

After the main component was dissolved, epoxidated polybutadiene rubber (Daisel Chem. Ltd., Epolead PB3600) and phenol novolac resin (Dainippon Ink Ltd., Bacum TD-2131) were added to the solution. The mixture was mixed until a homogeneous mixture was obtained. After the varnish became homogeneous, the mixture was immediately cooled to the room temperature. After that, alumina powder (Adomatechs Ltd., Adomafine AO-500) was added so that its volume became 30 vol % of the dried varnish. The mixture was continuously mixed by a roller. Just before the mixing was completed, 10 parts of a cross-linking catalyst (Asahi Kasei Ltd., Novacure HX-3921) was added to 100 parts of epoxy resin to obtain an adhesive composition.

The amounts of epoxidated polybutadiene rubber and phenol novolac resin added were set to prepare 8 types of adhesive compositions as follows.

[EXAMPLE 54]

5 parts of epoxidated polybutadiene rubber and 2 parts of phenol novolac resin were added to 100 parts of reactive thermoplastic resin.

[EXAMPLE 55]

30 parts of epoxidated polybutadiene rubber and 15 parts of phenol novolac resin were added to 100 parts of reactive thermoplastic resin.

[EXAMPLE 56]

100 parts of epoxidated polybutadiene rubber and 50 parts of phenol novolac resin were added to 100 parts of reactive thermoplastic resin.

[EXAMPLE 57]

200 parts of epoxidated polybutadiene rubber and 100 parts of phenol novolac resin were added to 100 parts of reactive thermoplastic resin.

[EXAMPLE 58]

300 parts of epoxidated polybutadiene rubber and 150 parts of phenol novolac resin were added to 100 parts of reactive thermoplastic resin.

[EXAMPLE 59]

400 parts of epoxidated polybutadiene rubber and 200 parts of phenol novolac resin were added to 100 parts of reactive thermoplastic resin.

[Comparative Example 22]

3 parts of epoxidated polybutadiene rubber and 1.5 parts of phenol novolac resin were added to 100 parts of reactive thermoplastic resin.

[Comparative Example 23]

450 parts of epoxidated polybutadiene rubber and 225 parts of phenol novolac resin were added to 100 parts of reactive thermoplastic resin.

The obtained adhesive compositions were tested as follows.

(1) Adhesive strength

The adhesive composition was applied to an area of 10 mm×3 mm on a copper plate of 20 mm×20 mm by a screen printing method (thickness of 80 $\mu$m). The applied adhesive composition was dried at 80° C. for 20 minutes.

After a polyimide film of 10 mm×50 mm was compressed to the dried adhesive composition on the copper plate at 90° C. at 1 MPa for 20 seconds, the copper layer was left at 170° C. for 5 hours.

After that, a peel test was conducted at 90°. Also, after the adhesive composition was moistened in a pressure-cooker tester at 121° C. at 2 atm, the peel test was conducted.

(2) Moisture resistance

The above adhesive compositions were used in the insulating layer in the semiconductor device shown in FIG. 3, as follows.

The adhesive composition was applied to the substrate 110 on which a semiconductor element 16 was mounted. After that, the substrate 110 to which the adhesive composition had been applied was thermally treated to dry the adhesive composition. The wiring board connected to the semiconductor device 16 was attached to the substrate 110 by heat-pressing. After that, the frame body 28 was attached to the substrate 110. After the upper lid member 30 was attached to the frame body 28, the resin 42 was filled to produce the semiconductor device.

After the semiconductor devices produced in the above manner were left at 121° C. at 2 atm in a pressure-cooker tester, their wirings were tested (the total number of samples was 20 and the number of defective samples is shown in the form of a fraction).

(3) Solvent resistance

The semiconductor device was produced, in which the above adhesive compositions were used as the insulation layer. After the semiconductor device was dipped in the n-dodecane for 24 hours, the adhesive layer was visually examined. The sample in which no change was observed is represented by "+", the sample in which a part of the adhesive composition was dissolved is represented by "±", and the sample in which the adhesive layer was dissolved in the solvent is represented by "−" in TABLE 15.

(4) Heat cycle test

The above adhesive compositions were used as the insulating layer to produce the semiconductor device in the same manner described in the first embodiment. When molded on FR-4, heat cycle test was conducted to evaluate damage to the solder and the semiconductor device. The test was conducted in a cycle, −65° C. for 30 minutes, room temperature for 20 minutes, 150° C. for 30 minutes (the total number of samples was 20 and the number of defective samples is shown in the form of a fraction).

The results are shown in TABLE 15 (1) and (2).

TABLE 15 (1)

|  | Ex54 | Ex55 | Ex56 | Ex57 | Ex58 | Ex59 |
|---|---|---|---|---|---|---|
| Main compone. [phr] | 100 | 100 | 100 | 100 | 100 | 100 |
| Epolead [phr] | 5 | 30 | 100 | 200 | 300 | 400 |

TABLE 15 (1)-continued

|  | Ex54 | Ex55 | Ex56 | Ex57 | Ex58 | Ex59 |
|---|---|---|---|---|---|---|
| TD-2131 [phr] | 2 | 15 | 50 | 100 | 150 | 200 |
| Peel strength [gf/cm] | | | | | | |
| aft.cure | 800 | 970 | 1250 | 1500 | 1100 | 800 |
| (mode) | coh. | coh. | coh. | coh. | coh. | coh. |
| aft.moistened | 650 | 870 | 1100 | 1200 | 800 | 600 |
| (mode) | int. | coh. | coh. | coh. | coh. | int. |
| Moisture Res. (aft. 500 hr) | 2/20 | 0/20 | 0/20 | 0/20 | 1/20 | 2/20 |
| Solvent Res. | + | + | + | + | + | + |
| Heat cycle (1000 cycle) | 1/20 | 0/20 | 0/20 | 0/20 | 0/20 | 0/20 | coh. = cohesive failure, int = interface failure
Moisture Res. = Moisture Resistance
Solvent Res. = Solvent Resistance

TABLE 15 (2)

|  | Cp22 | Cp23 |
|---|---|---|
| Main compone. [phr] | 100 | 100 |
| Epolead [phr] | 3 | 450 |
| TD-2131 [phr] | 1.5 | 225 |
| Peel strength [gf/cm] | | |
| aft.cure | 650 | 400 |
| (mode) | int. | coh. |
| aft.moistened | 470 | 120 |
| (mode) | int. | int. |
| Moisture Res. (aft. 500 hr) | 18/20 | 20/20 |
| Solvent Res. | − | + |
| Heat cycle (1000 cycle) | 20/20 | 0/20 |

When biphenyl epoxy resin or epoxidated polybutadiene rubber was added as a cross-linking agent to the main component comprising the reactive thermoplastic resin, as shown in TABLES 14 and 15, the peel strength and the heat cycle resistance can be improved. Also, a solvent resistance can be improved.

When 5–400 parts of biphenyl epoxy resin or epoxidated polybutadiene rubber are added to 100 parts of the main component, the advantage can be recognized. The amount of biphenyl epoxy resin or epoxidated polybutadiene rubber is preferably in a range of 5–400 parts. When the amount is more than 400 parts, the adhesive composition is lost upon the thermal compression process and a sufficient thickness of the adhesive layer cannot be maintained causing a decreasing of the adhesive strength. When the amount is less than five parts, the cross-linking density is too low and the adhesive strength is insufficient to withstand the various heat and washing processes to which a semiconductor device will be exposed at the time of mounting. It is most preferable if the amount is 20–200 parts.

[EXAMPLES 60–64]

Hydrogen-added styrene-ethylene-butylene-styrene copolymer (Shell Chemical Ltd., Kraton G-1652) as a main component was added to toluene and refluxed in a tri-necked flask equipped with a reflux condenser at 114° C., which is a reflux temperature of toluene, for 30 minutes. The toluene content was 80 wt %.

After the main component was dissolved, cresole novolac resin (Dainippon Ink Ltd., N660), tackifier (Rika Hercules Ltd., Ha-kottaku 1149) and silicone resin (Shinetsu Silicone Co., FRX-01) which is a fire retardant were added to the solution. The mixture was mixed until a homogeneous mixture was obtained. After the varnish became homogeneous, the mixture was immediately cooled to the room temperature. After that, silica-coated aluminum nitride (produced by Dow Chemical Co.) was added and the mixture was continuously mixed by a roller. Just before the mixing was completed, 10 parts of a cross-linking catalyst (Asahi Kasei Ltd., Novacure HX-3921) was added to 100 parts of epoxy resin to obtain an adhesive composition.

The amounts of the silicone resin and filler added were set to prepare 9 types of adhesive compositions as follows.

[EXAMPLE 60]

20 parts of silicone resin and 5 vol % of filler of dried total weight were added to 100 parts of reactive thermoplastic resin.

[EXAMPLE 61]

20 parts of silicone resin and 20 vol % of filler of dried total weight were added to 100 parts of reactive thermoplastic resin.

[EXAMPLE 62]

20 parts of silicone resin and 30 vol % of filler of dried total weight were added to 100 parts of reactive thermoplastic resin.

[EXAMPLE 63]

20 parts of silicone resin and 40 vol % of filler of dried total weight were added to 100 parts of reactive thermoplastic resin.

[EXAMPLE 64]

20 parts of silicone resin and 50 vol % of filler of dried total weight were added to 100 parts of reactive thermoplastic resin.

[Comparative Example 24]

20 parts of silicone resin and 3 vol % of filler of dried total weight were added to 100 parts of reactive thermoplastic resin.

[Comparative Example 25]

20 parts of silicone resin and 55 vol % of filler of dried total weight were added to 100 parts of reactive thermoplastic resin.

[Comparative Example 26]

5 parts of silicone resin and 30 vol % of filler of dried total weight were added to 100 parts of reactive thermoplastic resin.

[Comparative Example 27]

200 parts of silicone resin and 30 vol % of filler of dried total weight were added to 100 parts of reactive thermoplastic resin.

The adhesive compositions obtained were tested as follows.

(1) Adhesive strength

The adhesive composition was applied to an area of 10 mm×3 mm on a copper plate of 20 mm×20 mm by a screen printing method (thickness of 80 $\mu$m). The applied adhesive composition was dried at 80° C. for 20 minutes.

After a polyimide film of 10 mm×50 mm was compressed to the dried adhesive composition on the copper plate at 90°

C. at 1 MPa for 20 seconds, the copper layer was left at 170° C. for 5 hours.

After that, a peel test was conducted at 90°. Also, after the adhesive composition was moistened in a pressure-cooker tester at 121° C. at 2 atm, the peel test was conducted.

(2) Moisture resistance

The above adhesive compositions were used in the insulating layer in the semiconductor device shown in FIG. 3 as follows.

The adhesive composition was applied to the substrate 110 on which a semiconductor element 16 was mounted. After that, the substrate 110 to which the adhesive composition had been applied was thermally treated to dry the adhesive composition. The wiring board connected to the semiconductor element 16 was attached to the substrate 110 by heat-pressing. After that, the frame body 28 was attached to the substrate 110. After the upper lid member 30 was attached to the frame body 28, the resin 42 was filled to produce the semiconductor device.

After the semiconductor devices produced in the above manner were left at 121° C. at 2 atm in a pressure-cooker tester, their wirings were tested (the total number of samples was 20 and the number of defective samples is shown in the form of a fraction).

(3) Thermal resistance

After the semiconductor devices using the above adhesive compositions as the insulating layer were produced, the thermal resistance was measured.

(4) Combustibility test

The above adhesive composition was applied to the aluminum plate (20 mm×100 mm, 0.8 mm in thickness) with approximately 80-μm coating thickness and dried. After that, combustibility tests of the prepared samples are conducted according to UL94 vertical combustibility test. DP represents a time required for dripping after the sample was exposed to flame. SE represents a time required for self extinguishing. As the value of DP decreases, the combustibility increases and as the value of SE decreases, the combustibility decreases.

The results are shown in TABLE 16 (1) and (2).

TABLE 16 (1)

|  | Ex60 | Ex61 | Ex62 | Ex63 | Ex64 |
|---|---|---|---|---|---|
| Main compone. [phr] | 100 | 100 | 100 | 100 | 100 |
| Epoxy resin [phr] | 20 | 20 | 20 | 20 | 20 |
| Tackifier [phr] | 30 | 30 | 30 | 30 | 30 |
| Silicone resin [phr] | 20 | 20 | 20 | 20 | 20 |
| Filler [vol %] | 5 | 20 | 30 | 40 | 50 |
| Peel strength [gf/cm] |  |  |  |  |  |
| aft.cure | 2250 | 2200 | 2100 | 2000 | 1800 |
| (mode) | coh. | coh. | coh. | coh. | coh. |
| aft.moistened | 2200 | 2100 | 2000 | 1900 | 1650 |
| (mode) | int. | coh. | coh. | coh. | coh. |
| Moisture Res. (aft. 500 hr] | 1/20 | 0/20 | 0/20 | 0/20 | 1/20 |
| Therm. Resist. [°C./W] | 45.3 | 43.3 | 42.5 | 41.3 | 40.3 |
| Combustibility |  |  |  |  |  |
| 1st combus. | SE(10) | SE(8) | SE(5) | SE(3) | SE(3) |
| 2nd combus. | DP(8) | DP(8) | SE(4) | SE(2) | SE(2) | coh. = cohesive failure, int = interface failure
Moisture Res. = Moisture Resistance
Therm. Resist = Thermal Resistance

TABLE 16 (2)

|  | Cp24 | Cp25 | Cp26 | Cp27 |
|---|---|---|---|---|
| Main compone. [phr] | 100 | 100 | 100 | 100 |
| Epoxy resin [phr] | 20 | 20 | 20 | 20 |
| Tackifier [phr] | 30 | 30 | 30 | 30 |
| Silicone resin [phr] | 20 | 20 | 5 | 200 |
| Filler [vol%] | 3 | 55 | 30 | 30 |
| Peel strength [gf/cm] |  |  |  |  |
| aft.cure | 2250 | 1500 | 2300 | 300 |
| (mode) | coh. | int. | coh. | int. |
| aft.moistened | 2200 | 800 | 2200 | 300 |
| (mode) | int. | int. | coh. | int. |
| Moisture Res. (aft. 500 hr) | 1/20 | 8/20 | 0/20 | 9/20 |
| Therm. Resist. [°C./W] | 45.8 | 40.6 | 42.5 | 42.5 |
| Combustibility |  |  |  |  |
| 1st combus. | DP(24) | SE(2) | DP(14) | SE(2) |
| 2nd combus. | DP(14) | SE(2) | DP(10) | SE(2) |

As shown in the TABLE 16, non-combustibility of an adhesive composition can be improved by adding silicone resin. This is because silicone is oxidized during a combustion to a silicon oxide layer, which improves drip-prevention and non-combustibility characteristics of an adhesive composition.

The amount of silicone resin is preferably in the range of 5–200 parts to 100 parts of the main component. When the amount of the silicone resin is less than 5 parts, a curing of an adhesive composition does not occur. When the amount of the silicone resin is more than 200 parts, adhesive strength is lowered.

When aluminum nitride powder covered with a silicon oxide is used as a filler, the filler is prevented from being adsorbed by styrene-ethylene/butylene-styrene copolymer. Also, thermal conductivity of the adhesive composition can be improved and a hydrolysis of the aluminum nitride due to the moisture can be prevented.

[EXAMPLES 65–66]

Hydrogen-added styrene-ethylene-butylene-styrene copolymer (Shell Chemical Ltd., Kraton G-1652) as a main component was added to toluene and refluxed in a tri-necked flask equipped with a reflux condenser at 114° C., which is a reflux temperature of toluene, for 30 minutes. The toluene content was 80 wt %.

Figure 6A:
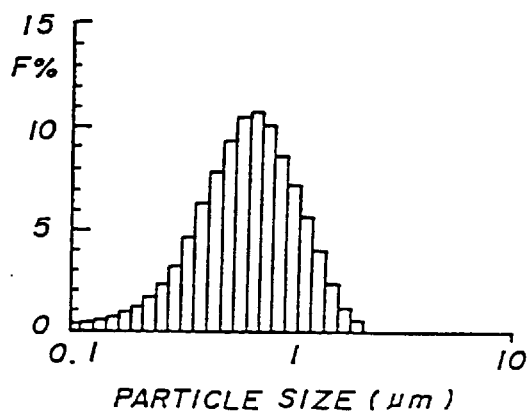
FIG. 6A shows a particle distribution of alumina AO-502.
Figure 6B:
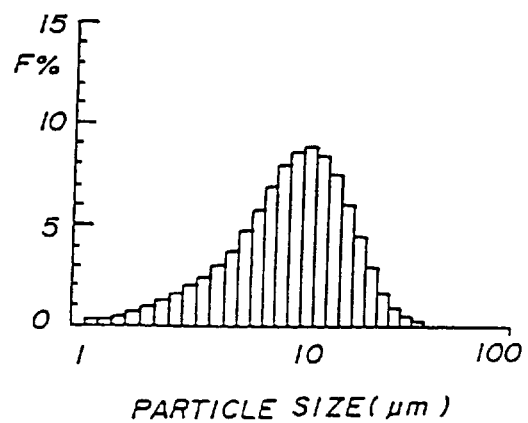
FIG. 6B shows a particle distribution of alumina AO-509.

After the main component was dissolved, 20 parts of cresol novolac epoxy resin (Dainippon Ink Ltd., N-660) and 100 parts of tackifier (Rika Hercules, Stebelight ester10) were added to 100 parts of the main component. The mixture was stirred until a homogeneous mixture was obtained. After the varnish became homogeneous, the mixture was immediately cooled to the room temperature. After that, spherical alumina (Admatech, AO-509, powder less than 1 μm excluded) and spherical alumina of average diameter 0.7 μm (Admatech, AO-502), whose particle distributions are shown in FIG. 6(B) and FIG. 6(A), respectively, were added to the varnish with their ratio as shown in TABLE 18 so that the amount after drying becomes 30 vol % of the varnish. The mixture was continuously stirred and just before the mixing was completed, 10 parts of a cross-linking catalyst (Asahi Kasei Co., Novacure HX-3921) was added to 100 parts of epoxy resin to obtain an adhesive composition.

[Comparative Examples 28–30]

Hydrogen-added styrene-ethylene-butylene-styrene copolymer (Shell Chemical Ltd., Kraton G-1652) as a main component was added to toluene and refluxed in a tri-necked flask equipped with a reflux condenser at 114° C., which is a reflux temperature of toluene, for 30 minutes. The toluene content was 80 wt %.

After the main component was dissolved, 20 parts of cresol novolac epoxy resin (Dainippon Ink Ltd., N-660) and 100 parts of tackifier (Rika Hercules, Stebelight ester 10) were added to 100 parts of the main component. The mixture was stirred until a homogeneous mixture was obtained. After the varnish became homogeneous, the mixture was immediately cooled to the room temperature. After that, spherical alumina (Admatech, AO-509, powder less than 1 μm excluded) and spherical alumina of average diameter 0.7 μm (Admatech, AO-502), each of whose particle distribution is shown in FIG. 6(B) and FIG. 6(A), respectively, with their ratio as shown in TABLE 18 (Ex65 and 66 and Cp 28 and 29), or non-spherical alumina (Showa Denko Ltd., AS-40) (Cp30) was added to the varnish so that the amount after drying became 30 vol % of the varnish. A particle size distribution of the AS-40 is shown in TABLE 17. The mixture was continuously stirred and just before the mixing was completed, 10 parts of a cross-linking catalyst (Asahi Kasei Co., Novacure HX-3921) was added to 100 parts of epoxy resin to obtain an adhesive composition.

The adhesive compositions obtained were tested as follows.

(1) Adhesive strength

The adhesive composition was applied to an area of 10 mm×3 mm on a copper plate of 20 mm×20 mm by a screen printing method (thickness of 80 μm). The applied adhesive composition was dried at 80° C. for 20 minutes.

After a polyimide film of 10 mm×50 mm was compressed to the dried adhesive composition on the copper plate at 90° C. at 1 MPa for 20 seconds, the copper layer was left at 170° C. for 5 hours.

After that, a peel test was conducted at 90°. Also, after the adhesive composition was moistened at 121° C. at 100% RH for 48 hr in a pressure-cooker tester, the peel test was conducted.

After the semiconductor device produced in the above manner was left at 121° C. at 2 atm in a pressure-cooker tester, wirings were tested.

(3) Thermal resistance

After the semiconductor devices using the above adhesive compositions as the insulating layer were produced, the thermal resistance was measured.

The results are shown in TABLE 18.

TABLE 17

| particle size[μm] | cumulative distribution[%] |
|---|---|
| ~10 | 44 |
| 10~20 | 20 |
| 20~30 | 13 |

D50 = 13.1 μm

TABLE 18

|  | Ex65 | Ex66 | Cp28 | Cp29 | Cp30 |
|---|---|---|---|---|---|
| Main compone. [phr] | 100 | 100 | 100 | 100 | 100 |
| Epoxy resin [phr] | 20 | 20 | 20 | 20 | 20 |
| Stebelight [phr] | 100 | 100 | 100 | 100 | 100 |
| D50 of filler [μm] | 7 | 6.7 | 6.3 | 6.0 | AS-40 was added |
| D5 of filler [μm] | <φ1 was excluded | 1 | 0.9 | 0.5 | AS-40 was added |
| Shape of filler | sph. | sph. | sph. | sph. | non-sph. |
| Peel strength [gf/cm] |  |  |  |  |  |
| aft.cure | 2000 | 1800 | 1800 | 1780 | 1700 |
| (mode) | coh. | coh. | coh. | coh. | coh. |
| aft.moistened | 1950 | 1700 | 1500 | 900 | 1200 |
| (mode) | coh. | coh. | int. | int. | int. |
| Therm. Resist. [°C./W] | 42.8 | 43.6 | 45.5 | 47.5 | 46.3 | sph. = spherical,
coh. = cohesive failure, int = interface failure
Therm. Resist = Thermal Resistance As shown in TABLE 18, the flow of adhesive composition upon compression is improved by using a spherical shape of the filler, compared with the cases in which non-spherical fillers are used. Thus, the viscosity of an adhesive composition suitable for obtaining excellent wettability at an interface may easily be obtained.

[EXAMPLE 67]

Fused silica (Denki Kagaku Co., FB-6S) and τ-glycidoxypropyl triethoxy silane with the ratio (by weight) of 100:1 were dry-blended by using a high-speed mixer. After that, in order to carry out the coupling process of a filler, the resultant silica was left for 24 hours at room temperature.

Hydrogen-added styrene-ethylene-butylene-styrene copolymer (Shell Chemical Ltd., Kraton G-1652) as a main component was added to toluene and refluxed in a tri-necked flask equipped with a reflux condenser at 114° C., which is a reflux temperature of toluene, for 30 minutes. The toluene content was 80 wt %.

After the main component was dissolved, cresol novolac epoxy resin (Dainippon Ink Ltd., N-660) as a cross-linking agent and tackifier (Rika Hercules, Stebelight ester 10) were added to the main component. The mixture was stirred until a homogeneous mixture was obtained. After the varnish became homogeneous, the mixture was immediately cooled to the room temperature. After that, the above fused silica having undergone a coupling process was added to the varnish. The mixture was continuously stirred and just before the mixing was completed, 10 parts of a cross-linking catalyst (Asahi Kasei Co., Novacure HX-3921) was added to 100 parts of epoxy resin to obtain an adhesive composition.

[Comparative Example 31]

Hydrogen-added styrene-ethylene-butylene-styrene copolymer (Shell Chemical Ltd., Kraton G-1652) as a main component was added to toluene and refluxed in a tri-necked flask equipped with a reflux condenser at 114° C., which is a reflux temperature of toluene, for 30 minutes. The toluene content was 80 wt %.

After the main component was dissolved, cresol novolac epoxy resin (Dainippon Ink Ltd., N-660) as a cross-linking agent and a tackifier (Rika Hercules, Stebelight ester 10) were added to the main component. The mixture was stirred until a homogeneous mixture was obtained. After the varnish became homogeneous, the mixture was immediately cooled to the room temperature. After that, fused silica not having undergone a coupling process was added to the varnish. The mixture was continuously stirred and just before the mixing was completed, 10 parts of a cross-linking catalyst (Asahi Kasei Co., Novacure HX-3921) was added to 100 parts of epoxy resin to obtain an adhesive composition.

The adhesive compositions obtained were tested as follows.

(1) Micro-cracks

The presence and absence of micro-cracks were confirmed by using an SEM.

(2) Popcorn-cracks

The adhesive composition was applied and LSI packages were constructed. After carrying out a moisture-absorption process under the condition of 85° C. at 85% RH for 24 hr, the presence of popcorn cracks in the adhesive layer was observed after the package had been mounted on a mounting board. At that time, a generation of electrical shorts between wirings was also examined by carrying out a pressurecooker test (121° C. at 85% RH for 500 hr) with an applying bias of 7 volts (the total number of samples was 20 and the number of defective samples is shown in the form of a fraction).

The results are shown in TABLE 19.

TABLE 19

|  | Ex67 | Cp31 |
| --- | --- | --- |
| Main compone. [phr] | 100 | 100 |
| Epoxy resin [phr] | 20 | 20 |
| Tackifier [phr] | 30 | 30 |
| Filler | couple | non-couple |
| Micro-crack | nil | present |
| Popcorn crack | nil | present |
| Elect. short | 0/20 | 20/20 |

As shown in TABLE 19, when the coupled filler was added to the adhesive composition, neither micro-cracks nor popcorn cracks were generated. On the other hand, they were present when the adhesive composition to which the non-coupled filler had been added was used and electrical shorts between wirings were found in 20 out of 20 samples in that case. Therefore, it is obvious that a non-cracking characteristic of an adhesive composition is improved by the addition of the coupled filler and the reliability of the package can also be increased by the addition of such a filler.

[EXAMPLES 68–72, COMPARATIVE EXAMPLES 32 and 33]

Maleic acid modified styrene-ethylene/butylene-styrene copolymer (Shell Chemical Ltd., Kraton G-1901X) as a main component was added to toluene and refluxed in a tri-necked flask equipped with a reflux condenser at 114° C., which is a reflux temperature of toluene, for 30 minutes. The toluene content was 80 wt %.

After the main component was dissolved, 30 parts by weight (with respect to the 100 parts by weight of main component) of cresol novolac epoxy resin (Dainippon Ink Ltd., N-660) and 50 parts by weight of a tackifier (Rika Hercules Ltd., Ha-kotakku 1149) were added to the solution. The mixture was stirred until a homogeneous mixture was obtained. After the varnish became even, the mixture was immediately cooled to the room temperature. After that, alumina powder (Adomatechs Ltd., Adomafine AO-500) was added so that its volume become 30 vol % of the dried varnish. The mixture was continuously mixed by rollers. Just before the mixing was completed, 0.1 parts by weight (with respect to 100 parts by weight of the main component) of triphenylphosphine was added to obtain an adhesive composition.

The method disclosed in the Japanese Laid-Open Patent Application No. 5-182515 was used to cover triphenylphosphine with thermoplastic resin. First, 20 grams of thermoplastic resin (Asahi Kasei Gosei Co., Asahi Melt M2500) was dissolved in 60 ml of methylethylketone and then triphenylphosphine (K.I Kasei Co., PP-360), which had been ground to a size of $\leq 20$ μm, was added. After that, the mixture was stirred using a homogenizer at a rotation speed of 5000 rpm and methanol was added to the stirred solution. A milk-colored liquid was obtained. Then the solvent was separated from the liquid and drying of the residue yielded triphenylphosphine covered with the thermoplastic resin.

Seven different kinds of adhesive compositions were produced by varying the amount of the cross-linking catalyst (and epoxy resin in example 72) as shown below.

[EXAMPLE 68]

0.1 part of a cross-linking catalyst comprising triphenylphosphine covered with thermoplastic resin was added to 100 parts of the thermoplastic resin which is a main component.

[EXAMPLE 69]

1.0 part of the cross-linking catalyst comprising triphenylphosphine covered with thermoplastic resin was added to 100 parts of the thermoplastic resin which is a main component.

[EXAMPLE 70]

3.0 parts of the cross-linking catalyst comprising triphenylphosphine covered with thermoplastic resin was added to 100 parts of the thermoplastic resin which is a main component.

[EXAMPLE 71]

5.0 parts of the cross-linking catalyst comprising triphenylphosphine covered with thermoplastic resin was added to 100 parts of the thermoplastic resin which is a main component.

[EXAMPLE 72]

10.0 parts of the cross-linking catalyst comprising triphenylphosphine covered with thermoplastic resin was added to 100 parts of the thermoplastic resin which is a main component.

[Comparative Example 32]

0.05 part of the cross-linking catalyst comprising triphenylphosphine covered with thermoplastic resin was added to 100 parts of the thermoplastic resin which is a main component.

[Comparative Example 33]

11.0 parts of the cross-linking catalyst comprising triphenylphosphine covered with thermoplastic resin was added to 100 parts of the thermoplastic resin which is a main component.

The adhesive compositions obtained were tested as follows.
(1) Adhesive strength The adhesive composition was applied to an area of 10 mm×3 mm on a copper plate of 20 mm×20 mm by a screen printing method (thickness of 80 μm). The applied adhesive composition was dried at 80° C. for 20 minutes.

After a polyimide film of 10 mm×50 mm was compressed to the dried adhesive composition on the copper plate at 90° C. at 1 MPa for 20 seconds, the copper layer was left at 170° C. for 5 hours.

After that, a peel test was conducted at 90°. Also, after the adhesive composition was moistened at 85° C. at 85% RH for 48 hours, the peel test was conducted.
(2) Moisture resistance The above adhesive compositions were used in the insulating layer in the semiconductor device shown in FIG. 3 as follows.

The adhesive composition was applied to the substrate 110 on which a semiconductor element 16 was mounted. After that, the substrate 110 to which the adhesive composition had been applied was thermally treated to dry the adhesive composition. The wiring board connected to the semiconductor device 16 was attached to the substrate 110 by heat-pressing. After that, the frame body 28 was adhered to the substrate 110. After the upper lid member 30 was attached to the frame body 28, the resin 42 was filled to produce the semiconductor device.

After the semiconductor devices produced in the above manner were left at 121° C./100% RH for 500 hours in a pressure-cooker tester, their wirings were tested (the total number of samples was 20 and the number of defective samples is shown in the form of a fraction).

The results are shown in TABLE 20.

TABLE 20

|  | Ex68 | Ex69 | Ex70 | Ex71 | Ex72 | Cp32 | Cp33 |
|---|---|---|---|---|---|---|---|
| Main compone. [phr | 100 | 100 | 100 | 100 | 100 | 100 | 100 |
| Epoxy resin [phr] | 30 | 30 | 30 | 30 | 20 | 30 | 30 |
| Tackifier[phr] | 50 | 50 | 50 | 50 | 50 | 50 | 50 |
| Cross-link.Agt [phr] | 0.1 | 1.0 | 3.0 | 5.0 | 10.0 | 0.01 | 11.0 |
| Peel strength [gf/cm] |  |  |  |  |  |  |  |
| aft.cure | 3000 | 2900 | 2500 | 2000 | 1950 | 3000 | 1200 |
| aft.moistened | 2000 | 2500 | 2200 | 1900 | 1800 | 800 | 300 |
| Moisture Res. (aft. 500 hr) | 0/20 | 0/20 | 0/20 | 0/20 | 0/20 | 20/20 | 20/20 |

As can be seen from EXAMPLES 68–72 in the above TABLE 20, it is found that when the adhesive composition comprising thermoplastic resin, epoxy resin, tackifier and cross-linking catalyst in which triphenylphosphine is covered with thermoplastic resin is used, high adhesive strength, even after the exposure to moisture, and a semiconductor device having high moisture reliability may be obtained.

That is, by the addition of the cross-linking catalyst, a deterioration of the peel strength after absorbing moisture can be reduced and by setting the amount of triphenylphosphine covered with thermoplastic resin added to 0.1–10.0 parts with respect to 100 parts of the main component, the moisture resistance can be improved, as shown in EXAMPLES 68–72.

On the other hand, as can be seen from the result of the COMPARATIVE EXAMPLES 32 and 33 in the TABLE 20, it was found that when the amount of the cross-linking agent added is less than about 0.1 part or more than about 11.0 parts by weight, moisture resistance of the adhesive composition is reduced and only a semiconductor of low reliability is obtained.

[EXAMPLES 73–77, COMPARATIVE EXAMPLES 34 and 35]

Maleic acid modified styrene-ethylene/butylene-styrene copolymer (Shell Chemical Ltd., Kraton G-1901X) as a main component was added to toluene and refluxed in a tri-necked flask equipped with a reflux condenser at 114° C., which is a reflux temperature of toluene, for 30 minutes. The toluene content was 80 wt %.

After the main component was dissolved, 30 parts by weight (with respect to the 100 parts by weight of main component) of cresol novolac epoxy resin (Dainippon Ink Ltd., N-660) and 50 parts by weight of tackifier (Rika Hercules Ltd., Ha-kotakku 1149) were added to the solution. The mixture was stirred until a homogeneous mixture was obtained. After the varnish became even, the mixture was immediately cooled to the room temperature. After that, alumina powder (Adomatechs Ltd., Adomafine AO-500) was added so that its volume become 30 vol % of the dried varnish. The mixture was continuously mixed by rollers. Just before the mixing was completed, 0.1 part by weight (with respect to 100 parts by weight of the main component) of (1,3-dioxane-2-ylethyl)triphenylphosphonium bromide as a quaternary salt of organophosphorus compound having aryl groups was added to obtain an adhesive composition.

Seven different kinds of adhesive compositions were produced by varying the amount of the cross-linking catalyst (and epoxy resin in example 77) as shown below.

[EXAMPLE 73]

0.1 part of a cross-linking catalyst comprising (1,3-dioxane-2-ylethyl)triphenylphosphonium bromide was added to 100 parts of the thermoplastic resin which is a main component.

[EXAMPLE 74]

1.0 part of the cross-linking catalyst comprising (1,3-dioxane-2-ylethyl)triphenylphosphonium bromide was added to 100 parts of the thermoplastic resin which is a main component.

[EXAMPLE 75]

5.0 parts of the cross-linking catalyst comprising (1,3-dioxane-2-ylethyl)triphenylphosphonium bromide was added to 100 parts of the thermoplastic resin which is a main component.

[EXAMPLE 76]

10.0 parts of the cross-linking catalyst comprising (1,3-dioxane-2-ylethyl)triphenylphosphonium bromide was added to 100 parts of the thermoplastic resin which is a main component.

[EXAMPLE 77]

20.0 parts of the cross-linking catalyst comprising (1,3-dioxane-2-ylethyl)triphenylphosphonium bromide was added to 100 parts of the thermoplastic resin which is a main component.

[Comparative Example 34]

0.05 part of the cross-linking catalyst comprising (1,3-dioxane-2-ylethyl)triphenylphosphonium bromide was added to 100 parts of the thermoplastic resin which is a main component.

[Comparative Example 35]

21.0 parts of the cross-linking catalyst comprising (1,3-dioxane-2-ylethyl)triphenylphosphonium bromide was added to 100 parts of the thermoplastic resin which is a main component.

The adhesive compositions obtained were tested as follows.

(1) Adhesive strength

The adhesive composition was applied to an area of 10 mm×3 mm on a copper plate of 20 mm×20 mm by a screen printing method (thickness of 80 μm). The applied adhesive composition was dried at 80° C. for 20 minutes.

After a polyimide film of 10 mm×50 mm was compressed to the dried adhesive composition on the copper plate at 90° C. at 1 MPa for 20 seconds, the copper layer was left at 170° C. for 5 hours.

After that, a peel test was conducted at 90°. Also, after the adhesive composition was moistened at 85° C. at 85% RH for 48 hours, the peel test was conducted.

(2) Moisture resistance

The above adhesive compositions were used in the insulating layer in the semiconductor device shown in FIG. 3 as follows.

The adhesive composition was applied to the substrate 110 on which a semiconductor element 16 was mounted. After that, the substrate 110 to which the adhesive composition had been applied was thermally treated to dry the adhesive composition. The wiring board connected to the semiconductor device 16 was attached to the substrate 110 by heat-pressing. After that, the frame body 28 was adhered to the substrate 110. After the upper lid member 30 was attached to the frame body 28, the resin 42 was filled to produce the semiconductor device.

After the semiconductor devices produced in the above manner were left at 121° C./100% RH for 500 hours in a pressure-cooker tester, their wirings were tested (the total number of samples was 20 and the number of defective samples is shown in the form of a fraction).

The results are shown in TABLE 21.

TABLE 21

|  | Ex73 | Ex74 | Ex75 | Ex76 | Ex77 | Cp34 | Cp35 |
|---|---|---|---|---|---|---|---|
| Main compone. [phr] | 100 | 100 | 100 | 100 | 100 | 100 | 100 |
| Epoxy resin [phr] | 30 | 30 | 30 | 30 | 20 | 30 | 30 |
| Tackifier[phr] | 50 | 50 | 50 | 50 | 50 | 50 | 50 |
| cross-link.Agt [phr] | 0.1 | 1.0 | 5.0 | 10.0 | 20.0 | 0.05 | 21.0 |
| Peel strength [gf/cm] |  |  |  |  |  |  |  |
| aft.cure | 3100 | 3000 | 2800 | 2300 | 1900 | 3100 | 1100 |
| aft.moistened | 2100 | 2400 | 2500 | 1900 | 1800 | 800 | 200 |
| Moisture Res. (aft. 500 hr) | 0/20 | 0/20 | 0/20 | 0/20 | 0/20 | 20/20 | 20/20 |

[EXAMPLE 78]

Maleic acid modified styrene-ethylene/butylene-styrene copolymer (Shell Chemical Ltd., Kraton G-1901X) as a main component was added to toluene and refluxed in a tri-necked flask equipped with a reflux condenser at 114° C., which is a reflux temperature of toluene, for 30 minutes. The toluene content was 80 wt %.

After the main component was dissolved, 30 parts by weight (with respect to the 100 parts by weight of the main component) of cresol novolac epoxy resin (Dainippon Ink Ltd., N-660) and 50 parts by weight of a tackifier (Rika Hercules Ltd., Ha-kotakku 1149) were added to the solution. The mixture was stirred until a homogeneous mixture was obtained. After the varnish became even, the mixture was immediately cooled to the room temperature. After that, alumina powder (Adomatechs Ltd., Adomafine AO-500) was added so that its volume become 30 vol % of the dried varnish. The mixture was continuously mixed by rollers. Just before the mixing was completed, 0.1 part by weight (with respect to 100 parts by weight of the main component) of trimethatolylphosphine (Hokko Chemical Industry Co., Ltd) as a cross-linking catalyst having a melting point in the range of 100° C. to 200° C. was added to obtain an adhesive composition.

The adhesive composition obtained was tested as follows.

(1) Adhesive strength

The adhesive composition was applied to an area of 10 mm×3 mm on a copper plate of 20 mm×20 mm by a screen printing method (thickness of 80 μm). The applied adhesive composition was dried at 80° C. for 20 minutes.

After a polyimide film of 10 mm×50 mm was compressed to the dried adhesive composition on the copper plate at 90° C. at 1 MPa for 20 seconds, the copper layer was left at 170° C. for 5 hours.

After that, a peel test was conducted at 90°. Also, after the adhesive composition was moistened at 85° C. at 85% RH for 48 hours, the peel test was conducted.

(2) Moisture resistance

The above adhesive composition was used in the insulating layer in the semiconductor device shown in FIG. 3 as follows.

The adhesive composition was applied to the substrate 110 on which a semiconductor element 16 was mounted. After that, the substrate 110 to which the adhesive composition had been applied was thermally treated to dry the adhesive composition. The wiring board connected to the semiconductor device 16 was attached to the substrate 110 by heat-pressing. After that, the frame body 28 was adhered to the substrate 110. After the upper lid member 30 was attached to the frame body 28, the resin 42 was filled to produce the semiconductor device.

After the semiconductor device produced in the above manner was left at 121° C./100% RH for 500 hours in a pressure-cooker tester, its wirings were tested (the total number of samples was 20 and the number of defective samples is shown in the form of a fraction).

The results are shown in TABLE 22.

TABLE 22

|  | Ex78 |
|---|---|
| Main compone. [phr] | 100 |
| Epoxy resin [phr] | 30 |
| Tackifier [phr] | 50 |
| Cross-link.Agt [phr] | 0.1 |
| Peel strength [gf/cm] |  |
| aft.cure | 2000 |
| aft.moistened | 1800 |
| Moisture Res. (aft. 500 hr) | 0/20 |

As can be seen from EXAMPLES 73–78 in the above TABLES 20 and 21, it is found that when the adhesive composition comprising a thermoplastic resin, an epoxy resin, a tackifier and a cross-linking catalyst according to the present invention of suitable amounts is used, a high adhesive strength, even after exposure to moisture, and a semiconductor device having a high moisture reliability may be obtained.

That is, by the addition of the cross-linking catalyst, a deterioration of the peel strength after absorbing moisture can be reduced and by setting the amount of a quaternary salt of organophosphorus compound having aryl groups added to 0.1–20.0 parts with respect to 100 parts of the main component, the moisture resistance can be improved, as shown in EXAMPLES 73–77.

On the other hand, as can be seen from the result of the COMPARATIVE EXAMPLES 34 and 35 in the TABLE 20, it was found that when the amount of the cross-linking agent added is less than about 0.1 or more than about 21.0 parts by weight, moisture resistance of the adhesive composition is reduced and only a semiconductor of low reliability is obtained.

Further, the present invention is not limited to these examples, but various variations and modifications may be made without departing from the scope of the present invention.

What is claimed is:

1. A semiconductor device comprising:
   a substrate,
   a semiconductor element mounted on said substrate, and
   a wiring layer for connecting said semiconductor element to an outer lead portion,
   wherein an adhesive layer is provided one of between said substrate and said semiconductor element, between said substrate and said wiring layer, and between said substrate and said semiconductor element and between said substrate and said wiring layer, and said adhesive layer is comprised of an adhesive composition comprising:
      a main component including a resin material,
      a solvent for dissolving said main component, and
      a filler added to said main component,
      wherein said filler has a particle size so as to make a concavo-convex depth of a surface of said adhesive composition equal to or less than 15 $\mu$m after said adhesive composition is applied to an adherend and dried in order to evaporate said solvent before a thermocompression process.

2. The semiconductor device as claimed in claim 1 further comprising a frame body provided so as to surround said semiconductor element, wherein said adhesive layer is provided between said wiring layer and said frame body.

3. The semiconductor device as claimed in claim 1, wherein a heat releasing structure is formed on said substrate and said adhesive layer is also provided between said heat releasing structure and said substrate.

4. A semiconductor device comprising:
   a substrate,
   a semiconductor element mounted on said substrate, and
   a wiring layer for connecting said semiconductor element to an outer lead portion,
   wherein an adhesive layer is provided one of between said substrate and said semiconductor element, between said substrate and said wiring layer, between said substrate and said semiconductor element and between said substrate and said wiring layer, and said adhesive layer is comprised of an adhesive composition comprising:
      a main component comprising a reactive thermoplastic resin,
      a flexibilizer comprising reactive silicone, and
      a solvent for dissolving said main component and said flexibilizer,
      wherein said main component is reacted with said flexibilizer before being applied to an adherend and said adhesive composition is dried in order to evaporate said solvent before a thermocompression process.

5. A semiconductor device comprising:
   a substrate,
   a semiconductor element mounted on said substrate, and
   a wiring layer for connecting said semiconductor element to an outer lead portion,
   wherein an adhesive layer is provided one of between said substrate and said semiconductor element, between said substrate and said wiring layer, between said substrate and said semiconductor element and between said substrate and said wiring layer, and said adhesive layer is comprised of an adhesive composition comprising:
      a main component comprising a reactive thermoplastic resin,
      a cross-linking agent comprising epoxy resin having at least two epoxy groups,
      an additive comprising polyallylphenol, and
      a solvent for dissolving said main component, said cross-linking agent and said additive, wherein said adhesive composition is applied to an adherend and dried in order to evaporate said solvent before a thermocompression process.

6. A semiconductor device comprising:
   a substrate,
   a semiconductor element mounted on said substrate, and
   a wiring layer for connecting said semiconductor element to an outer lead portion,
   wherein an adhesive layer is provided one of between said substrate and said semiconductor element, between said substrate and said wiring layer, between said substrate and said semiconductor element and between said substrate and said wiring layer, and said adhesive layer is comprised of an adhesive composition comprising:
      a main component comprising ethylene-propylene terpolymer having one of dicyclopentadiene and ethylidene norbornene as a third component,
      a cross-linking agent comprising polyallylphenol, and
      a solvent for dissolving said main component and said cross-linking agent,
      wherein said adhesive composition is applied to an adherend and dried in order to evaporate said solvent before a thermocompression process.

7. A semiconductor device comprising:
   a substrate,
   a semiconductor element mounted on said substrate, and
   a wiring layer for connecting said semiconductor element to an outer lead portion,
   wherein an adhesive layer is provided one of between said substrate and said semiconductor element, between said substrate and said wiring layer, between said substrate and said semiconductor element and between said substrate and said wiring layer, and said adhesive layer is comprised of an adhesive composition comprising:
      a main component comprising reactive thermoplastic resin,
      a cross-linking agent for cross-linking said main component,
      a fire retardant comprising silicone resin, and
      a solvent for dissolving said main component and said cross-linking agent and homogeneously dispersing said fire retardant, wherein said adhesive composition is applied to an adherend and dried in order to evaporate said solvent before a thermocompression process.

8. A semiconductor device comprising:

a substrate, a semiconductor element mounted on said substrate, and a wiring layer for connecting said semiconductor element to an outer lead portion, wherein an adhesive layer is provided one of between said substrate and said semiconductor element, between said substrate and said wiring layer, between said substrate and said semiconductor element and between said substrate and said wiring layer, and said adhesive layer is comprised of an adhesive composition comprising:

a main component including thermoplastic resin having carboxyl groups, epoxy resin having at least two epoxy groups, and a solvent, wherein an organophosphorus compound covered with thermoplastic resin is included as a catalyst.

9. A semiconductor device comprising:

a substrate, a semiconductor element mounted on said substrate, and a wiring layer for connecting said semiconductor element to an outer lead portion, wherein an adhesive layer is provided one of between said substrate and said semiconductor element, between said substrate and said wiring layer, between said substrate and said semiconductor element and between said substrate and said wiring layer, and said adhesive layer is comprised of an adhesive composition comprising:

a main component including thermoplastic resin having carboxyl groups, epoxy resin having at least two epoxy groups, and a solvent, wherein a quaternary salt of an organophosphorus compound having at least one aryl group is included as a catalyst.

10. A semiconductor device comprising:

a substrate, a semiconductor element mounted on said substrate, and a wiring layer for connecting said semiconductor element to an outer lead portion, wherein an adhesive layer is provided one of between said substrate and said semiconductor element, between said substrate and said wiring layer, between said substrate and said semiconductor element and between said substrate and said wiring layer, and said adhesive layer is comprised of an adhesive composition comprising:

a main component including thermoplastic resin having carboxyl groups, epoxy resin having at least two epoxy groups, and a solvent, wherein an organophosphorus compound having a melting point in the range of about 100° C. to 200° C. is included as a catalyst.

11. A semiconductor device comprising:

a substrate, a semiconductor element mounted on said substrate, and a wiring layer for connecting said semiconductor element to an outer lead portion, wherein an adhesive layer is provided one of between said substrate and said semiconductor element, between said substrate and said wiring layer, between said substrate and said semiconductor element and between said substrate and said wiring layer, and said adhesive layer is comprised of an adhesive composition comprising:

a main component comprising reactive thermoplastic resin, a cross-linking agent for cross-linking said main component, a tackifier for varying the viscosity, and a solvent for dissolving said main component, said cross-linking agent and said tackifier, wherein the amount of said tackifier is about five to 400 parts by weight with respect to 100 parts by weight of said main component, and said adhesive composition is applied to an adherend and dried in order to evaporate said solvent before a thermocompression process.

12. A semiconductor device comprising:

a substrate, a semiconductor element mounted on said substrate, and a wiring layer for connecting said semiconductor element to an outer lead portion, wherein an adhesive layer is provided one of between said substrate and said semiconductor element, between said substrate and said wiring layer, between said substrate and said semiconductor element and between said substrate and said wiring layer, and said adhesive layer is comprised of an adhesive composition comprising:

a main component comprising reactive thermoplastic resin, a cross-linking agent comprising a biphenyl type epoxy resin, and a solvent for dissolving said main component and said cross-linking agent, wherein the amount of said cross-linking agent is about five to 400 parts by weight with respect to 100 parts by weight of said main component, and said adhesive composition is applied to an adherend and dried in order to evaporate said solvent before a thermocompression process.

13. A semiconductor device comprising:

a substrate, a semiconductor element mounted on said substrate, and a wiring layer for connecting said semiconductor element to an outer lead portion, wherein an adhesive layer is provided one of between said substrate and said semiconductor element, between said substrate and said wiring layer, between said substrate and said semiconductor element and between said substrate and said wiring layer, and said adhesive layer is comprised of an adhesive composition comprising:

a main component comprising reactive thermoplastic resin, a cross-linking agent comprising epoxidated polybutadiene rubber, and a solvent for dissolving said main component and said cross-linking agent, wherein the amount of said cross-linking agent is about five to 400 parts by weight with respect to 100 parts by weight of said main component, and said adhesive composition is applied to an adherend and dried in order to evaporate said solvent before a thermocompression process.

14. A semiconductor device comprising:
a substrate,
a semiconductor element mounted on said substrate, and
a wiring layer for connecting said semiconductor element to an outer lead portion,
wherein an adhesive layer is provided one of between said substrate and said semiconductor element, between said substrate and said wiring layer, between said substrate and said semiconductor element and between said substrate and said wiring layer, and said adhesive layer is comprised of an adhesive composition comprising:
a main component comprising a reactive thermoplastic resin,
a cross-linking agent,
a tackifier,
a solvent for dissolving said main component, said cross-linking agent and said tackifier, and
a filler
wherein the shape of said filler is substantially spherical and said adhesive composition is applied to an adherend and dried in order to evaporate said solvent before a thermocompression process.

* * * * *

UNITED STATES PATENT AND TRADEMARK OFFICE
CERTIFICATE OF CORRECTION

PATENT NO.   :   5,844,309

DATED        :   December 1, 1998

INVENTOR(S)  :   Takigawa et al.

It is certified that error appears in the above-identified patent and that said Letters Patent is hereby corrected as shown below:

On the title page--
Item [22], delete "Dec. 3, 1996" insert therefor

-- Dec. 4, 1996 --

Item [75], line 5, delete "Kawasaki" insert therefor

-- Ebetsu --

Item [75], line 7, delete "Kanagawa" insert therefor

-- Kawasaki --

Signed and Sealed this

Fourth Day of May, 1999

Attest:

Q. TODD DICKINSON

*Attesting Officer*    Acting Commissioner of Patents and Trademarks